(12) United States Patent
Chen et al.

(10) Patent No.: US 6,691,203 B1
(45) Date of Patent: Feb. 10, 2004

(54) INTEGRATED CONTROLLER TO PROCESS BOTH OPTICAL READS AND OPTICAL WRITES OF MULTIPLE OPTICAL MEDIA

(75) Inventors: Joseph Chen, Cupertino, CA (US); Li-Chun Robert Chen, Fremont, CA (US); Lam Dang, Cupertino, CA (US); Paul Phuc Tran, Milpitas, CA (US); Tom Vu, San Jose, CA (US)

(73) Assignee: Mosel Vitelic Corporation, San Jose, CA (US)

( * ) Notice: Subject to any disclaimer, the term of this patent is extended or adjusted under 35 U.S.C. 154(b) by 436 days.

(21) Appl. No.: 09/652,254

(22) Filed: Aug. 30, 2000

(51) Int. Cl.⁷ .............................................. G06F 12/00
(52) U.S. Cl. .............................. 711/4; 711/159; 714/52; 360/32; 360/48; 369/30.22; 369/30.23; 369/47.19
(58) Field of Search ............................ 711/4, 105, 159; 714/52; 369/47.12, 47.15, 47.19, 30.23, 30.22; 360/32, 48, 50

(56) References Cited

U.S. PATENT DOCUMENTS

| | | | |
|---|---|---|---|
| 5,351,231 A | 9/1994 | King et al. ................. 369/124 |
| 5,392,273 A | 2/1995 | Masaki et al. .............. 369/106 |
| 5,553,041 A * | 9/1996 | Inagawa et al. ......... 369/47.33 |
| 5,581,715 A | 12/1996 | Verinsky et al. ............ 395/309 |
| 5,592,640 A | 1/1997 | Minoura et al. ............ 395/428 |
| 5,623,470 A | 4/1997 | Asthana et al. ............. 369/58 |
| 5,661,848 A | 8/1997 | Bonke et al. ............... 395/439 |
| 5,787,461 A | 7/1998 | Stephens .................... 711/113 |
| 5,831,955 A * | 11/1998 | Arataki et al. ........... 369/47.32 |
| 5,901,157 A | 5/1999 | Hogan ...................... 371/37.01 |
| 5,940,358 A * | 8/1999 | Kato ......................... 369/30.23 |
| 5,946,276 A | 8/1999 | Ridges et al. ................. 369/32 |
| 5,960,464 A | 9/1999 | Lam ........................... 711/206 |
| 6,388,968 B1 * | 5/2002 | Ohta et al. ................. 369/53.45 |
| 6,504,807 B2 * | 1/2003 | Harvey et al. ............. 369/59.12 |

* cited by examiner

Primary Examiner—Reginald G. Bragdon
Assistant Examiner—Pierre M. Vital
(74) Attorney, Agent, or Firm—Sawyer Law Group LLP

(57) ABSTRACT

The present invention provides an integrated controller to process both optical reads and optical writes of multiple optical media. The integrated controller includes a host interface; a buffer manager coupled to the host interface; an embedded memory coupled to the buffer manager; an integrated encoding/decoding engine coupled to the buffer manager; a data channel interface coupled to the integrated encoding/decoding engine; and an integrated servo/recording processor coupled to the integrated encoding/decoding engine and the data channel interface, where the integrated servo/recording processor includes a set of write strategies. The present invention provides a controller which integrates the functionality of the conventional controllers into an integrated processor. With the controller in accordance with the present invention, a single drive may be provided which can read CD-based and DVD-based formats, read and write to Write Once Media, and read and write to Rewritable Media. The architecture of the controller is designed such that its manufacture is cost effective and a performance penalty for the host does not occur. In addition, the controller may also be used with conventional optical drives. Thus, with the present invention, the same controller may be used for all conventional optical drives as well as with an integrated drive.

32 Claims, 38 Drawing Sheets

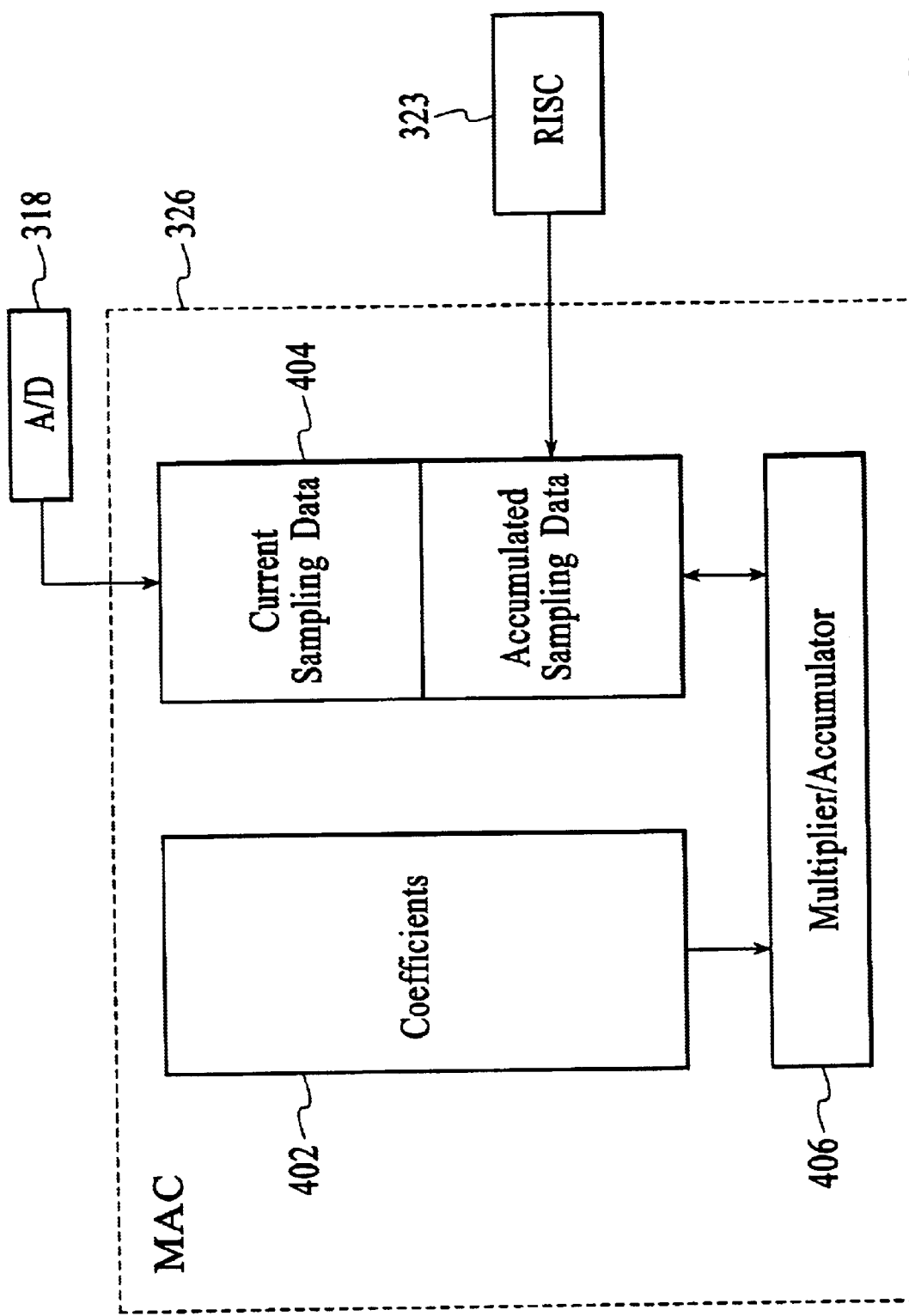

| data bits | channel bits | | data bits | channel bits |
|---|---|---|---|---|
| 0 | 00000000 | 01001000100000 | 64 | 01000000 | 01001000100100 |
| 1 | 00000001 | 10000100000000 | 65 | 01000001 | 10000100100100 |
| 2 | 00000010 | 10010000100000 | 66 | 01000010 | 10010000100100 |
| 3 | 00000011 | 10001000100000 | 67 | 01000011 | 10001000100100 |
| 4 | 00000100 | 01000100100000 | 68 | 01000100 | 01000100100100 |
| 5 | 00000101 | 00000100010000 | 69 | 01000101 | 00000000100100 |
| 6 | 00000110 | 00010000100000 | 70 | 01000110 | 00010000100100 |
| 7 | 00000111 | 00100100100000 | 71 | 01000111 | 00100100100100 |
| 8 | 00001000 | 01001001000000 | 72 | 01001000 | 01001001000100 |
| 9 | 00001001 | 10000001000000 | 73 | 01001001 | 10000001000100 |
| 10 | 00001010 | 10010001000000 | 74 | 01001010 | 10010001000100 |
| 11 | 00001011 | 10001001000000 | 75 | 01001011 | 10001001000100 |
| 12 | 00001100 | 01000001000000 | 76 | 01001100 | 01000001000100 |
| 13 | 00001101 | 00000001000000 | 77 | 01001101 | 00000001000100 |
| 14 | 00001110 | 00010001000000 | 78 | 01001110 | 00010001000100 |
| 15 | 00001111 | 00100001000000 | 79 | 01001111 | 00100001000100 |
| 16 | 00010000 | 10000000100000 | 80 | 01010000 | 10000000100100 |
| 17 | 00010001 | 10000010000000 | 81 | 01010001 | 10000010000100 |
| 18 | 00010010 | 10010010000000 | 82 | 01010010 | 10010010000100 |
| 19 | 00010011 | 00100000100000 | 83 | 01010011 | 00100000100100 |
| 20 | 00010100 | 01000010000000 | 84 | 01010100 | 01000010000100 |
| 21 | 00010101 | 00000010000000 | 85 | 01010101 | 00000010000100 |
| 22 | 00010110 | 00010010000000 | 86 | 01010110 | 00010010000100 |
| 23 | 00010111 | 00100010000000 | 87 | 01010111 | 00100010000100 |
| 24 | 00011000 | 01001000010000 | 88 | 01011000 | 01001000000100 |
| 25 | 00011001 | 10000000010000 | 89 | 01011001 | 10000000000100 |
| 26 | 00011010 | 10010000010000 | 90 | 01011010 | 10010000000100 |
| 27 | 00011011 | 10001000010000 | 91 | 01011011 | 10001000000100 |
| 28 | 00011100 | 01000000010000 | 92 | 01011100 | 01000000000100 |
| 29 | 00011101 | 00001000010000 | 93 | 01011101 | 00001000000100 |
| 30 | 00011110 | 00010000010000 | 94 | 01011110 | 00010000000100 |
| 31 | 00011111 | 00100000010000 | 95 | 01011111 | 00100000000100 |
| 32 | 00100000 | 00000000100000 | 96 | 01100000 | 01001000100010 |
| 33 | 00100001 | 10000100100000 | 97 | 01100001 | 10000100100010 |
| 34 | 00100010 | 00010000100000 | 98 | 01100010 | 10010000100010 |
| 35 | 00100011 | 00100100100000 | 99 | 01100011 | 10001000100010 |
| 36 | 00100100 | 01000100001000 | 100 | 01100100 | 01000100100010 |
| 37 | 00100101 | 00000100001000 | 101 | 01100101 | 00000000100010 |
| 38 | 00100110 | 00010010001000 | 102 | 01100110 | 01000000100100 |
| 39 | 00100111 | 00100100001000 | 103 | 01100111 | 00100100100010 |
| 40 | 00101000 | 01001001001000 | 104 | 01101000 | 01001001000010 |
| 41 | 00101001 | 10000001001000 | 105 | 01101001 | 10000001000010 |
| 42 | 00101010 | 10010001001000 | 106 | 01101010 | 10010001000010 |
| 43 | 00101011 | 10001001001000 | 107 | 01101011 | 10001001000010 |
| 44 | 00101100 | 01000001001000 | 108 | 01101100 | 01000001000010 |
| 45 | 00101101 | 00000001001000 | 109 | 01101101 | 00000001000010 |
| 46 | 00101110 | 00010001001000 | 110 | 01101110 | 00010001000010 |
| 47 | 00101111 | 00100001001000 | 111 | 01101111 | 00100001000010 |
| 48 | 00110000 | 00000100000000 | 112 | 01110000 | 10000000000010 |
| 49 | 00110001 | 10000010001000 | 113 | 01110001 | 10000010000010 |
| 50 | 00110010 | 10010010001000 | 114 | 01110010 | 10010010000010 |
| 51 | 00110011 | 00100000001000 | 115 | 01110011 | 00100000000010 |
| 52 | 00110100 | 01000010001000 | 116 | 01110100 | 01000010000010 |
| 53 | 00110101 | 00000010001000 | 117 | 01110101 | 00000010000010 |
| 54 | 00110110 | 00010010001000 | 118 | 01110110 | 00010010000010 |
| 55 | 00110111 | 01000010001000 | 119 | 01110111 | 00100010000010 |
| 56 | 00111000 | 01001000001000 | 120 | 01111000 | 01001000000010 |
| 57 | 00111001 | 10000000001000 | 121 | 01111001 | 00001001001000 |
| 58 | 00111010 | 10010000001000 | 122 | 01111010 | 10010000000010 |
| 59 | 00111011 | 10001000001000 | 123 | 01111011 | 10001000000010 |
| 60 | 00111100 | 01000000001000 | 124 | 01111100 | 01000000000010 |
| 61 | 00111101 | 00001000001000 | 125 | 01111101 | 00001000000010 |
| 62 | 00111110 | 00010000001000 | 126 | 01111110 | 00010000000010 |
| 63 | 00111111 | 00100000001000 | 127 | 01111111 | 00100000000010 | d1----d8

C1--------C14
C1 is first out.

EFM conversion table 0 - 127
(NRZ-I representation)

FIG. 9/1

| data bits | channel bits |
|---|---|
| 128 10000000 | 01001000100001 |
| 129 10000001 | 10000100100001 |
| 130 10000010 | 10010000100001 |
| 131 10000011 | 10001000100001 |
| 132 10000100 | 01000100100001 |
| 133 10000101 | 00000000100001 |
| 134 10000110 | 00010000100001 |
| 135 10000111 | 00100000100001 |
| 136 10001000 | 01001001000001 |
| 137 10001001 | 10000001000001 |
| 138 10001010 | 10010001000001 |
| 139 10001011 | 10000100100001 |
| 140 10001100 | 01000001000001 |
| 141 10001101 | 00000001000001 |
| 142 10001110 | 00010001000001 |
| 143 10001111 | 00100001000001 |
| 144 10010000 | 10000000100001 |
| 145 10010001 | 10000010000001 |
| 146 10010010 | 10010010000001 |
| 147 10010011 | 00100010000001 |
| 148 10010100 | 01000010000001 |
| 149 10010101 | 00000010000001 |
| 150 10010110 | 00010010000001 |
| 151 10010111 | 00100010000001 |
| 152 10011000 | 01001000000001 |
| 153 10011001 | 10000010010000 |
| 154 10011010 | 10010000010000 |
| 155 10011011 | 10001000000001 |
| 156 10011100 | 01000010010000 |
| 157 10011101 | 00000010010000 |
| 158 10011110 | 00010000000001 |
| 159 10011111 | 00100010010000 |
| 160 10100000 | 00001000100001 |
| 161 10100001 | 10000100001001 |
| 162 10100010 | 01000100010000 |
| 163 10100011 | 00000100100001 |
| 164 10100100 | 01000010001001 |
| 165 10100101 | 00000010001001 |
| 166 10100110 | 01000000100001 |
| 167 10100111 | 00100010001001 |
| 168 10101000 | 01001000001001 |
| 169 10101001 | 10000000001001 |
| 170 10101010 | 10010001001001 |
| 171 10101011 | 10000100001001 |
| 172 10101100 | 01000000001001 |
| 173 10101101 | 00000000001001 |
| 174 10101110 | 00010000001001 |
| 175 10101111 | 00100000001001 |
| 176 10110000 | 00000100100000 |
| 177 10110001 | 10000010001001 |
| 178 10110010 | 10010010001001 |
| 179 10110011 | 00100100010000 |
| 180 10110100 | 01000010010010 |
| 181 10110101 | 00000010001001 |
| 182 10110110 | 00010010001001 |
| 183 10110111 | 00100010001001 |
| 184 10111000 | 01001000001001 |
| 185 10111001 | 10000000001001 |
| 186 10111010 | 10010000001001 |
| 187 10111011 | 10001000001001 |
| 188 10111100 | 01000000001001 |
| 189 10111101 | 00000000001001 |
| 190 10111110 | 00010000001001 |
| 191 10111111 | 00100000001001 |
| 192 11000000 | 01000100100000 |
| 193 11000001 | 10000100010001 |
| 194 11000010 | 10010010010000 |
| 195 11000011 | 00000100100100 |
| 196 11000100 | 01000100010001 |
| 197 11000101 | 00000100010001 |
| 198 11000110 | 00010010010000 |
| 199 11000111 | 00100100010001 |
| 200 11001000 | 00001001000001 |
| 201 11001001 | 10000001000001 |
| 202 11001010 | 00001001000100 |
| 203 11001011 | 00001001000000 |
| 204 11001100 | 01000100000001 |
| 205 11001101 | 00000100000001 |
| 206 11001110 | 00000100010000 |
| 207 11001111 | 00100100000001 |
| 208 11010000 | 00000100100100 |
| 209 11010001 | 10000010010001 |
| 210 11010010 | 10010010010001 |
| 211 11010011 | 10000100100000 |
| 212 11010100 | 01000010010001 |
| 213 11010101 | 00000010010001 |
| 214 11010110 | 00010010010001 |
| 215 11010111 | 00100010010001 |
| 216 11011000 | 01001000010001 |
| 217 11011001 | 10000000010001 |
| 218 11011010 | 10010000010001 |
| 219 11011011 | 10001000010001 |
| 220 11011100 | 01000000010001 |
| 221 11011101 | 00000100010001 |
| 222 11011110 | 00010000010001 |
| 223 11011111 | 00100000010001 |
| 224 11100000 | 01000100100010 |
| 225 11100001 | 00000100100010 |
| 226 11100010 | 10000100010010 |
| 227 11100011 | 00100100000010 |
| 228 11100100 | 01000100100010 |
| 229 11100101 | 00000100100010 |
| 230 11100110 | 01000000100010 |
| 231 11100111 | 00100100010010 |
| 232 11101000 | 10000100000010 |
| 233 11101001 | 10000100000100 |
| 234 11101010 | 00001001001001 |
| 235 11101011 | 00001001000010 |
| 236 11101100 | 01000100000100 |
| 237 11101101 | 00000100000100 |
| 238 11101110 | 00010001000010 |
| 239 11101111 | 00100100100010 |
| 240 11110000 | 00000100100010 |
| 241 11110001 | 10000100010010 |
| 242 11110010 | 10010100010010 |
| 243 11110011 | 00000100100010 |
| 244 11110100 | 01000010010010 |
| 245 11110101 | 00000100010010 |
| 246 11110110 | 00010010010010 |
| 247 11110111 | 00100100010010 |
| 248 11111000 | 01001000010010 |
| 249 11111001 | 10000000010010 |
| 250 11111010 | 10010000010010 |
| 251 11111011 | 10001000010010 |
| 252 11111100 | 01000000010010 |
| 253 11111101 | 00000000010010 |
| 254 11111110 | 00010000010010 |
| 255 11111111 | 00100000010010 | d1----d8   C1--------C14

EFM conversion table 128 - 255
(NRZ-I presentation)

FIG. 9/2

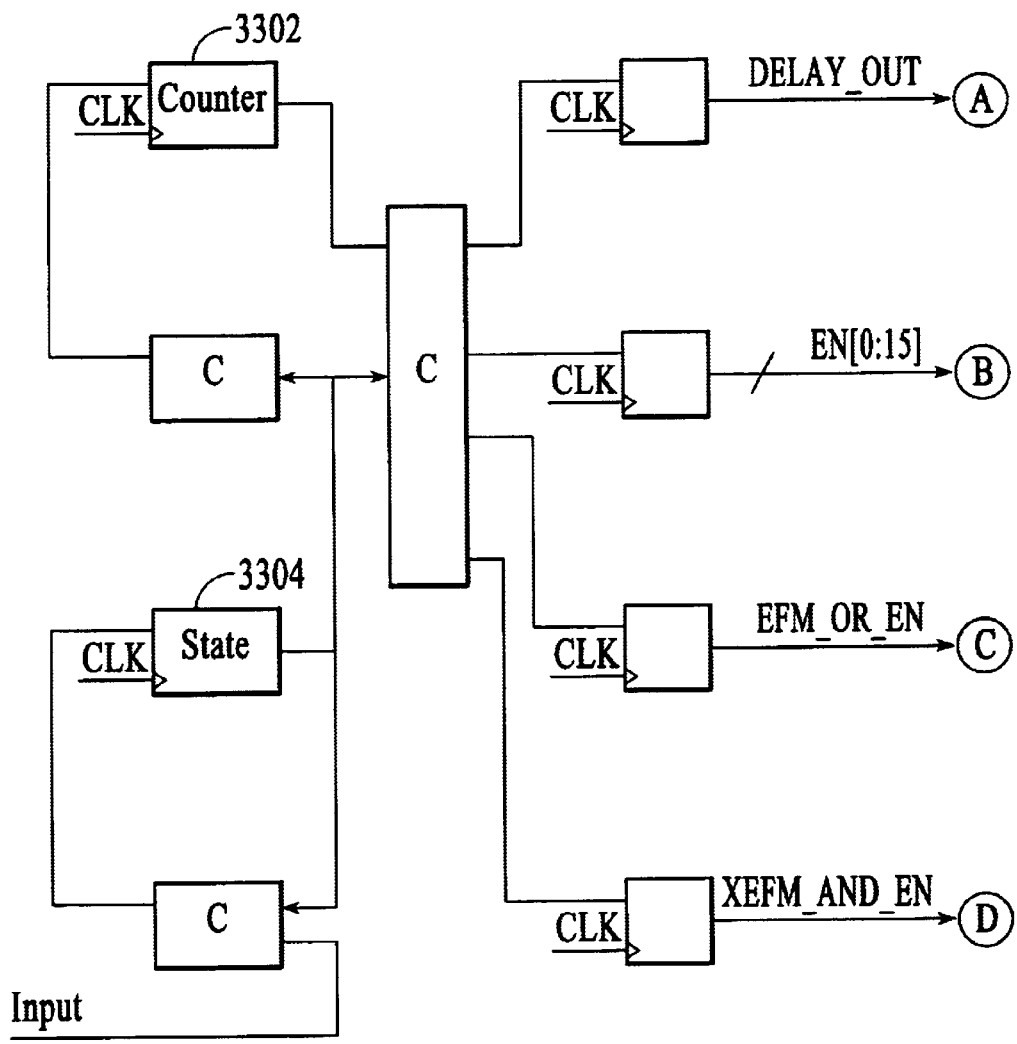
FIG. 33/1

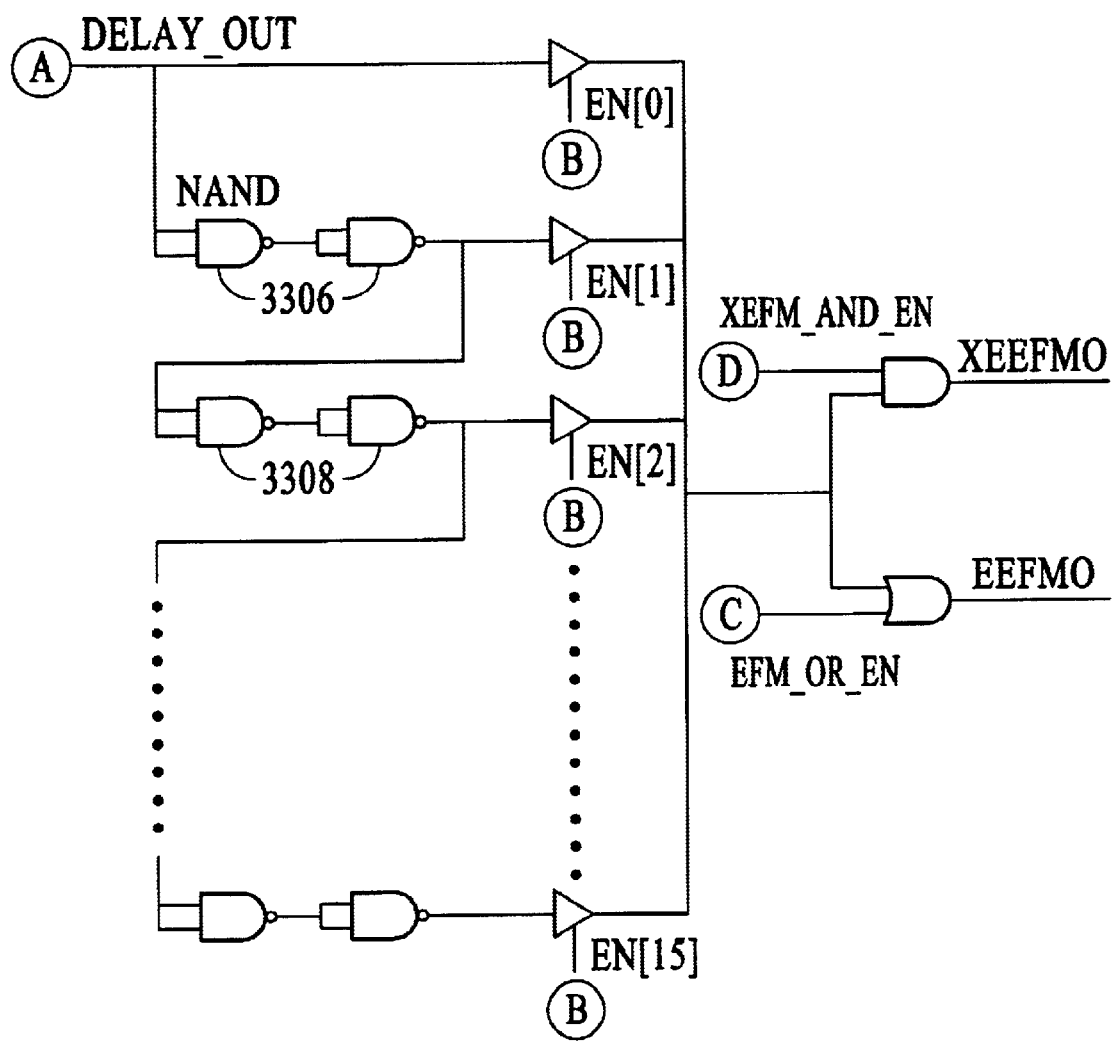
FIG. 33/2

INTEGRATED CONTROLLER TO PROCESS BOTH OPTICAL READS AND OPTICAL WRITES OF MULTIPLE OPTICAL MEDIA

FIELD OF THE INVENTION

The present invention relates to optical storage media, and more particularly to controllers for reading and writing to optical storage media.

BACKGROUND OF THE INVENTION

Optical read and write media drives are well known in the art. Conventional optical read drives include Compact Disc-Read Only Memory (CD-ROM) drives, which can read CD-based formats, and Digital Video Disc-Read Only Memory (DVD) drives, which can read DVD and CD-based formats. Conventional optical write drives include Compact Disc-Read/Write (CD-R) drives, which can read CD-based formats and read and write to Write Once Media, and; Compact Disc-Rewritable (CD-RW) drives, which can read CD-based formats and read and write to Write Once Media and Rewritable Media. Each of these drives conventionally requires different controllers.

FIGS. 1A and 1B are block diagrams illustrating basic conventional controller architectures for optical drives. FIG. 1A illustrates a basic conventional architecture for CD-ROM and DVD controllers. The controller 100 comprises a host interface 104, a buffer manager 106, a decoder 110, a read servo 112, a read channel 114, power drivers 116, and a microcontroller interface 118. The host interface 104 functions as an interface between a host 102, such as a personal computer, and the rest of the controller 100. When the host 102 sends a command to the controller 100 via the host interface 104 to read data on the disc 120, the command is sent to an external microcontroller (not shown) via the microcontroller interface 118. The host's command is interpreted and sent back to the controller 100. The read servo 112, using the read channel 114 and power drivers 116, finds and collects the data from the disc 120 according to the command. The data is decoded by the decoder 110 and stored in an external Dynamic Random Access Memory 108 (DRAM). The buffer manager 106 manages data flow in and out of the external DRAM 108 via a bus 122. Typically, the bus is either a 16-bit or 32-bit bus. Once enough of the data is decoded and stored in the DRAM 108, the host 102 is notified. The host 102 then collects the data from the external DRAM 108.

FIG. 1B illustrates a basic conventional architecture for CD-R and CD-RW controllers. The controller 150 comprises a host interface 154, a decoder 156, an encoder 158, a read and write servo 160, a buffer manager 162, and a microcontroller interface 164. The host interface 104 functions as an interface between the host 102 and the rest of the controller 100. To perform a write, the host 152 sends a command to the controller 150 via the host interface 154 to write data on the disc 170. The command is sent to an external microcontroller (not shown) via the microcontroller interface 164. The host's command is interpreted and sent back to the controller 150. The data is encoded by the encoder 158 into the proper format. The data is then physically written onto the disc 170 by the read/write servo 160, using the read channel and power drivers 168, according to the command. How the data is written onto the disc 170 is determined by the write strategies 166. Typically, the write strategies 166 and the read channel/power drivers 168 reside outside of the controller 150. The buffer manager 162 manages data flow in and out of the external DRAM 172 via the bus 174 during the writing of the data. The reading of data with controller 150 functions in the same manner as with the controller 100.

However, if a consumer desires the functionality of all four drives, the consumer must purchase multiple drives. One drive could be manufactured with a combination of the two controllers 100 and 150, but an additional bridge chip is required to multiplex the controllers together. This is very costly to manufacture with no corresponding increase in performance. In fact, a decrease in the speed of the host would be required to interface with the combined controller. This results in a performance penalty for the host.

Accordingly, there exists a need for an integrated controller to process both optical reads and optical writes of multiple optical media. The integrated controller should be cost efficient to manufacture and also avoid a performance penalty for the host. The present invention addresses such a need.

SUMMARY OF THE INVENTION

The present invention provides an integrated controller to process both optical reads and optical writes of multiple optical media. The integrated controller includes a host interface; a buffer manager coupled to the host interface; an embedded memory coupled to the buffer manager; an integrated encoding/decoding engine coupled to the buffer manager; a data channel interface coupled to the integrated encoding/decoding engine; and an integrated servo/recording processor coupled to the integrated encoding/decoding engine and the data channel interface, where the integrated servo/recording processor includes a set of write strategies. The present invention provides a controller which integrates the functionality of the conventional controllers into an integrated processor. With the controller in accordance with the present invention, a single drive may be provided which can read CD-based and DVD-based formats, read and write to Write Once Media, and read and write to Rewritable Media. The architecture of the controller is designed such that its manufacture is cost effective and a performance penalty for the host does not occur. In addition, the controller may also be used with conventional optical drives. Thus, with the present invention, the same controller may be used for all conventional optical drives as well as with an integrated drive.

BRIEF DESCRIPTION OF THE FIGURES

FIG. 4 illustrates a preferred embodiment of the Multiply Accumulate Unit for the servo control system in accordance with the present invention.

FIG. 9 is an Eight-to-Fourteen Modulation conversion table used by the method for error correction in accordance with the present invention.

FIG. 33 is a logical circuit diagram illustrating a preferred embodiment for performing coarse and fine timing adjustments of the write control logic in accordance with the present invention.

DETAILED DESCRIPTION

The present invention provides an integrated controller to process both optical reads and optical writes of multiple optical media. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2 through 35 in conjunction with the discussion below.

Figure 1A:
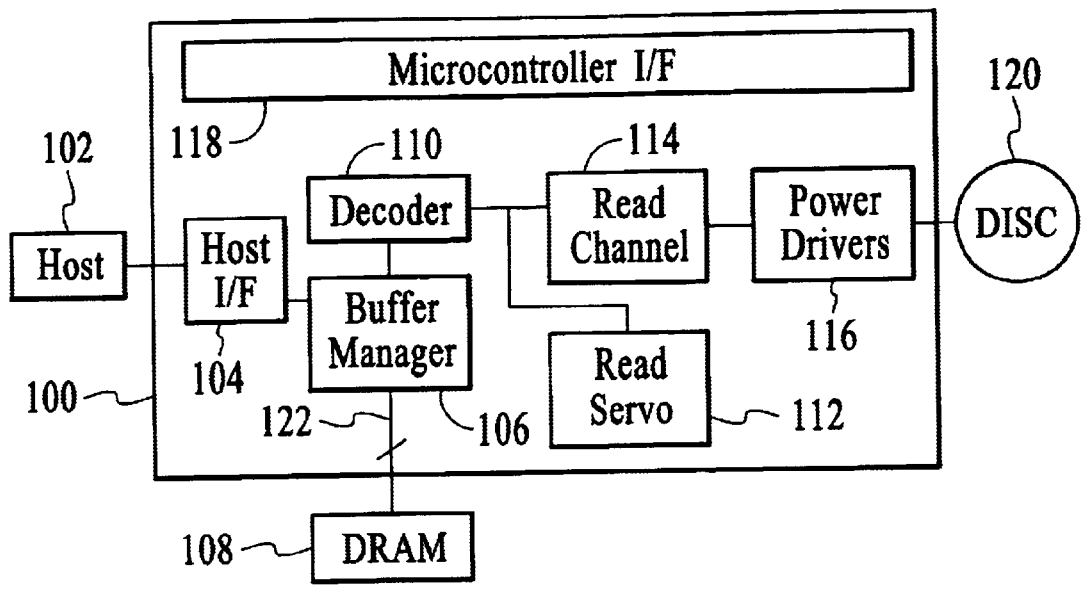
FIGS. 1A and 1B are block diagrams illustrating basic conventional controller architectures for optical drives.
Figure 1B:
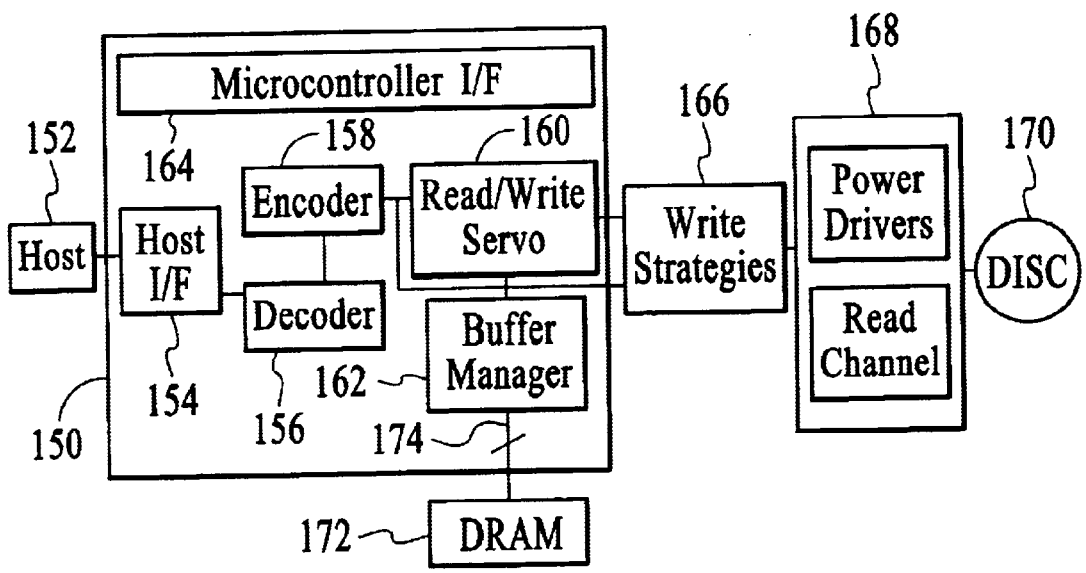

The present invention provides a controller which integrates the functionality of the conventional controllers, illustrated in FIGS. 1A and 1B, into a single processor that is programmable to handle different types of media. With the controller in accordance with the present invention, a single drive may be provided which can read CD-based and DVD-based formats, read and write to Write Once Media, and read and write to Rewritable Media. The architecture of the controller is designed such that its manufacture is cost effective and a performance penalty for the host does not occur. In addition, the controller may also be used with conventional optical drives. Thus, with the present invention, the same controller may be used for all conventional optical drives as well as with an integrated drive.

Figure 2:
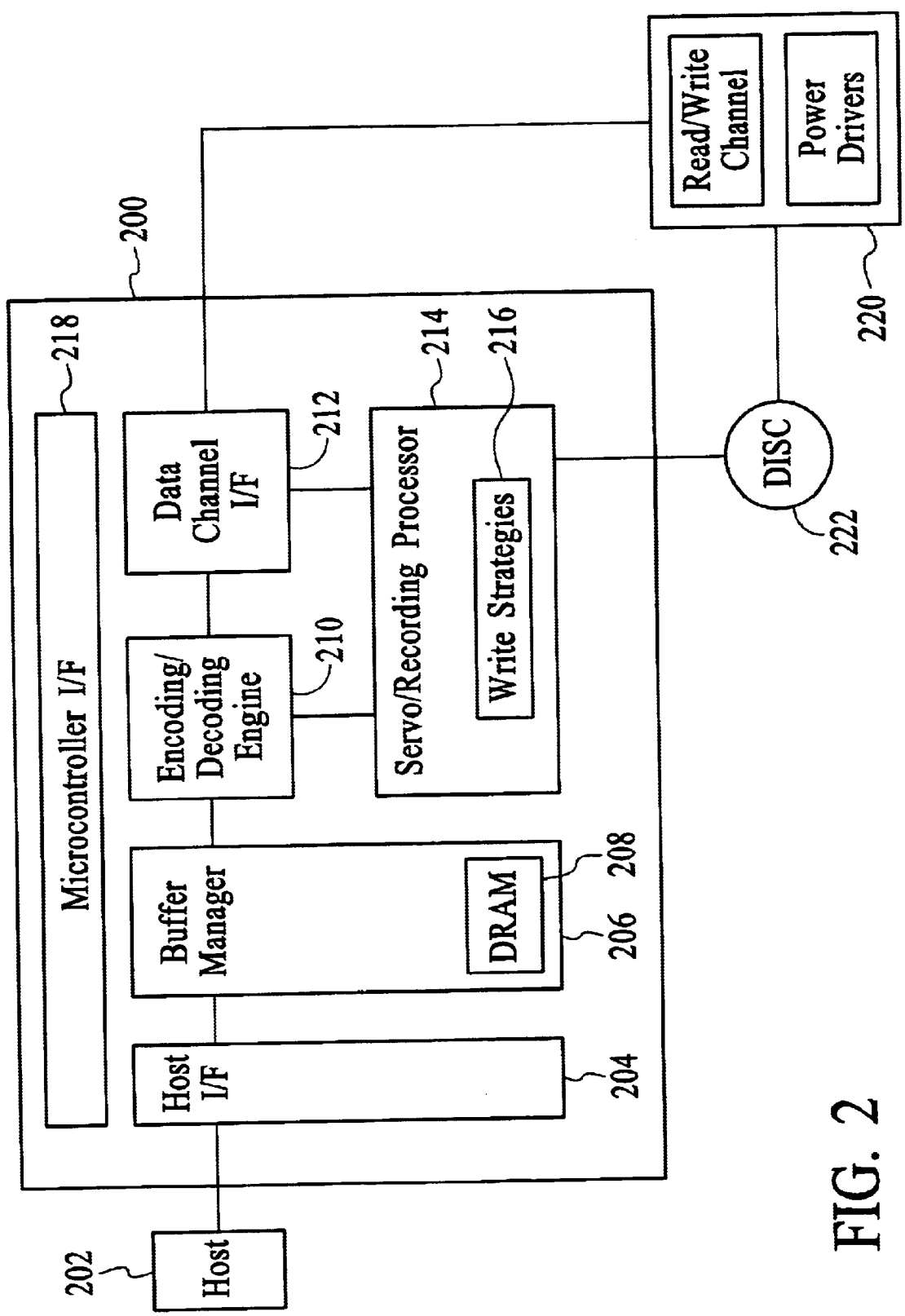
FIG. 2 illustrates a preferred embodiment of an integrated controller architecture to process both optical reads and optical writes of multiple optical media in accordance with the present invention.

FIG. 2 illustrates a preferred embodiment of an integrated controller architecture to process both optical reads and optical writes of multiple optical media in accordance with the present invention. The elements 204–218 represent the logical architecture of the controller 200. The controller 200 comprises a host interface 204, a buffer manager 206 with an embedded memory 208, an integrated encoding/decoding engine 210, a data channel interface 212, an integrated servo/recording processor 214 embedded with the write strategies 216, and a microcontroller interface 218. In the preferred embodiment, the embedded memory 208 is an embedded dynamic random access memory (DRAM).

The host interface 204 provides a link between the host 202 and the controller 200. The host interface 204 receives all commands from the host 202. It also handles data transfers between the controller 200 and the host 202 once a command is received, analyzed, and responded to. For a write operation, the host interface 204 transfers the data to be written from the host 202 to the controller 200 and regulates the data flow to the disc 222. For a read operation, the host interface 202 regulates the data flow back to the host 202 and checks the data for errors.

The buffer manager 206 regulates all data flow within the controller 200, including the data flow to and from the embedded DRAM 208. The use of an embedded DRAM 208, in contrast to an external DRAM as used with conventional controllers, is one of the key features of the controller 200 in accordance with the present invention. Because the DRAM 208 is embedded, a wide bus (not shown) may be used to transfer data in and out of it. In the preferred embodiment, the bus is a 128-bit bus. With such a wide bus, the speed of the controller 200 is significantly increased and is an important factor in avoiding a performance penalty for the host 202.

The integrated encoding/decoding engine 210 encodes data into a standard format for a write operation to the disc 222, and decodes data for a read operation from the disc 222. Conventionally, two separate encoding and decoding engines are required because data flow for reading and writing data are different. Even when the engines are multiplexed together, the engines themselves are still separate. However, the engine 210 of the controller 200 in accordance with the present invention truly integrates the functionality of the conventional encoding and decoding engines into a single encoding/decoding engine 210.

The integrated servo/recording processor 214 provides the mechanical control of the disc 220 and the spindle and sledge (not shown) of the drive for both reading and writing of data. The servo/recording processor 214 interfaces with the disc 222 in the writing of data. The accuracy accomplished with conventional write servos is matched or exceeded by the servo/recording processor 214 in accordance with the present invention.

Integrated into the processor 214 are the write strategies 216 which controls the writing of the data so that the data is in a standard format. Along with the embedding of the DRAM 208, the integration of the write strategies 216 into the processor 214 is another key feature of the present invention. Because of this high level of integration, the controller 200 is able to achieve concurrent read and write data flow from the host 202 to the disc 222 and vice versa without the need to slow down the data flow rate. This capability enables a drive manufacturer to build a high performance integrated drive and/or a high performance conventional optical drive.

The read channel interface 212 functions as a link between the read channel and power drivers 218 and the rest of the controller 200 for reading of data. It regulates how the data is obtained from the disc 222.

Figure 3:
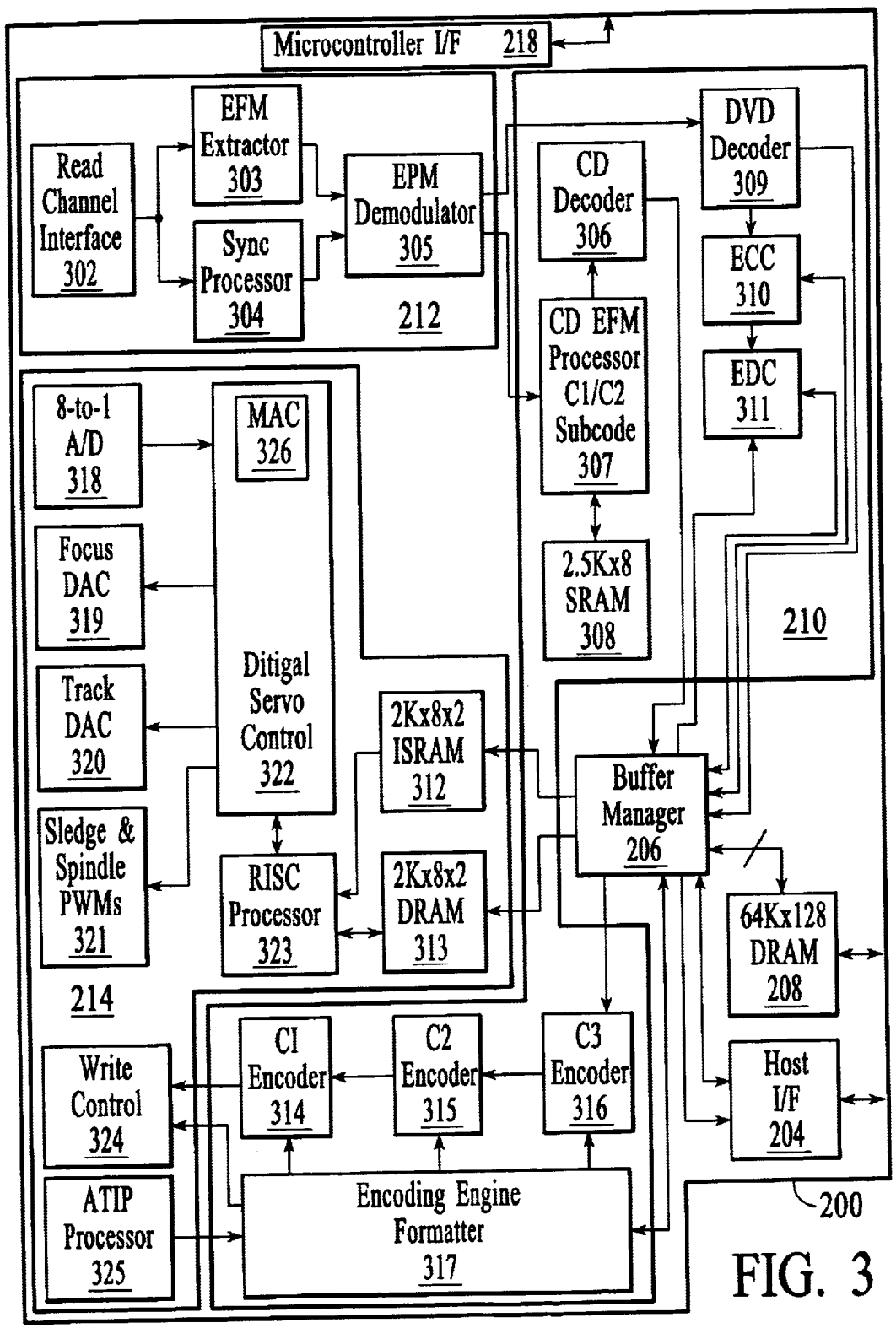
FIG. 3 illustrates in more detail the logical architecture of the preferred embodiment of the integrated controller in accordance with the present invention.

FIG. 3 illustrates in more detail the logical architecture of the preferred embodiment of the integrated controller in accordance with the present invention. To read data on the disc 222 (FIG. 2), the host 202 sends a high level command to the external microcontroller to read certain data from the disc 200, via the microcontroller interface 218. The microcontroller interprets the command and configures the controller 200 accordingly.

Servo/Recording Processor in Reading From Disc

The controller 200 has the embedded servo/recording processor 214 which comprises a reduced instruction set computer (RISC) processor 323 that takes the high level command from the external microcontroller, via a proprietary communication protocol, and performs the necessary servo functions to seek and track the required target data stream. The RISC processor 323 has full access and control of the on-chip, multi-channel analog to digital converter 318 (A/D), digital to analog converters 319, 320 (DAC), and sledge and spindle pulse width modulator 321 (PWM) to sample the servo data (track, focus, center errors, beam strength, and radio frequency). The RISC processor 323, via the digital servo control 322, provides control to the spindle, sledge, focus, and track coils.

Automated Servo Control System

In the preferred embodiment, the digital servo control 322 comprises a dedicated Multiply Accumulate Unit 326 (MAC) which is directly linked to a sample servo data. When the RISC processor 323 commands the MAC 326 to execute, the MAC 326 receives the sample servo data directly from the A/D 318; retrieves the corresponding accumulated sample servo data from a memory; calculates a control transfer function; and stores the results back into the memory, without processor intervention. The RISC processor 323 then accesses the DSRAM 313 to retrieve the result.

FIG. 4 illustrates a preferred embodiment of the MAC 326 for the servo control system in accordance with the present invention. The MAC 326 comprises two Static Random Access Memories (SRAMs) 402 and 404. SRAM 402 stores the coefficients of the transfer function. The coefficients were loaded into the SRAM 402 by the RISC 323 when the MAC 326 was initialized. The SRAM 404 stores the current sample servo data and the accumulated sample servo data. The MAC 326 is also described in co-pending U.S. patent application, entitled "Automated Servo Control System", Ser. No. (1578P), filed on Jun. 19, 2000. Applicants hereby incorporates this patent application by reference.

The RISC 323 starts the execution of the MAC 326. The MAC 326 automatically performs the following without further intervention from the RISC 323:

The MAC 326 automatically retrieves the sample servo data from the A/D 318. The A/D 318 loads the sample servo data into SRAM 404. Also stored in SRAM 404 is the accumulated sample servo data. The MAC 326 then loads the current sample servo data, the accumulated sample servo data, and the coefficients into a multiplier and accumulator 406. The multiplier/accumulator 406 performs the multiplication and accumulation tasks required to calculate the transfer function. The result is stored back into SRAM 404 as the updated accumulated sample servo data. The MAC 326 then notifies the RISC 323 that the updated accumulated sample servo data is available. The RISC 323 accesses the SRAM 404 and retrieves the updated accumulated sample servo data. Since the RISC 323 is not required to intervene during the execution of the MAC 326, the RISC 323 is available to perform other functions.

Read Channel Interface
Automatic Header Search Validation Scheme

In parallel with the embedded servo/recording processor 214, the read channel interface 302 extracts the eight-to-fourteen byte modulation (EFM) data stream from the read channel 220. EFM refers to a standard data format for storage on an optical disc. To find the correct sector to read (target sector), the preferred embodiment utilizes a header search scheme which uses a search window greater than one sector immediately before the target sector. The size of the window is programmable. If a valid header is found within the search window, then it is used as a reference in locating the target sector. Optionally, more than one valid header can be required to be found before they are used as the reference, for the purpose of increasing the reliability of the reference. The number of required valid headers is also programmable. Buffering of the data then begins at the target sector found based on the reference. The header of this target sector is then checked for validity. If the header is not the target, then the header search may be restarted without the need to redo the data read. The header search scheme is applicable for multiple optical data formats, including CD-ROM, Compact Disc Audio Data (CD-audio), and DVD formats. This scheme provides an additional ability to continually validate the headers of the buffered data.

Figure 5A:
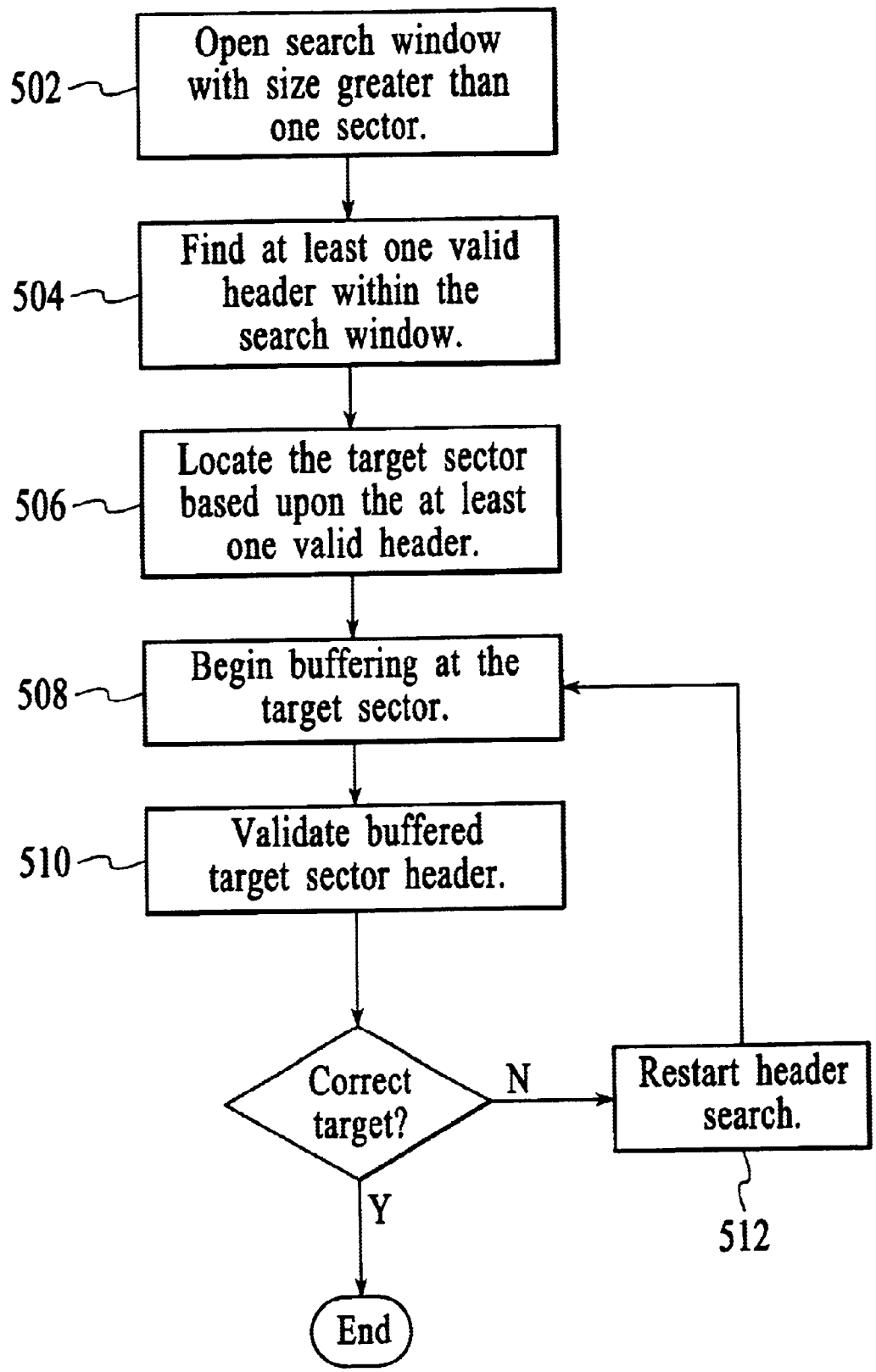
FIG. 5A is a flow chart illustrating a preferred embodiment of a method for validating a header search in accordance with the present invention.

FIG. 5A is a flow chart illustrating a preferred embodiment of a method for validating a header search in accordance with the present invention. First, a search window of a size greater than one sector is opened, via step 502. In the preferred embodiment, the size of the search window is previously programmed, and may be up to 16 sectors wide. Next, at least one valid header is found within the search window, via step 504. In the preferred embodiment, the actual number of required valid headers has also been previously programmed. Then, the target sector is located based upon the at least one valid header, via step 506, i.e., the at least one valid header is used as a reference to locate the target sector. The buffering of data begins at the target sector, via step 508. The buffered target sector header is then validated, via step 510. If the buffered target sector header is not valid, i.e., the buffered target sector header is not correct, then the header search is restarted, via step 512. Otherwise, the correct target sector has been found, and the buffering of data continues. This header search validation scheme is also described in co-pending U.S. patent application, entitled "Method And System For Automatically Validating A Header Search In Reading Data From An Optical Medium", Ser. No. 09/656,502, filed on Sep. 7, 2000. Applicant hereby incorporates this patent application by reference.

Conventionally, the sectors are buffered by rows. At the beginning of the row is the header. At the end of each row are Error Correction Code (ECC) bits for correcting errors incurred during demodulation. The ECC bits are used by the ECC 310 to correct the errors. Once a row is buffered, ECC correction can be performed on the row, conventionally referred to as Q-correction. Once all of the rows are buffered, ECC correction can be performed on the columns, conventionally referred to as P-correction. For CD-ROM, CD-audio, and DVD data, ECC correction is available for the data portion of the sectors. But for CD-audio and DVD data, ECC correction is not available for the header. Instead, Cyclic Redundancy Check (CRC) bits are provided with the data to indicate the existence of error in the header, but correction of the errors is not available.

Figure 5B:
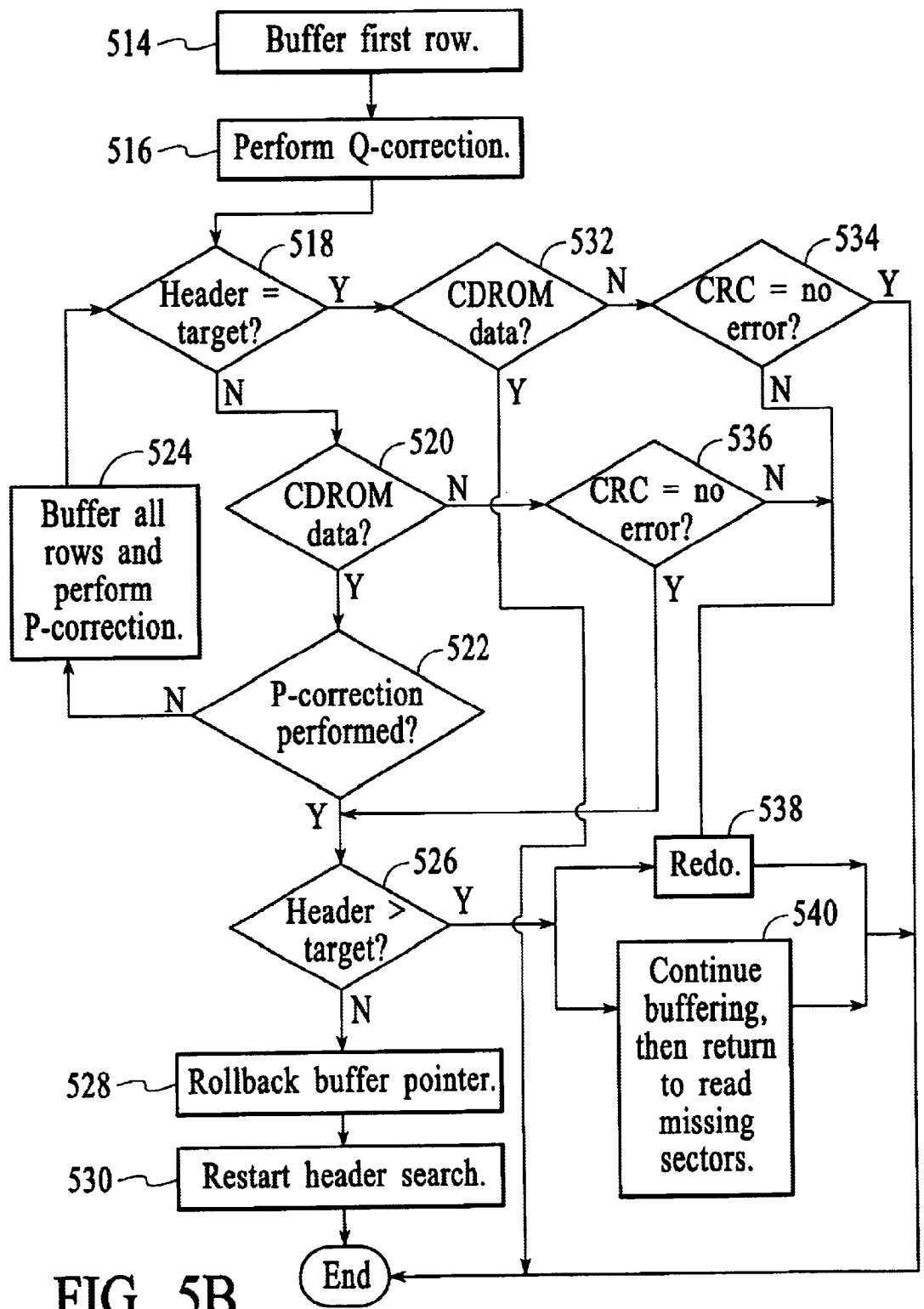
FIG. 5B is a flow chart illustrating the validation of the buffered target sector in accordance with the present invention.

FIG. 5B is a flow chart illustrating the validation of the buffered target sector in accordance with the present invention. First, the first row is buffered, via step 514. Next, Q-correction is performed, via step 516. Then the buffered target sector header is checked to determine if it is the correct target sector, via step 518.

For CD-ROM data, the Q-correction may correct any errors in the header so that the header validation is more reliable. If the header is the target, via step 518, and the data is CD-ROM, via step 532, then the scheme is exited. The buffering of the CD-ROM data continues. If the header is not the target, via step 518, and the data is CD-ROM, via step 520, then it is determined if P-correction has already been performed, via step 522. If not, then all rows are buffered and then P-correction is performed, via step 524. Then, the header is checked again, via step 518. If the header is still not the target, then it is determined if the header is greater than the target, via step 526. If the header is not greater, then the buffering began too early. The data already buffered is not relevant so a buffer pointer is rolled back to the beginning of the buffered data, via step 528. The header search is then restarted, via step 530. Thus, when the correct target sector is buffered, the irrelevant data already buffered will be overwritten since the buffer pointer has been rolled back. If the header is greater than the target, via step 526, then the target sector has been passed. Two options are available. The reading may be redone, via step 538, or the buffering can continue, and then the controller 200 can return to read the missing sectors from prior to the buffered sectors, via step 540. Which option is implemented may be determined prior to the execution of the scheme.

For CD-audio or DVD data, even if the header is the target, via step 518, the CRC must be checked as well, via step 534, since Q-correction of CD-audio and DVD data does not correct errors in the header. The header may be damaged such that it erroneously indicates the target. If the CRC indicates no error, via step 534, then the scheme is exited and buffering of the CD-audio or DVD data continues. If the CRC indicates an error, via step 534, then the data reading is redone, via step 538. If the header is not the target, via step 518, and the CRC indicates no error, via step 536, then it is determined if the header is greater than the target, via step 526. If it is not greater, then steps 528 through 530 are performed. If it is greater, than either steps 538 or 540 is performed. If the header is not the target, via step 518, and the CRC indicates an error, via step 536, then the reading of the data is redone, via step 538. This method of validating the buffered target sector is also described in co-pending U.S. patent application Ser. No. (1580P). Applicant hereby incorporates this patent application by reference.

By using a search window of a programmable size and the power of ECC correction in the header search as described above, the reliability of the search is significantly increased and validation may be performed without intervention by the firmware of the controller 200, improving the throughput of the data. Also, the same scheme may be used with multiple optical data formats, including CD-ROM, CD-audio, and DVD. Thus, the same logic may be used for multiple data formats.

Sync Window Realignment

The sync processor 304 maintains orientation to the correct beginning frame of the data so that the correct frames would be read. The sync processor 304 scans for the sync pattern in the data frame to establish the frame boundary, using it as a reference mark. In the preferred embodiment, the sync processor 304 utilizes an extended sync window to realign the sync window when the number of missing sync patterns in a data stream has exceeded a threshold number. In this manner, the sync window can be realigned before shifting of the data renders the data uncorrectable. Shifting refers to the erroneous dropping of bits from a data frame or the insertion of bits into the data frame due to noise in the data stream. This realignment may be applied to a 1-bit, 2-bit, 4-bit, or 8-bit data stream.

Figure 6:
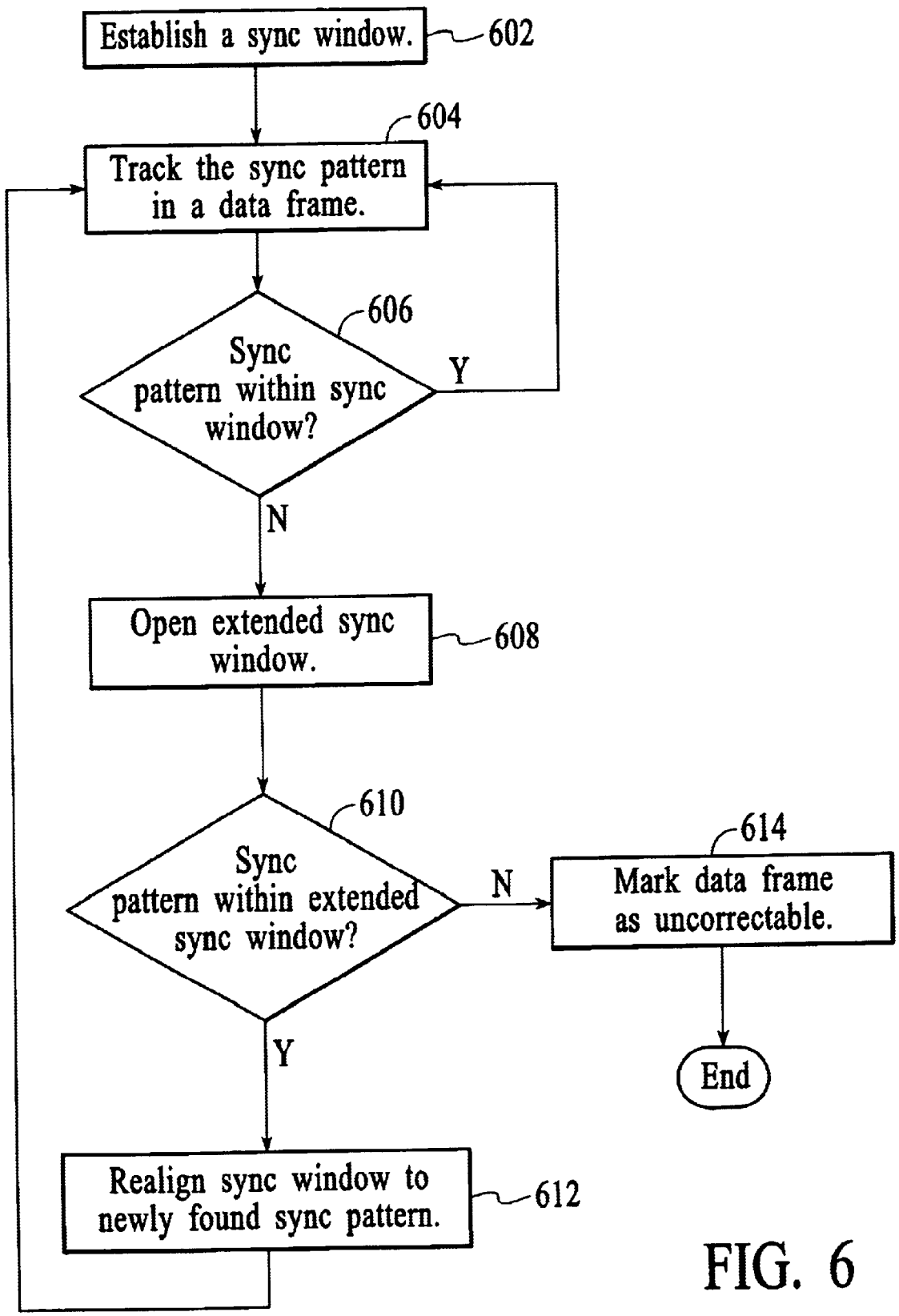
FIG. 6 is a flow chart illustrating a preferred embodiment of a method for window realignment in accordance with the present invention.

FIG. 6 is a flow chart illustrating a preferred embodiment of a method for window realignment in accordance with the present invention. First, a sync window is established, via step 602. In the preferred embodiment, the width of the sync window for CD media is 24-bits while the width for DVD media is 32-bits. Next, the sync pattern is tracked in a data frame of a data stream, via step 604. As long as the sync pattern for a data frame is within this sync window, as determined in step 606, the tracking continues. But when a sync pattern for a data frame is not within this sync window, as determined via step 606, then an extended sync window is opened, via step 608. In the preferred embodiment, for CD media, the extended sync window comprises the original 24-bit sync window, the 24-bits before the sync window, and the 24-bits after the sync window. For DVD media, the extended sync window comprises the original 32-bit sync window, the 32-bits before the sync window, and the 32-bits after the sync window. Then, it is determined if the sync pattern is detected within the extended sync window, via step 610. If so, then the sync window is realigned to the newly found sync pattern, via step 612, and the tracking via step 604 resumes. If not, then the data frame is marked as uncorrectable, via step 614. The data may then be reread from the optical media. This sync window realignment is also described in co-pending U.S. patent application, entitled "Method And System For Window Realignment Using Pipeline And Sync Correction To Correct Data Frame Boundaries", Ser. No. 09/595,423, filed on Jun. 15, 2000. Applicant hereby incorporates this patent application by reference.

Figure 7:
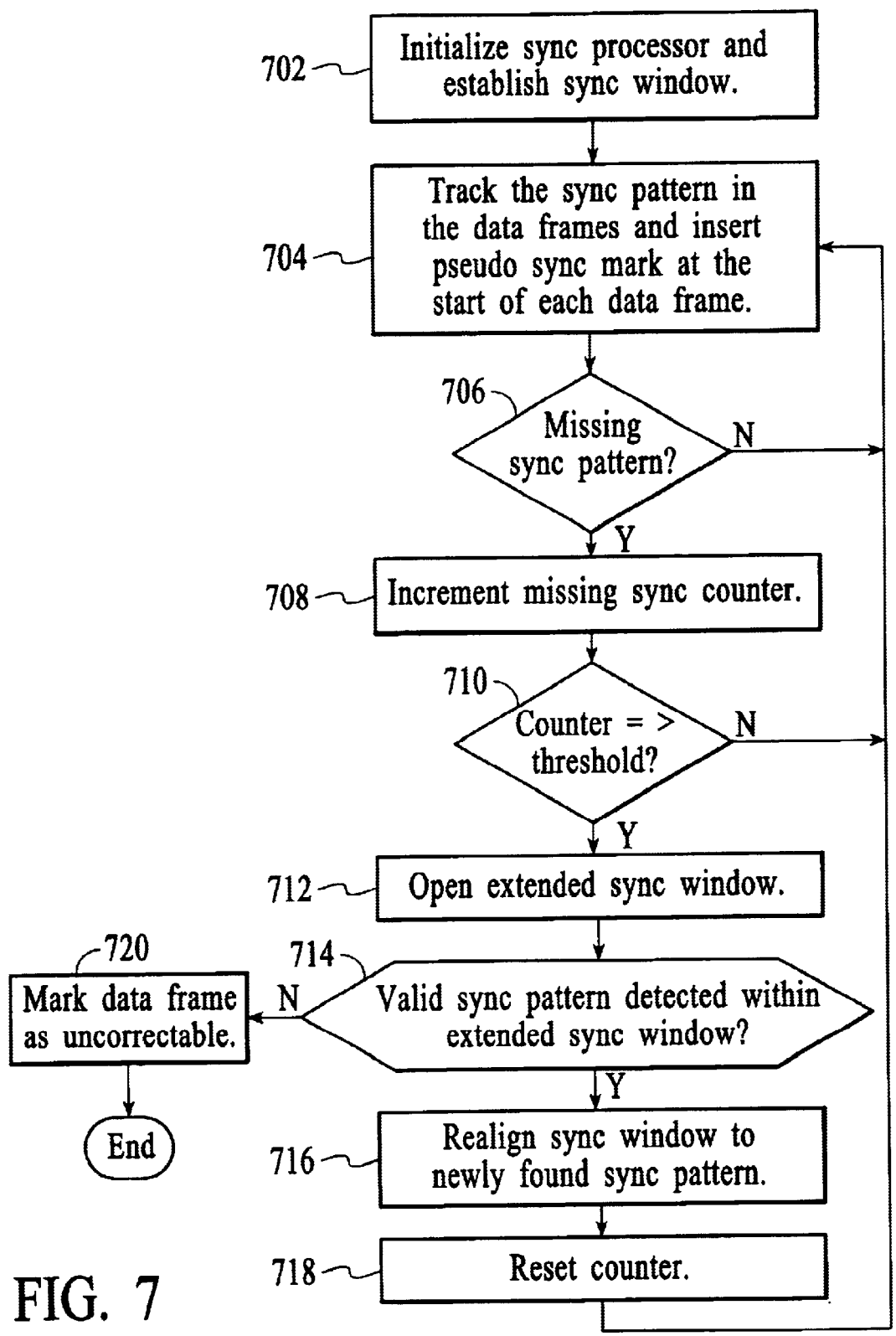
FIG. 7 is a flow chart illustrating in more detail the preferred embodiment of the method of window realignment in accordance with the present invention.

FIG. 7 is a flow chart illustrating in more detail the preferred embodiment of the method of window realignment in accordance with the present invention. First, the sync processor 304 is initialized, and the sync window is established, via step 702. In the preferred embodiment, the initialization of the sync processor 304 comprises setting a threshold number of missing sync patterns and the width of the extended sync window. These parameters are programmable. Assume, for purposes of describing the preferred embodiment, that the threshold number is set equal to 3, and the width of the extended sync window is set to 72-bits for CD media and 96-bits for DVD media.

When configured for CD media, the sync processor 304 will continuously look for the 24-bit pattern, "10000000 00010000 00000010", across a bank of four EFM bytes from the data stream from the data channel interface 212, since this 3-byte sync pattern can straddle across the 4-byte sync window. As the sync processor 304 finds the first sync pattern, a sync detection logic of the sync processor 304 will the sync window according to this first sync pattern, and start a sync window timer to count the remaining bits of the 588-bit frame. If another valid sync pattern is found after the end of the count, the sync window is established for continuous tracking of subsequent sync patterns. Otherwise, the sync detection logic will restart to look for the first valid sync pattern.

When configured for DVD media, the sync processor 304 will continuously search for any one of the 32-bit sync patterns, which are standard in the art, across a bank of 5 EFM bytes from the data stream from the data channel interface 212, since the 4-byte sync pattern can straddle across the 5-byte sync window.

As the sync processor 304 finds the first sync pattern, the sync detection logic will realign the sync window according to this first sync pattern, and start a sync window timer to count the remaining 1456 bits of the 1488-bit frame. If another valid sync pattern is found after the end of the count, the sync window is established for continuous tracking of subsequent sync patterns; otherwise, the sync detection logic will restart to search for the first valid sync pattern.

Returning to FIG. 7, once the sync processor 304 is initialized and the sync window is established, via step 702, then the sync patterns in the data frames are tracked, and a pseudo sync mark is inserted at the start of each data frame, via step 704. When reading DVD media, the sync processor 304 will continue to track the sync patterns every 1488 bits, using the sync window established during step 702. The sync pattern tracked will follow one of the 32-bit sync patterns. When reading CD media, the sync processor 304 will continue to track the sync pattern every 588 channel bits, using the sync window established during step 702. The sync pattern tracked is the fixed pattern "10000000 00010000 00000010".

During tracking, the sync processor 304 also activates a pseudo sync insertion logic to insert a sync mark,at the start of each DVD data frame for the duration of the 32-bit sync pattern, or CD data frame for the duration of the 24-bit sync pattern, whether or not an actual sync pattern is found.

When a sync pattern is determined to be missing from the sync window for a data frame, via step 706, then a missing sync counter will be incremented by one, via step 708. The missing sync counter tracks the number of missing sync patterns. If, via step 710, the missing sync counter equals or exceeds the threshold number of missing sync patterns set during step 702, an extended sync window is opened, via step 712.

In the preferred embodiment, for DVD media, an extended sync window comprising the 32-bit sync window, the 32-bits before the sync window, and the 32-bits after the sync window is opened. This extended sync window can be implemented using a 32-bit data holder. If a valid sync pattern is detected within the extended 96-bit sync window, via step 714, the sync window is realigned to the newly found sync pattern, via step 716, and the data flow is adjusted accordingly. The missing sync counter will also be reset, via step 718, since a new valid sync window has been established. Sync pattern tracking, via step 704, may then proceed. By using a 32-bit data holder, a 32-bit late sync window shift can be tolerated. By delaying the data flow up to 32-bits in the holder, a 32-bit early sync window shift can be realigned.

In the preferred embodiment, for CD media, an extended sync window comprising the 24-bit sync window, the 24-bits before the sync window, and the 24-bits after the sync window is opened. This extended sync window can be implemented in the same 32-bit data holder used for DVD media. If a valid sync pattern is detected within the extended 72-bit sync window, via step 714, the sync window is realigned to the newly found sync pattern, via step 716, and the data flow is adjusted accordingly. The missing sync counter will also be reset, via step 718, since a new valid sync window has been established. Sync pattern tracking, via step 704, may then proceed. By using 24-bits of the 32-bit data holder, a 24-bit late sync window shift can be tolerated. By delaying the data flow up to 24-bits in the holder, a 24-bit early sync window shift can be realigned.

If a valid sync pattern is not found within the extended sync window, then the data is marked as uncorrectable, via step 720. The data may then be reread from the optical media.

Thus, the present invention utilizes an extended sync window to realign the sync window when the number of missing sync patterns in a data stream has exceeded a threshold number. In the preferred embodiment, the width of the extended sync window and the threshold number are programmable. In this manner, the sync window can be realigned before shifting of the data renders the data uncorrectable. This provides flexibility and avoids some data rereads, which improves the performance of optical drive. The present invention is also compatible with many different data formats.

Encoding/Decoding Engine

The EFM extractor 303 of the data channel interface 212 extracts the EFM modulated code from the data stream, and the EFM demodulator 305 demodulates the code into the standard 8-byte data format. The demodulated data from the EFM extractor 303 then flows to the encoding/decoding engine 210. The demodulated data is decoded by the CD decoder 306 or DVD decoder 309, depending on the format of the data. When the format is CD-based, the C1 and C2 encoding processes are decoded by the CD EFM processor 307. If the data also is C3 encoded, then this is decoded as well. The SRAM 308 is used by the CD EFM processor 307 as intermediate storage.

C1, C2, and C3 refer to two standard encoding processes for encoding additional information into the data for use in correction of errors which may exist after decoding. In the C1 encoding process, additional bytes are encoded containing information about the data, such that for a data to be uncorrectable, both the data itself and the C1 encoded bytes must fail. This decrease the probability of having an uncorrectable error. In the C2 encoding process, additional bytes are encoded into the C1 encoded data, and the frames of the C2 encoded data are interleaved with an appropriate time delay. The C2 encoding process further decreases the probability of an uncorrectable error. The C3 encoding process encodes still more bytes of information for use in the correction of errors. The C3 encoding process further decreases the probability of an uncorrectable error, which is required for certain types of data, such as computer programs. C1, C2, and C3 encoding processes are standards in the art and will not be described in further detail here.

In decoding, the interleaved state of the data from the C2 encoding process is reversed. Errors in the decoding are then corrected by the ECC 310 using the information encoded by the C1 encoding process. The corrected data is then checked by the error detection code 311 (EDC) using the information encoded by the C3 encoding process. If an error still exist, then the process returns to the ECC 310, and then the EDC 311, until no further errors exist.

Error Correction

Figure 8:
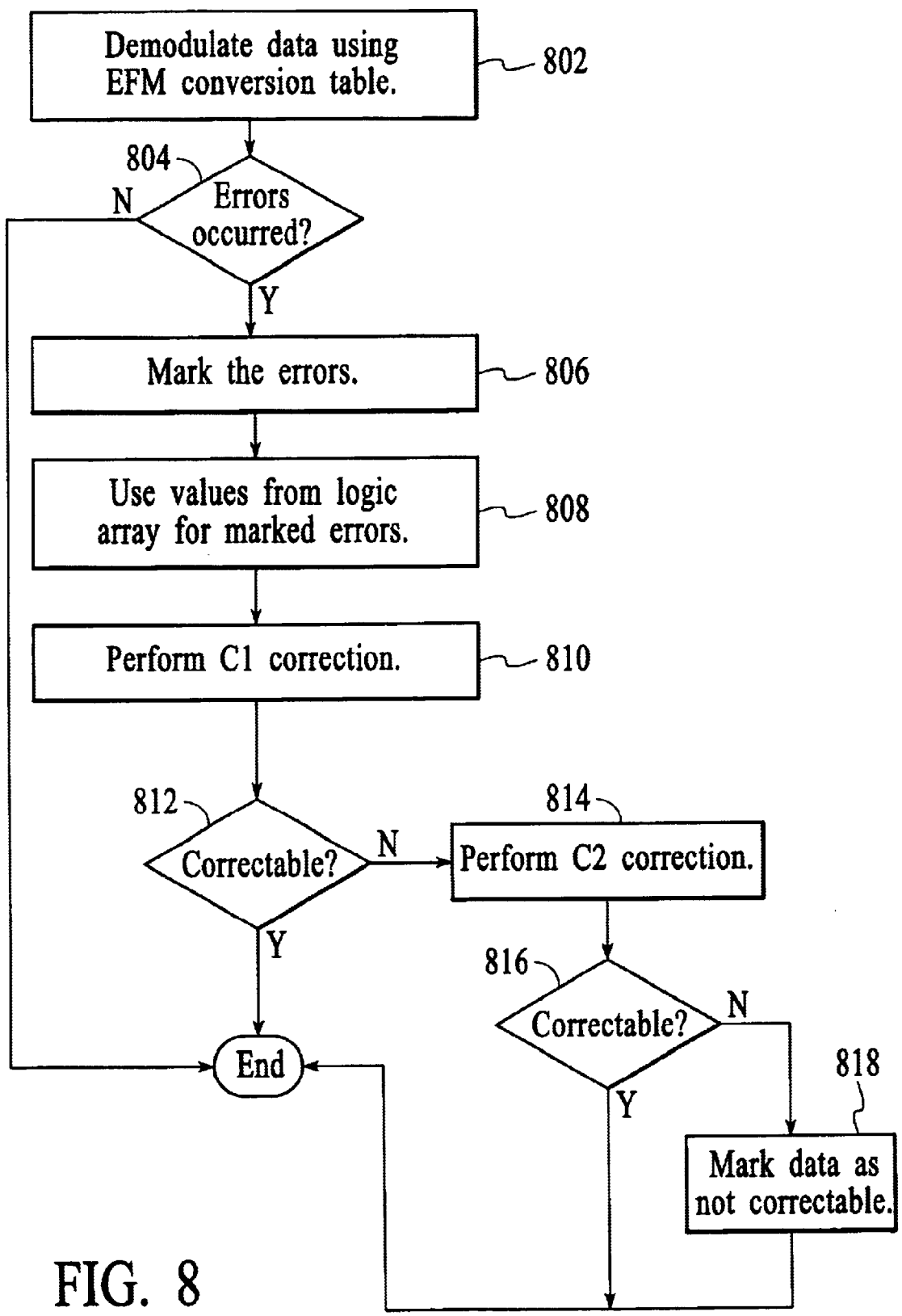
FIG. 8 is a flow chart illustrating a preferred embodiment of a method for error correction in accordance with the present invention.
Figure 10:
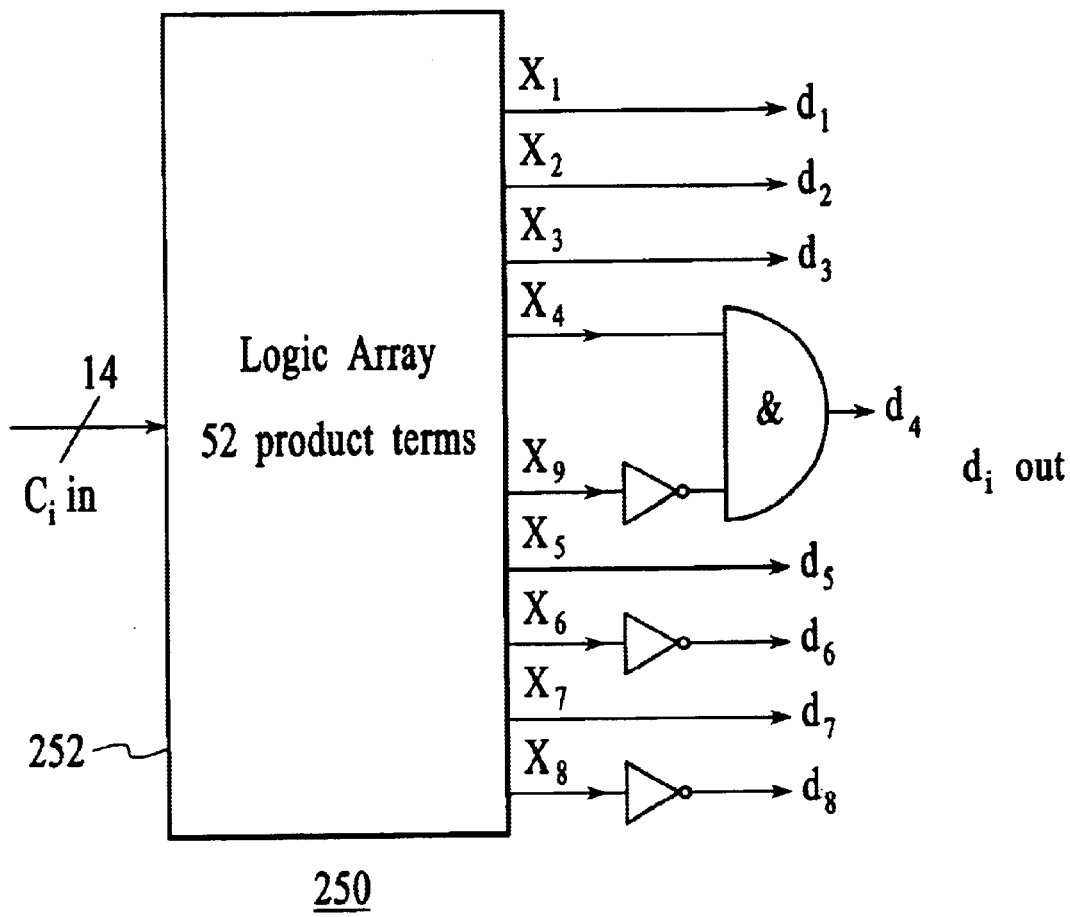
FIG. 10 is a logic array used by the method for error correction in accordance with the present invention.

FIG. 8 is a flow chart illustrating a preferred embodiment of a method for error correction in accordance with the present invention. First, the data is demodulated using the EFM conversion table, provided in FIG. 9, via step 802. Next, if errors occurred in the demodulation, via 804, the errors are marked, via step 806. For example, an error occurs when the 14 bit data has no corresponding 8 bit data in the conversion table. A logic array, such as one illustrated in FIG. 10, is then used to obtain "best guess" or estimated values for the marked errors, via step 808. Error correction is then performed, via steps 810–818. In the preferred embodiment, the error correction includes the C1 and C2 correction processes. The C1 correction process is first performed, via step 810. If the C1 correction process is not able to correct the data, i.e., there is more than one error, via step 812, then the C2 correction process is performed on the data, via step 814. If the C2 correction process is not able to correct the data, i.e., there is more than two errors, then the data is marked as not correctable, via step 818. This error correction process is also described in co-pending U.S. patent application, entitled "Method And System For Improved Error Correction In Optical Media Data Processing", Ser. No. 09/560,867, filed on Apr. 28, 2000. Applicant hereby incorporates this patent application by reference.

For example, assume that in the demodulation, via step 802, one error occurs. This error is marked, via step 806. The logic array is then used to obtain a "best guess" value for this error, via step 808. The C1 correction process is then performed, via step 810. If the "best guess" value is correct, then it finds no errors. If it is not correct, then the C1 correction process is able to guarantee the correction of this one error. The error is thus determined to be correctable, via step 812.

For another example, assume that in the demodulation, via step 802, two errors occur. These errors are marked, via step 806. The logic array is then used to obtain "best guess" values for these two errors, via step 808. Assume that one of the "best guess" values is correct while the other is not. This leaves one error. When the C1 correction process is performed, via step 810, the C1 encoded data is able to guarantee the correction of the one remaining error. If neither of the "best guess" values are correct, then the data is determined to not be correctable by the C1 correction process, via step 812, and the C2 correction process is then performed, via step 814. Since the C2 encoded data is able to guarantee the correction of the two errors, the data is correctable.

For a third example, assume that in the demodulation, via step 802, three errors occur. These three errors are marked, via step 806. The logic array is used to obtain "best guess" values for these three errors, via step 808. If all three of the "best guess" values are correct, then when the C1 correction process is performed, via step 810, no errors are found. If only two of the "best guess" values are correct, then there is one remaining error. The C1 correction process is then performed, via step 810, and is able to correct the remaining error. The data is thus correctable. If only one of the "best guess" values is correct, then there are two remaining errors. The data is determined to not be correctable by the C1 correction process, via step 812. The C2 correction process is thus performed, via step 814. Since there are only two errors, the data is correctable by the C2 correction process, via step 816. If none of the "best guess" values are correct, then there are three errors, which is too many for the C2 correction process to correct. The data is then marked as not correctable, via step 818.

Thus, the preferred embodiment of the present invention provides a controller with a decoding engine which stores erasure data in the same memory as the C2 data bytes. Erasure bits are stored in the memory as erasure bytes, where each bit of the erasure bytes corresponds to a C2 data byte stored in the memory. The erasure bytes are stored in the same interleaved configuration as the C2 data bytes. When a C2 data byte is corrected, the erasure byte which contains the corresponding erasure bit is read from the memory. The erasure bit is modified to reflect the correction. Then, the erasure byte with the modified erasure bit is written back to the memory. By storing the erasure data in the same memory as the C2 data bytes, the present invention eliminates the need for a separate memory for storing erasure data. This decreases the cost of manufacturing the controller.

Erasure Data Storage

In the preferred embodiment, the controller 200 stores erasure data in the same memory as the C2 data bytes. Erasure bits are stored in the memory as erasure bytes, where each bit of the erasure bytes corresponds to a C2 data byte stored in the memory. The erasure bytes are stored in the same interleaved configuration as the C2 data bytes. When a C2 data byte is corrected, the erasure byte which contains the corresponding erasure bit is read from the memory. The erasure bit is modified to reflect the correction. Then, the erasure byte with the modified erasure bit is written back to the memory.

Figure 11:
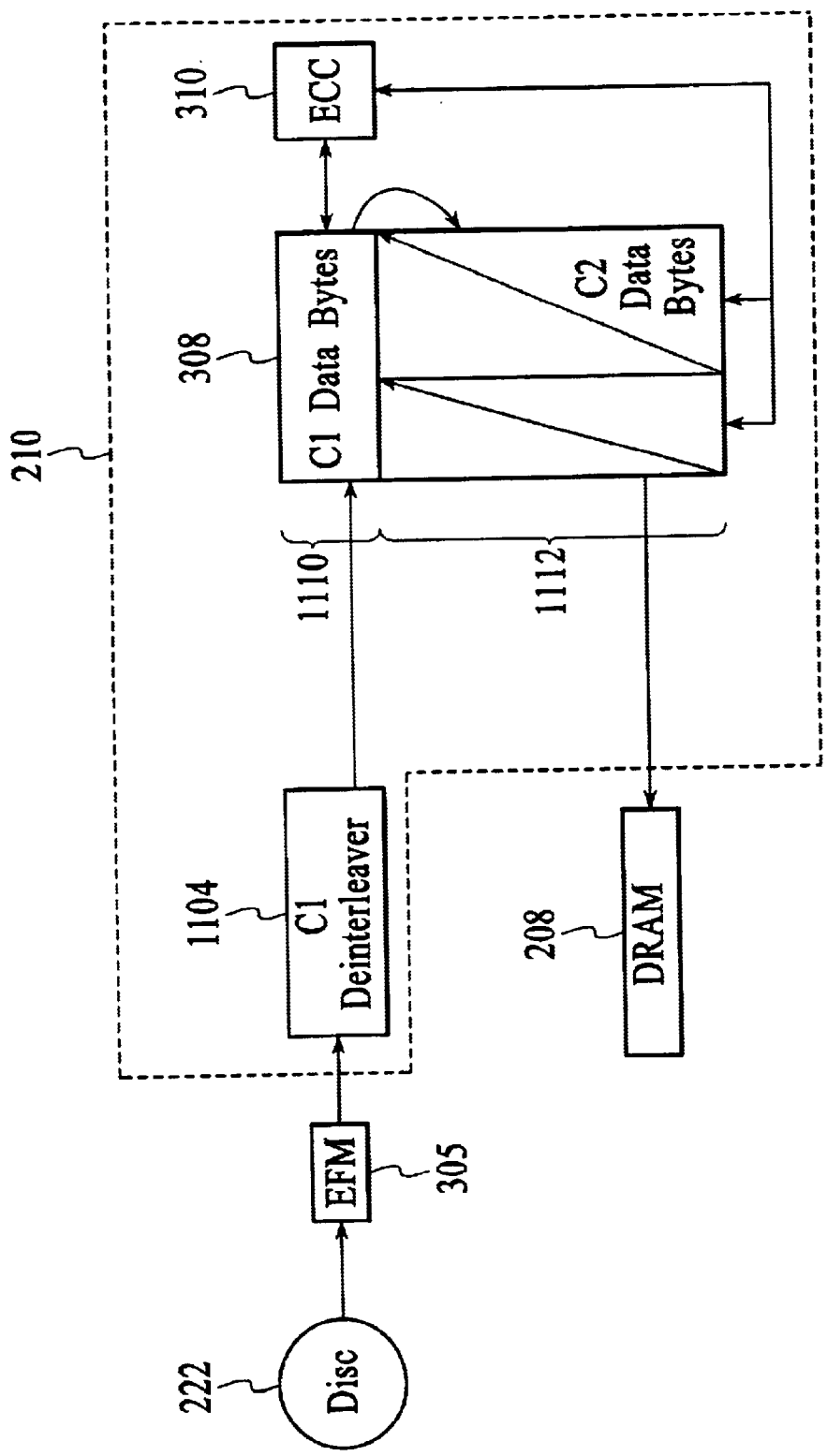
FIG. 11 is a logical block diagram illustrating a preferred embodiment of a system for erasure data storage in accordance with the present invention.

FIG. 11 is a logical block diagram illustrating a preferred embodiment of a system for erasure data storage in accordance with the present invention. The data from the optical disc 222 is demodulated by the EFM demodulator 305. The demodulated data passes through a C1 de-interleaver 1104, and the de-interleaved data are stored in a C1 area 1110 of SRAM 308. The C1 data bytes are corrected by the ECC 310. The corrected C1 data bytes are then stored in a C2 area 1112 in an interleaved format. The erasure data is also stored in the C2 area 1112 and also in an interleaved format. The ECC 310 corrects the C2 data bytes with errors and updates the corresponding erasure bytes. The corrected C2 bytes are then stored in the embedded DRAM 208 for the next decoding process. This erasure data storage is also described in co-pending U.S. patent application, entitled "Method And System For Erasure Data Storage In Decoding Data From Optical Media", Ser. No. (1576P), filed on. Applicant hereby incorporates this patent application by reference.

Figure 12:
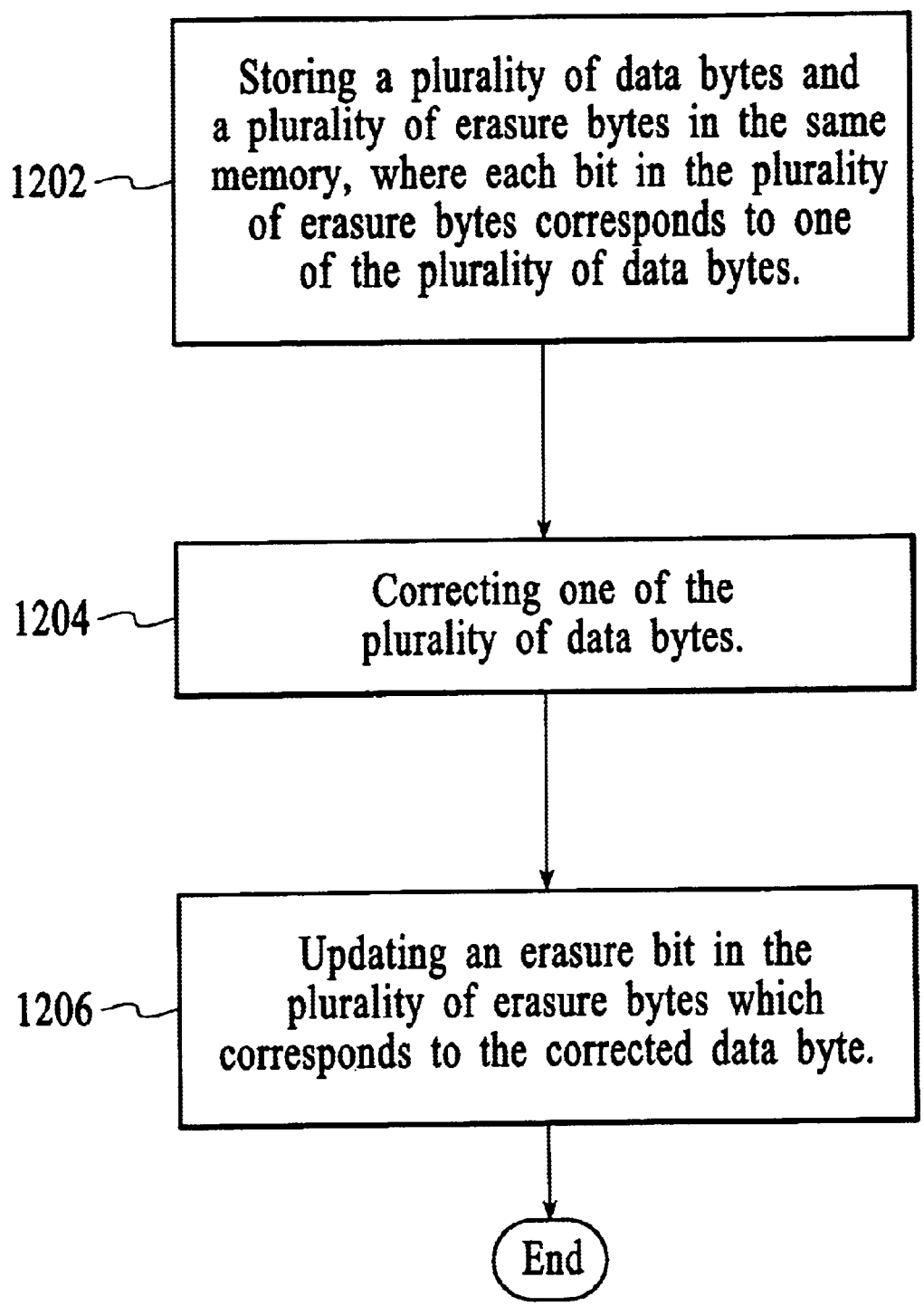
FIG. 12 is a flow chart illustrating a preferred embodiment of a method of erasure data storage in decoding data from optical media in accordance with the present invention.

FIG. 12 is a flow chart illustrating a preferred embodiment of a method of erasure data storage in decoding data from optical media in accordance with the present invention. First, a plurality of C2 data bytes and a plurality of erasure bytes are stored in the same memory 308, via step 1202, where each bit in the plurality of erasure bytes corresponds to one of the plurality of C2 data bytes.

Figure 13:
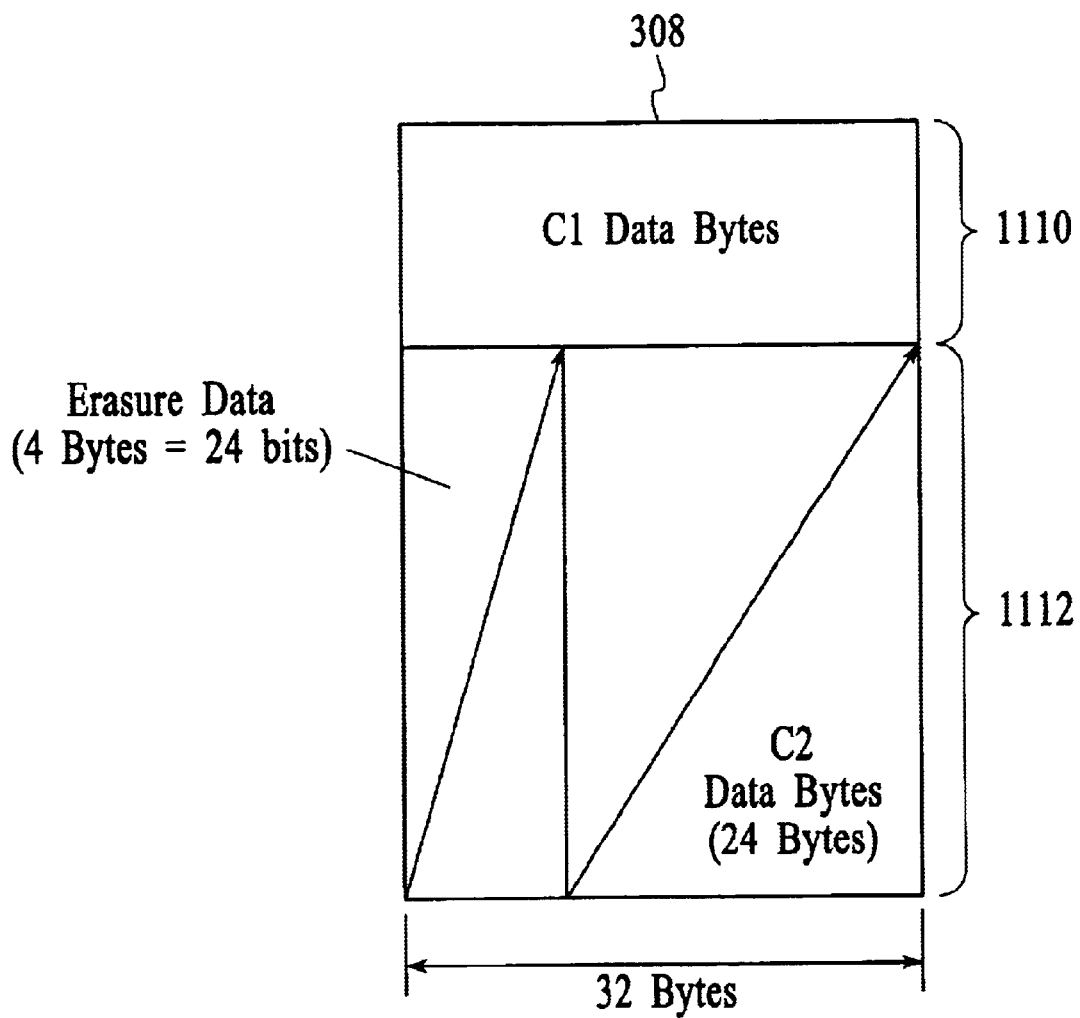
FIG. 13 illustrates a preferred embodiment of the memory organization in the storage of the C2 data and the erasure bytes in accordance with the present invention.

FIG. 13 illustrates a preferred embodiment of the memory organization in the storage of the C2 data and the erasure bytes in accordance with the present invention. In the preferred embodiment, four erasure bytes and twenty-four C2 data bytes are stored in the same C2 area 1112 in an interleaved format. Each bit of the four erasure data bytes corresponds to one of the twenty-four C2 data bytes.

Returning to FIG. 12, if one of the stored C2 data bytes have an error, as indicated by its corresponding erasure bit, then the ECC 310 corrects the C2 data byte, via step 1204. The ECC 310 also updates the erasure bit in the plurality of erasure bytes which corresponds to the corrected C2 data byte, via step 1206. Steps 1204 and 1206 are repeated for each C2 data byte with an error. The corrected C2 data bytes are then stored in the embedded DRAM 208 for the next decoding process.

Figure 14:
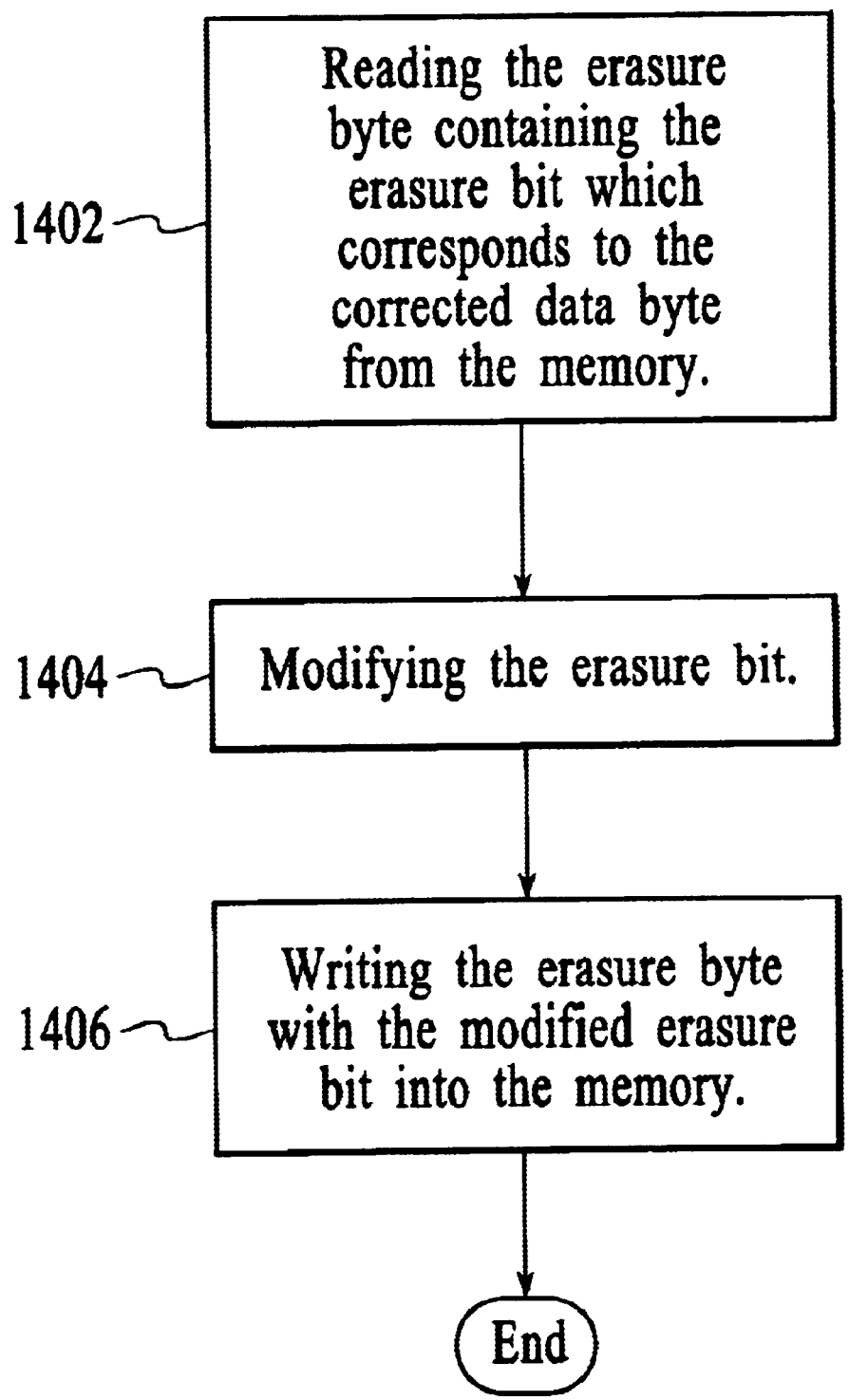
FIG. 14 is a flowchart illustrating in more detail the updating of an erasure bit in accordance with the present invention.

FIG. 14 is a flowchart illustrating in more detail the updating of an erasure bit in accordance with the present invention. First, the erasure byte containing the erasure bit which corresponds to the corrected data byte is read from the SRAM 308, via step 1402. Next, the erasure bit is modified, via step 1404. Then, the erasure byte with the modified erasure bit is written back into the SRAM 308, via step 1406. The read-modify-write steps 1402–1406 are required since the reading and writing of an individual bit in a memory is not allowed by convention. Thus, the entire erasure byte must be read from the SRAM 308 in order to modify one erasure bit. Once the erasure bit is updated, the entire erasure byte with the modified erasure bit is then written back into the SRAM 308.

Thus, the preferred embodiment of the present invention provides a controller with a decoding engine which stores erasure data in the same memory as the C2 data bytes. Erasure bits are stored in the memory as erasure bytes, where each bit of the erasure bytes corresponds to a C2 data byte stored in the memory. The erasure bytes are stored in the same interleaved configuration as the C2 data bytes. When a C2 data byte is corrected, the erasure byte which contains the corresponding erasure bit is read from the memory. The erasure bit is modified to reflect the correction. Then, the erasure byte with the modified erasure bit is written back to the memory. By storing the erasure data in the same memory as the C2 data bytes, the present invention eliminates the need for a separate memory for storing erasure data. This decreases the cost of manufacturing the controller.

Syndrome Generation

For each stage of the ECC process, syndromes are generated to determine whether or not errors exist in the data. In the preferred embodiment, syndrome generation is simultaneously performed for multiple columns of data. The present invention obtains data bytes for multiple columns at one time. Syndrome generation is then performed for each column, with the partial syndromes for each column stored in a memory. As the data bytes of subsequent rows of data for the multiple columns are obtained, the partial syndromes for each column are read from the memory and loaded into the syndrome generation logic, thus updating the partial syndrome for each column. The updated syndromes are written back into the memory. This continues until the syndromes for all of the rows for the multiple columns have been generated.

Figure 15:
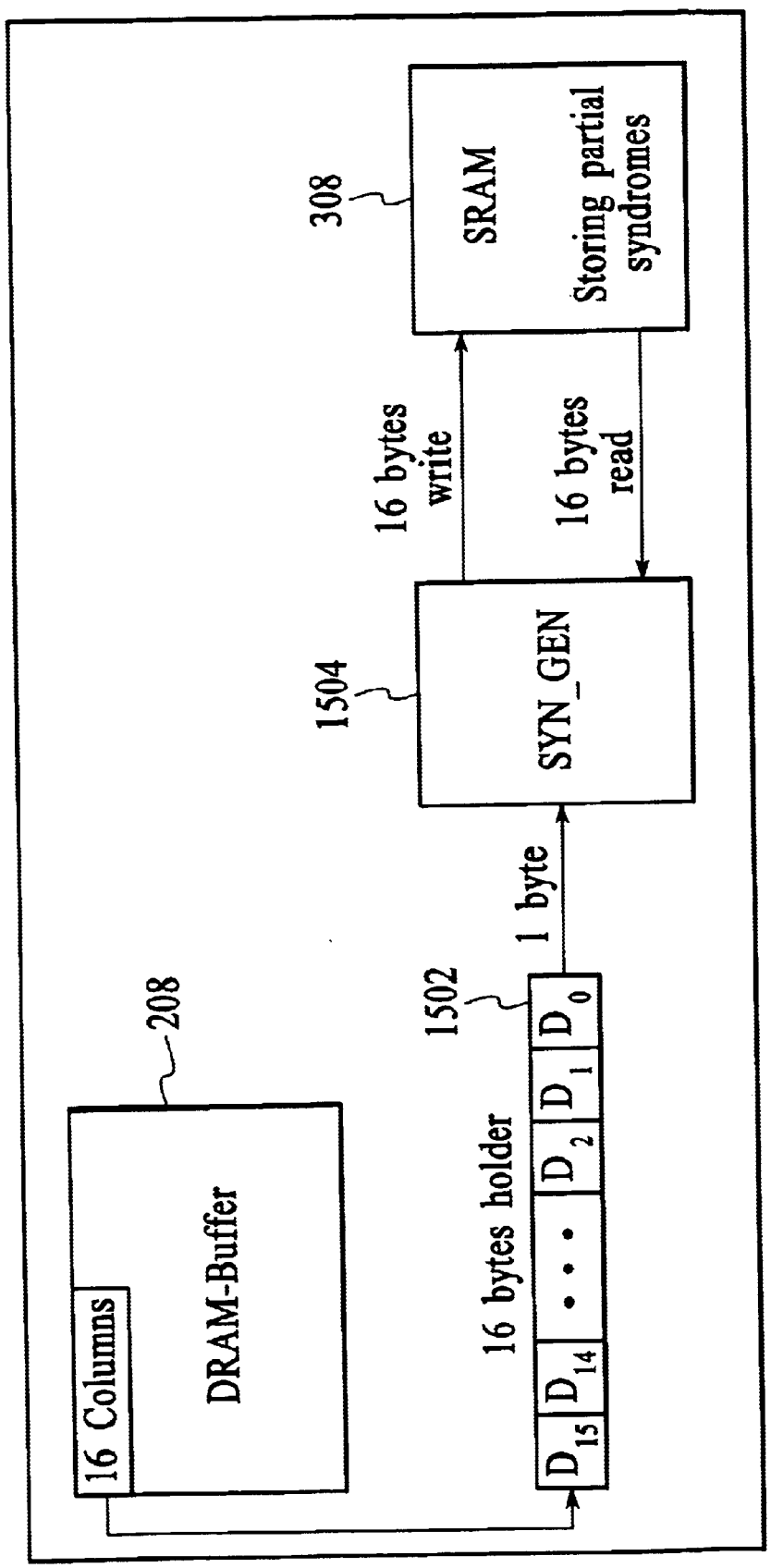
FIG. 15 is a block diagram illustrating a preferred embodiment of the multiple column syndrome generation process in accordance with the present invention.

FIG. 15 is a block diagram illustrating a preferred embodiment of the multiple column syndrome generation process in accordance with the present invention. The process involves the DRAM 208, a holder 1502, one set of syndrome generation logic 1504, and the SRAM 308.

Figure 16:
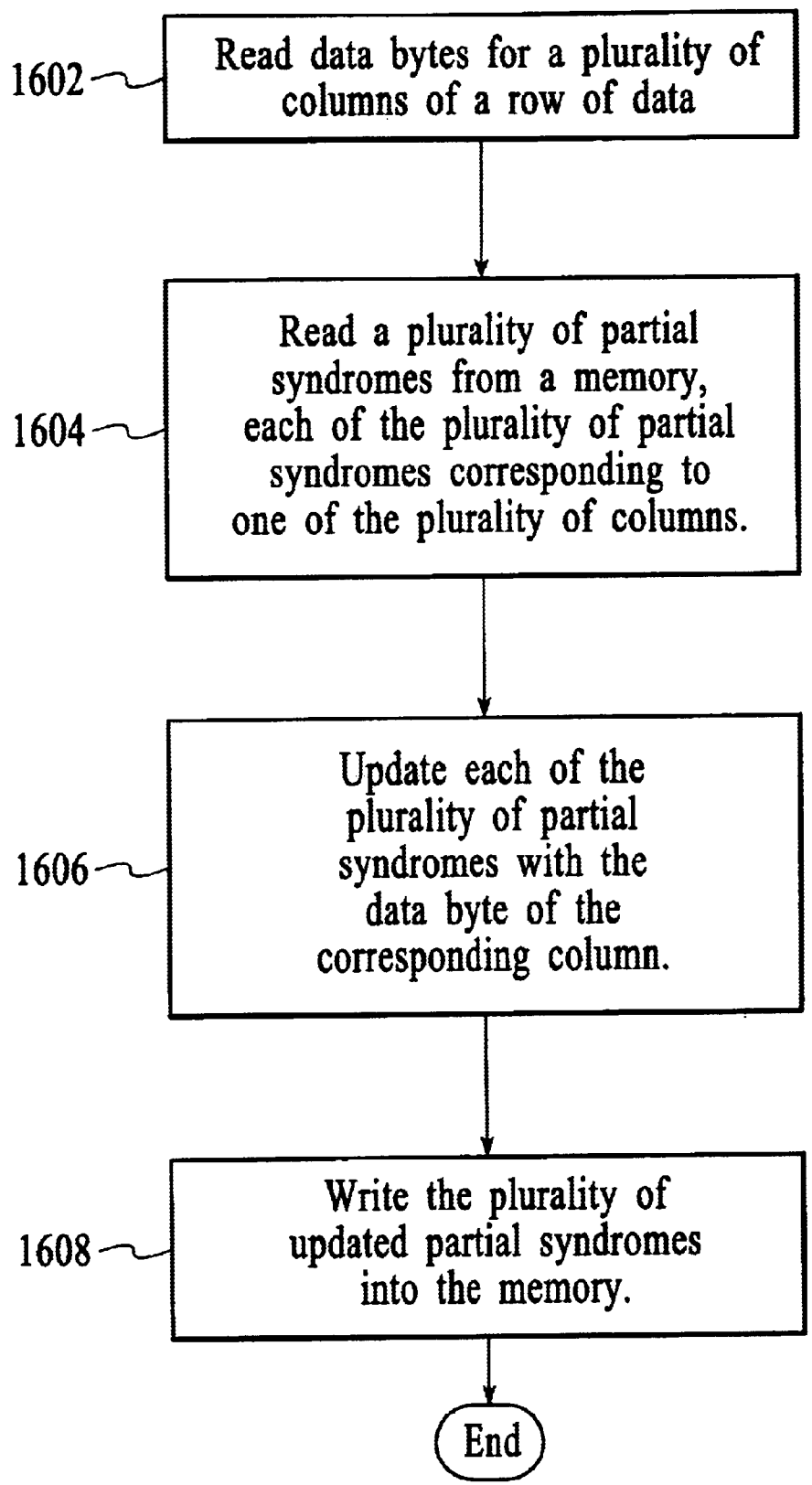
FIG. 16 is a flowchart illustrating a preferred embodiment of the multiple column syndrome generation process in accordance with the present invention.

FIG. 16 is a flowchart illustrating a preferred embodiment of the multiple column syndrome generation process in accordance with the present invention. When data is read from the optical media, it is first buffered in the DRAM 208. Then, data bytes for a plurality of columns of a row of data is read from the DRAM 208, via step 1602, and placed into the holder 1502. In the preferred embodiment, sixteen bytes are obtained at a time. Each byte in the holder 1502 represents one data symbol of a given column. For example, $D_0$ corresponds to the data symbol in column 0, and $D_1$ corresponds to the data symbol in column 1, etc. Next, a plurality of partial syndromes from the SRAM 308 are read, via step 1604. Each of the plurality of partial syndromes correspond to one of the plurality of columns in the holder 1502. Each of the plurality of partial syndromes are then updated with the data byte of the corresponding column, via step 1606, by the syndrome generation logic 1504. The partial syndrome for a column is the result of syndrome calculations from previous rows of the column. The plurality of updated partial syndromes are then written, or stored, back into the SRAM 308, via step 1608. The syndrome generation is also described in co-pending U.S. patent application, entitled "Method And System For Multiple Column Syndrome Generation", Ser. No. 09/542,893, filed on Apr. 4, 2000. Applicant hereby incorporates this patent application by reference.

Figure 17:
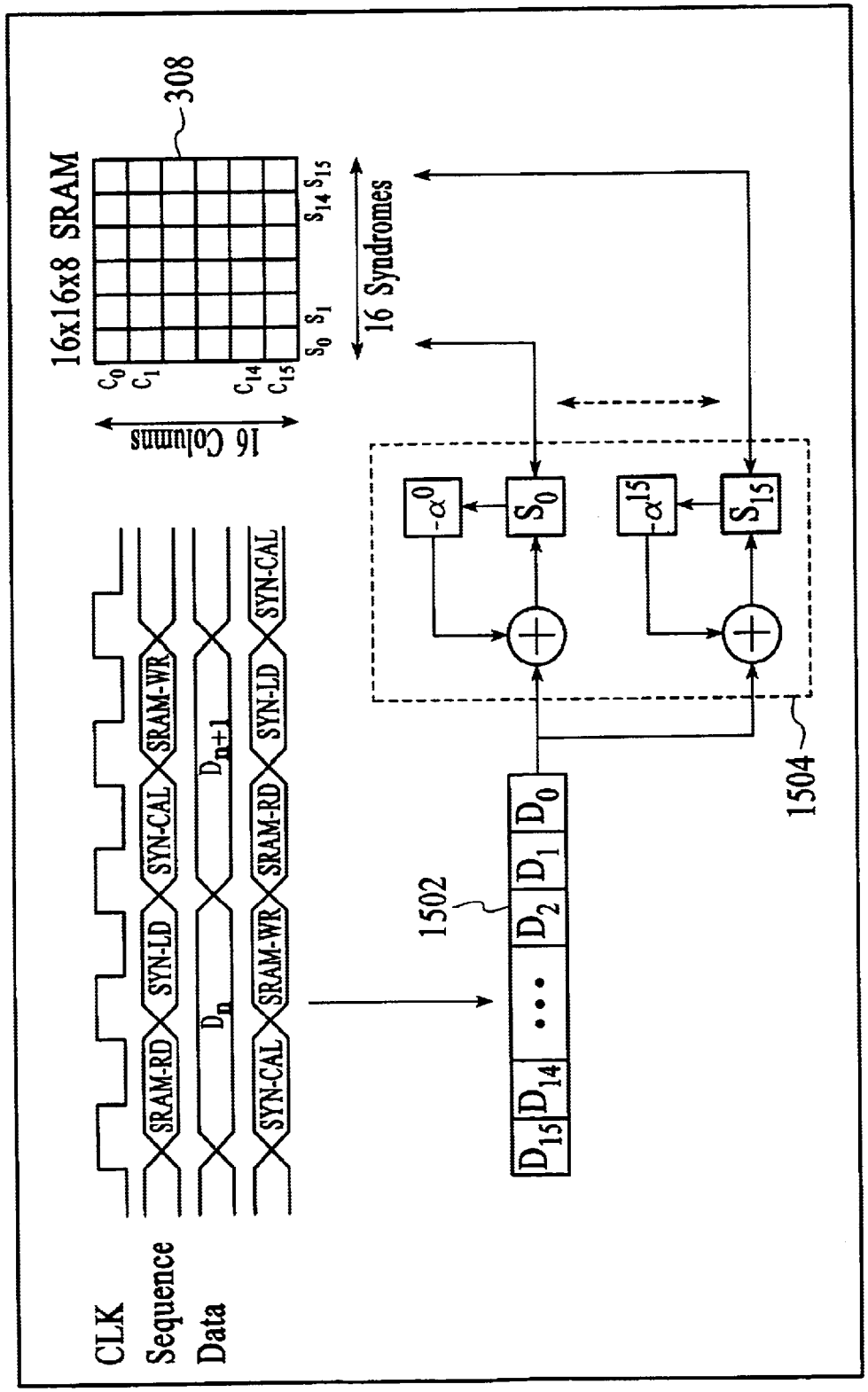
FIGS. 17 and 18 are a block diagram and a flowchart, respectively, illustrating in more detail the preferred embodiment of the multiple column syndrome generation scheme in accordance with the present invention.
Figure 18:
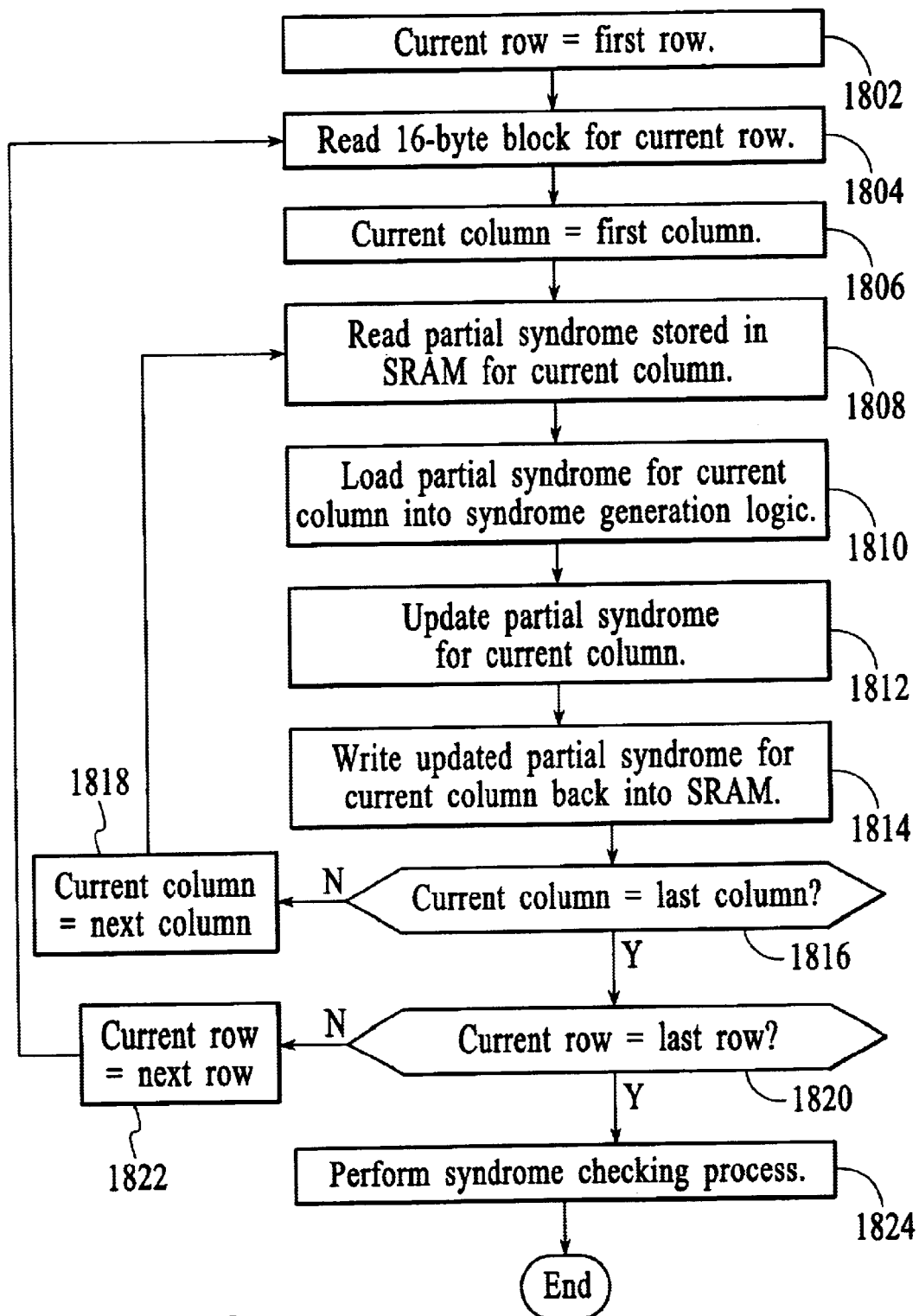

FIGS. 17 and 18 are a block diagram and a flowchart, respectively, illustrating in more detail the preferred embodiment of the multiple column syndrome generation scheme in accordance with the present invention. Column syndrome generation starts when data is requested from the DRAM 208, and a single data byte for multiple columns in the first row are read at once, via steps 1802 and 1804. In the preferred embodiment, data bytes for 16 columns are read at once. The 16 bytes are placed in the 16-byte holder 1502. Starting with the first column as the current column, via step 1806, the partial syndrome for the current column stored in the SRAM 308 is read, via step 1808. The partial syndrome is loaded into the registers, $S_0$ through $S_{15}$, of the syndrome generation logic 1504, via step 1810. The partial syndrome for the current column is then updated, via step 1812. The updated partial syndrome is calculated by the syndrome generation logic 1504 based upon the partial syndrome from previous rows of the current column and the byte in the current row for the current column. The updated partial syndrome for the current column is written back into the SRAM 308, via step 1814. In the preferred embodiment, the SRAM 308 is large enough to store 16 partial syndromes for each of the 16 columns, or 256 8-bit locations. If the current column is not the last column for the data bytes, as determined via step 1816, then steps 1808 through 1816 are repeated for the next column, via step 1818. This continues until the current column is the last column. The syndrome generation is thus complete for the columns in the current row. Steps 1804 through steps 1820 are repeated until the current row is the last row, via steps 1820 and 1822. Once all of the syndromes for the 16 columns have been calculated, all of the calculated syndromes are checked for errors, via step 1824. Then, the next set of 16 column syndromes, i.e., for data bytes in columns 16 through 31, are generated according to the scheme illustrated in FIGS. 17 and 18. This continues until the column syndromes for all 172 columns have been generated.

With the exception of the first data byte of each column, the syndrome generation process in accordance with the present invention requires three clock cycles for each column. In the first clock cycle, the partial syndromes stored in the SRAM 308 is read, via step 1808. In the second clock cycle, the partial syndrome of the column, for example column 2, is loaded from the SRAM 1502 into the registers of the syndrome generation logic 1504, via step 1810. At the same time, the partial syndrome of the previous column, column 1 is written into the SRAM 308. In the third clock cycle, the partial syndrome for the current column, column 2, is updated, via step 1812. The updated partial syndrome for column 2 is written into the SRAM 308, via step 1814, during the next second clock cycle.

Thus, the preferred embodiment of the present invention obtains data bytes for multiple columns at one time. Syndrome generation is then performed for each column, with the partial syndromes for each column stored in a memory. As the data bytes of subsequent rows of data for multiple columns are obtained, the partial syndromes for each column are read from the memory and loaded into a syndrome generation logic, thus updating the partial syndrome for each column. The updated syndromes are written back into the memory. This continues until the syndromes for all of the rows for the multiple columns have been generated. By storing partial syndromes in a memory, multiple sets of syndrome generation logic is not needed to simultaneously process multiple columns of data bytes, thus avoiding a space penalty for the controller. Since multiple columns are read at tone time, fewer clock cycle are required to access the data bytes, saving time. Therefore, clock cycle penalties are decreased while also avoiding a space penalty for the controller.

Audio Data Error Correction

For audio data, the controller 200 uses a fixed time period for the sector data error correction process. By using a fixed correction time, the sector data and the sector sub-code can be automatically matched based upon an offset calculated from the fixed correction time. In this manner, the sector data and its corresponding sector sub-code may be matched without the need for complicated algorithms. This saves significant processing resources. The location from which the reading of the data is resumed can be more accurately determined.

Figure 19:
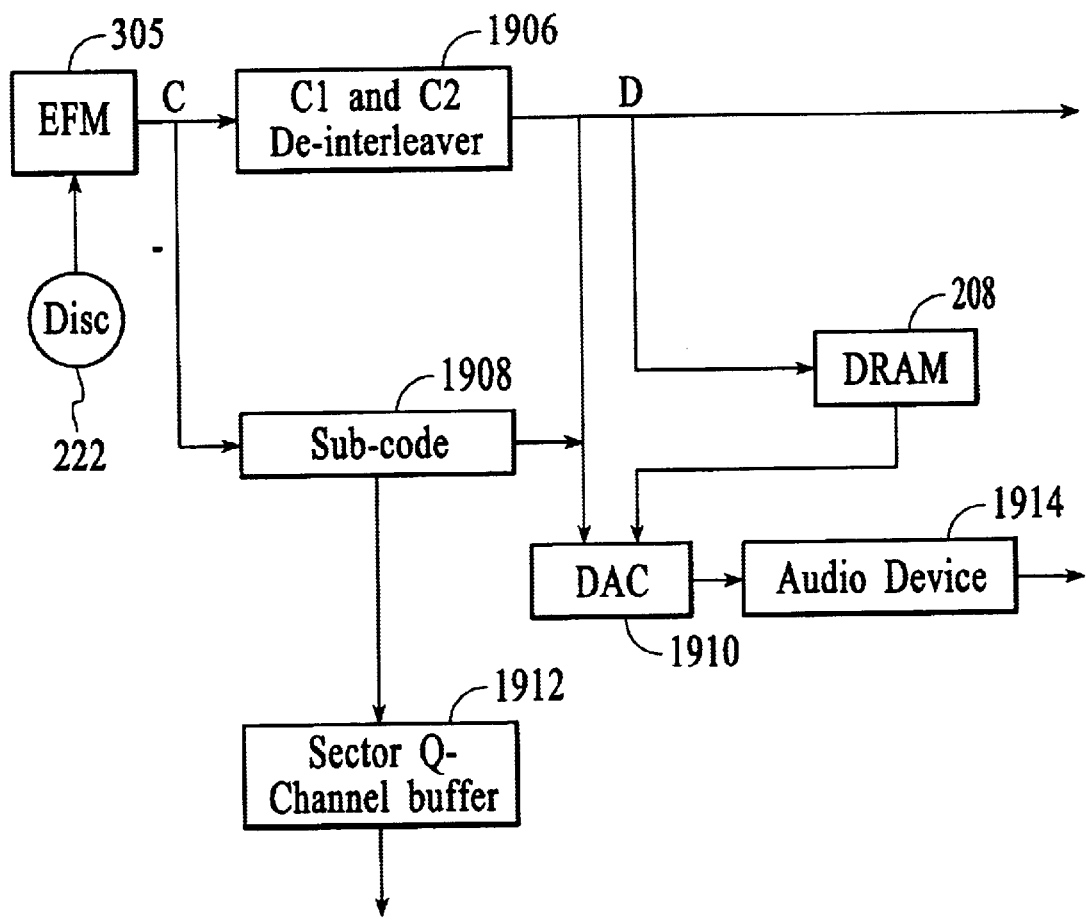
FIG. 19 is a logical diagram of a preferred embodiment of a method of retrieving audio data from an optical media in accordance with the present invention.

FIG. 19 is a logical diagram of a preferred embodiment of a method of retrieving audio data from an optical media in accordance with the present invention. Audio data is read from the optical disc 222 and demodulated by the EFM demodulator 305. The sector data of the demodulated audio data are corrected by the ECC process, performed by the C1 and C2 de-interleaver 1906, part of the CD EFM processor 307. The sub-code block 1908 extracts the sector sub-code and stores them in the sector Q-channel buffer 1912. The embedded DRAM 208 serves as a buffer for the corrected sector data, which is eventually played by the DAC 1910 and the audio device 1914. This method of retrieving audio data is also described in co-pending U.S. patent application, entitled "Method And System For Improved Audio Data Retrieval From An Optical Media", Ser. No. 09/542,175, filed on Apr. 14, 2000. Applicant hereby incorporates this patent application by reference.

In the preferred embodiment, the correction time required for the ECC process, i.e., for sector data to travel from node C to node D, is fixed, even if the sector data has no errors. From this fixed correction time, a time offset between the arrival of the sector data and the arrival of the sector sub-code at node D can be calculated. This time offset is used to accurately and automatically match the sector data to the sector sub-code. For example, assume the time offset is T, and the time at which the sector sub-code arrives at node D is $t_1$. Then the sector data which arrives at node D at time $t_1+T$ is the sector data which matches the sector sub-code. Thus, when the reading of audio data from the disc 222 is suspended, the identity of the last read sector can be accurately determined based upon the matched sector sub-code. The sector can be found on the disc 222, and the reading of the audio data resumed from that location.

Figure 20:
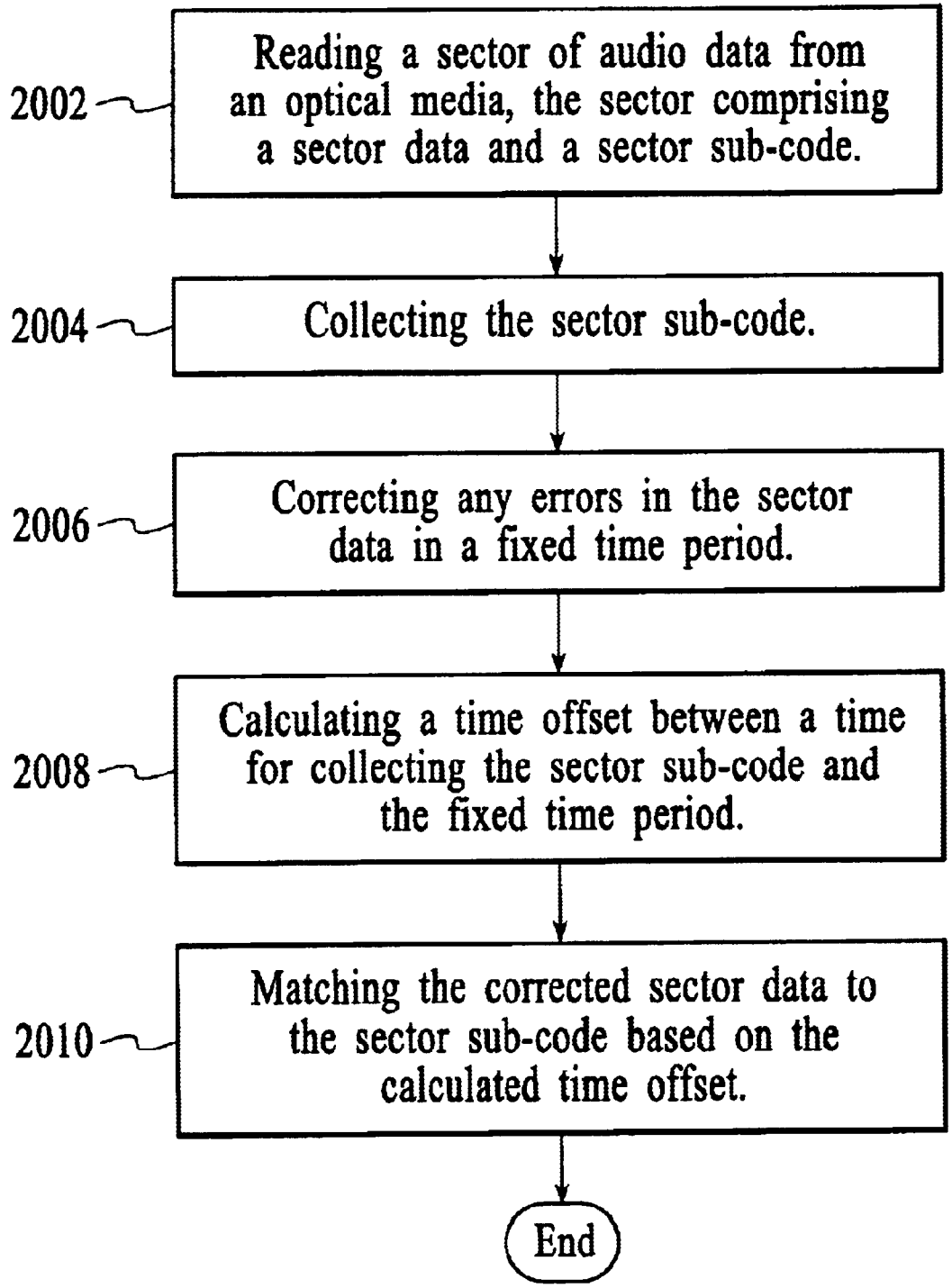
FIG. 20 is a flowchart illustrating the preferred embodiment of the method of retrieving audio data from an optical media in accordance with the present invention.

FIG. 20 is a flowchart illustrating the preferred embodiment of the method of retrieving audio data from an optical media in accordance with the present invention. First, a sector of audio data is read from an optical media 222, via step 2002. The sector comprises a sector data and a sector sub-code. After this sector is demodulated, the sector data and the sector sub-code take different paths. The sector sub-code is collected, via step 2004, by the sub-code block 1908 and stored in the sector Q-channel buffer 1912. Any errors in the sector data is corrected by the C1 and C2 de-interleaver 1906, via step 2006, in a fixed period of time. Then, the time offset between a time for collecting of the sector sub-code and the fixed correction time period is calculated, via step 2008. In other words, the time offset between the arrival of the sector, data and the arrival of the sector sub-code at node D is calculated.

In the preferred embodiment, the correction time is reflected by the formula:

Correction Time=*C*1-Corr+Jittering-buffer+*C*2-Corr+*C*2-Deinterleave

C1-Corr is the time required to perform C1 error correction. The jittering-buffer is the time delay caused by jittering. Jittering refers to the erroneous dropping of bits from a data frame or the insertion of bits into the data frame due to noise in the data stream. C2-Corr is the time required to perform C2 error correction. C2-Deinterleave is the time required to deinterleave the sector data. In the preferred embodiment, a jittering buffer large enough to compensate for the jittering is used such that it does not affect the correction time. C2-Deinterleave is fixed, as it is also in the prior art. A key feature of the present invention is the fixing of C1-Corr and C2-Corr. By fixing them, the total correction time is fixed, even if the sector data has no errors.

Once the time offset is calculated, it is used to match the corrected sector data to its corresponding sector sub-code, via step 2010. Once the sector sub-code and the sector data are matched, the identity of the last read sector is known. Thus, when the reading of audio data is resumed, the correct location from which to resume reading can be found.

Thus, the preferred embodiment of the present invention uses a fixed time period for the sector data error correction process. By using a fixed correction time, the sector data and the sector sub-code can be automatically matched based upon an offset calculated from the fixed correction time. In this manner, the sector data and its corresponding sector sub-code may be accurately matched without the need for complicated algorithms. This saves significant processing resources. The location from which the reading of the audio data is resumed is more accurately determined.

Automatic Link Sector Detection in CD-Writable and CD-Rewritable Data

When CD-R or CD-RW data is being read, the controller 200 uses a hardware approach to handling link sector detection. Instead of passing the data to a system software prior to link sector detection, the link sector detection is performed by the controller hardware. When the controller 200 detects the link sectors, it automatically either skips or buffers the link sectors depending upon the configuration of the controller 200. By performing the link sector detection in hardware, significant processing time is saved.

Figure 21A:
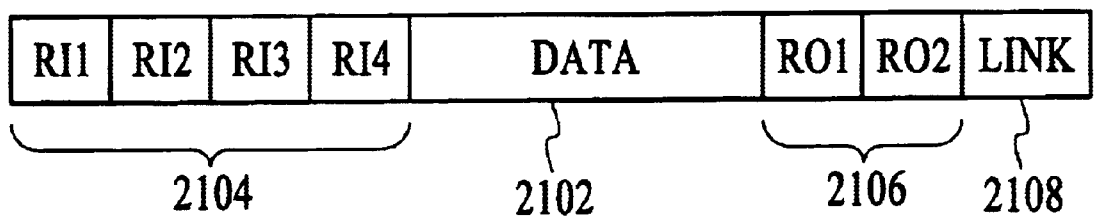
FIG. 21A illustrates a conventional structure of the sectors from a data stream.

FIG. 21A illustrates a conventional structure of the sectors from a data stream. The sectors include data sectors 2102 which contain the actual data. Preceding the data sectors 2102 are four Read In (RI) sectors 2104. Following the data sectors 2102 are two Read Out (RO) sectors 2106 and a link block 2108. The RI and RO sectors 2104–2106 are formed by the power up and power down time, respectively, required by the laser in writing the data sectors 2102. The link block 2108 is a gap between RO2 of the last data sector 2102 and RI1 of the next data sector. Thus, separating each group of data sectors 2104 are seven link sectors, comprising the RO sectors 2106, the link block 2108, and the RI sectors 2104.

Figure 21B:
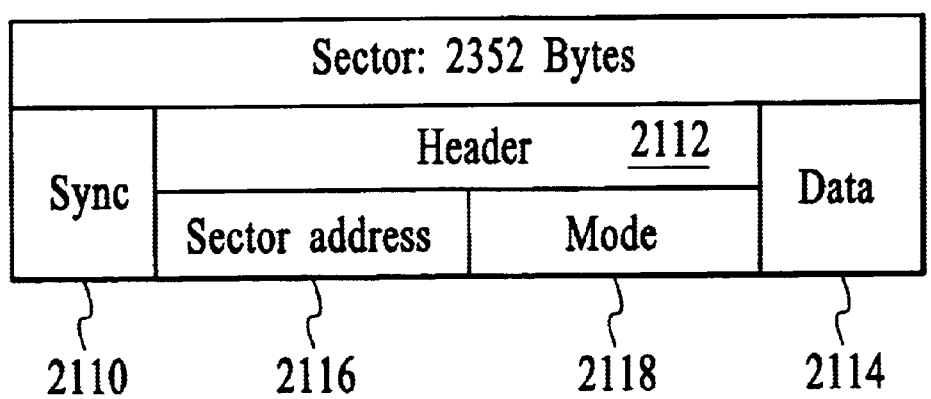
FIG. 21B illustrates the conventional structure of each sector in a data stream.

FIG. 21B illustrates the conventional structure of each sector in a data stream. Each sector contains a sync field 2110, a header field 2112, and a data field 2114. The sync field 2110 is a fixed twelve byte pattern used to separate the sectors and which can be detected by a Sector Sync Detector of the decoder to maintain synchronization with the beginning of the each sector. The header field 2112 specifies the sector address 2116 and the sector mode 2118. The sector mode 2118 has a 3-bit sub-field which indicates the block type. There are eight different types of sectors for CD-R or CD-RW media. Only the Data Block sectors are part of the actual data sectors 2102. The rest of the seven types are referred to as link sectors 2104–2108 which indicate the logical gap between the actual data sectors 2102.

Figure 22:
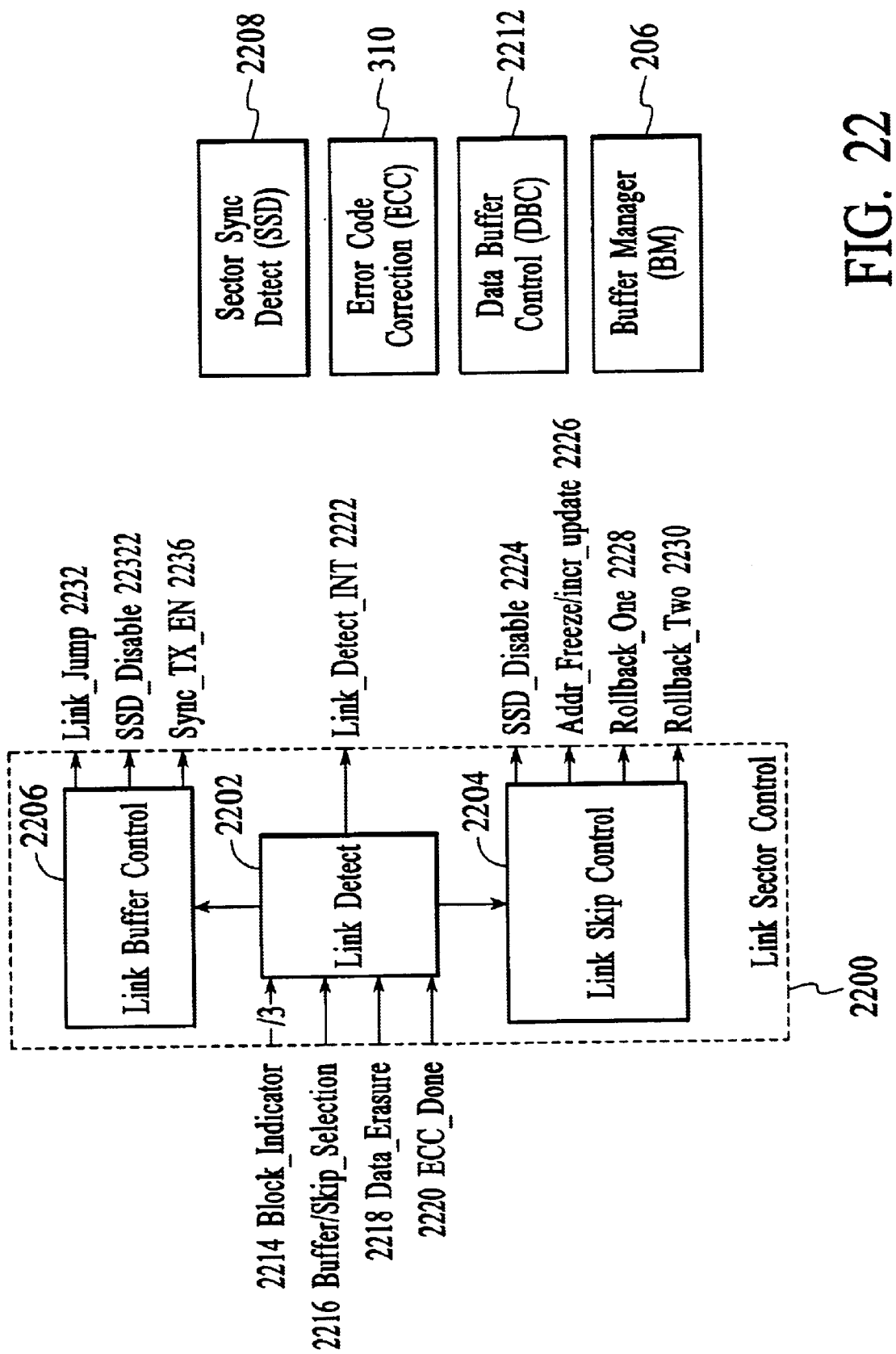
FIG. 22 is a logical block diagram of a preferred embodiment of a Link Sector Control 2200, along with other related circuit blocks, in accordance with the present invention.

FIG. 22 is a logical block diagram of a preferred embodiment of a Link Sector Control 2200, along with other related circuit blocks, in accordance with the present invention. The Link Sector Control 2200 comprises a Link Detect unit 2202, a Link Skip Control unit 2204, and a Link Buffer Control unit 2206. The circuit blocks with which the Link Sector Control 2200 interacts includes: the Sector Sync Detect 2208 (SSD), which detects the sync pattern at the beginning of each sector; the ECC 310, which performs correction of data error; the Data Buffer Control 2212 (DBC), which controls the buffering of sectors into the DRAM 208; and the Buffer Manager (BM) 206. The Link Sector Control 2200 is also described in co-pending U.S. patent application, entitled "Method And System For Handling A Data Stream From Optical Media Utilizing Automatic Link Sector Detection", Ser. No. 09/596,370, filed on May 11, 2000. Applicant hereby incorporates this patent application by reference.

The Link Detect 2202 has four inputs: a 3-bit sector block indicator 2214 (Block_Indicator), a link skip/buffer selection 2216 (Buffer/Skip_selection), a data erasure bit 2218 (Data_Erasure), and an ECC done signal 2220 (ECC_Done). The link skip/buffer selection signal 2216 indicates which method of handling a detected link sector has been selected, i.e., to skip or buffer the link sectors. The data erasure bit 2218 indicates whether or not data error is associated with the sector header. If ECC correction is performed on the sector, the ECC done signal 2220 indicates whether or not the correction has been completed.

Figure 23:
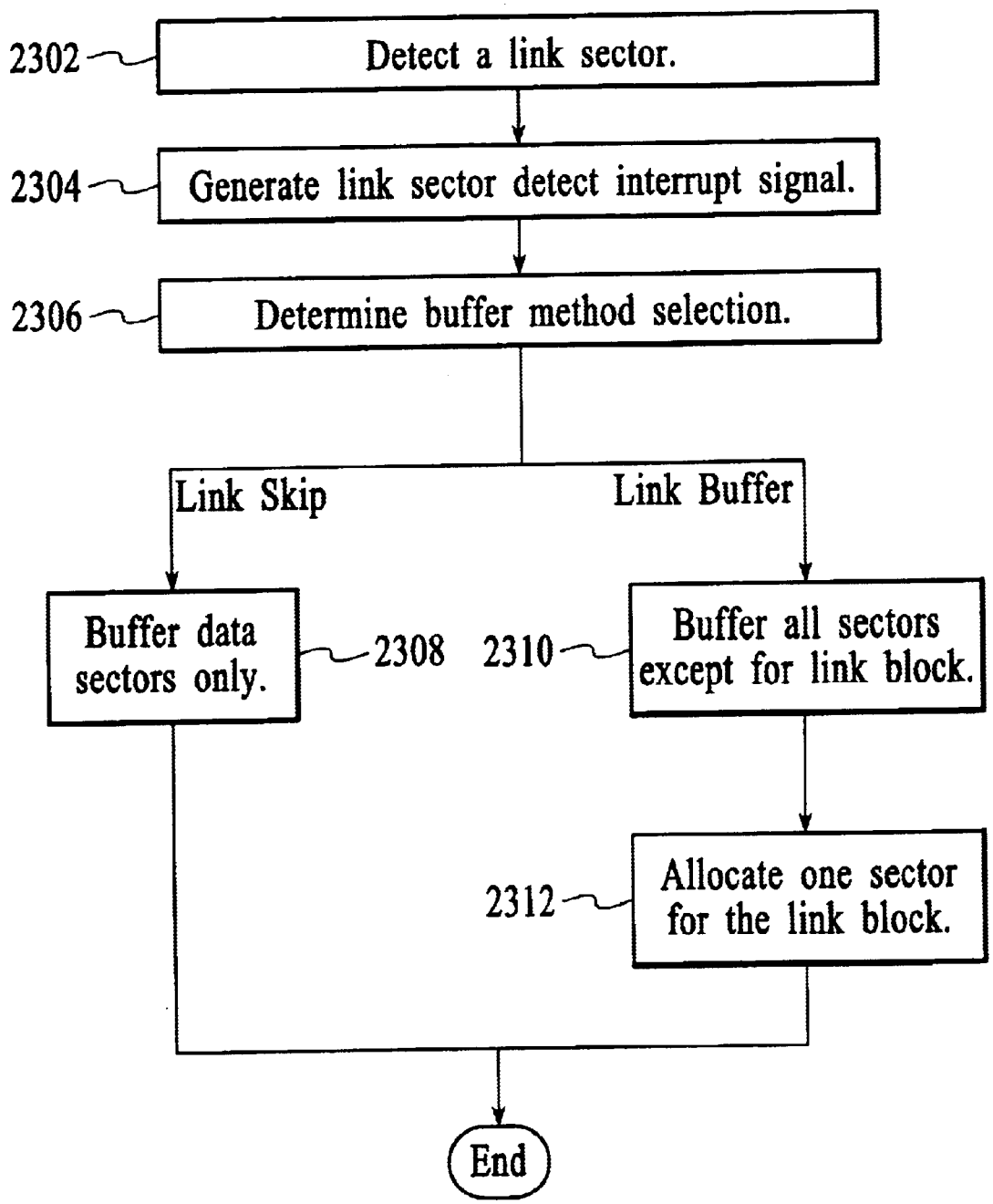
FIG. 23 illustrates a preferred embodiment of a method for automatic link detection and handling in accordance with the present invention.

FIG. 23 illustrates a preferred embodiment of a method for automatic link detection and handling in accordance with the present invention. First, the Link Detect 2202 detects a link sector, via step 2302. The first link sector after a data sector is RO1. The Link Detect 2202 is able to detect the link sector if the erasure bit 2218 is zero, which indicates no data error associated with the sector header 2112. Otherwise, the Link Detect 2202 waits for the ECC 310 to correct the header 2112 before it checks for the link sector. Once the Link Detect detects the link sector, it generates a link sector detect interrupt signal 2222 (Link_Detect-INT), via step 2304. Then, the buffer method selected is determined, via step 2306. The Link Sector Control 2200 could be configured to perform either the link skip method or the link buffer method. The link skip method only buffers the data sectors 2102, i.e., the link sectors 2104–2108 are skipped. The link buffer method buffers all the sectors except for the link block 2108, i.e., the data 2102, RI 2104, and RO 2106 sectors only are buffered. The method selected is indicated by the link skip/buffer selection signal 2216. The Link Detect 2202 enables either the Link Skip Control 2204 or the Link Buffer Control 2206 based on the link skip/buffer selection signal 2216. If the method chosen is link skip, then the data sectors 2102 only as buffered, via step 2308. If the method chosen is link buffer, then the data sectors 2102, the RO sectors 2106, and the RI sectors 2104 only are buffered, via step 2310, and one sector is allocated for the link block 2108 in the buffer, via step 2312.

Figure 24:
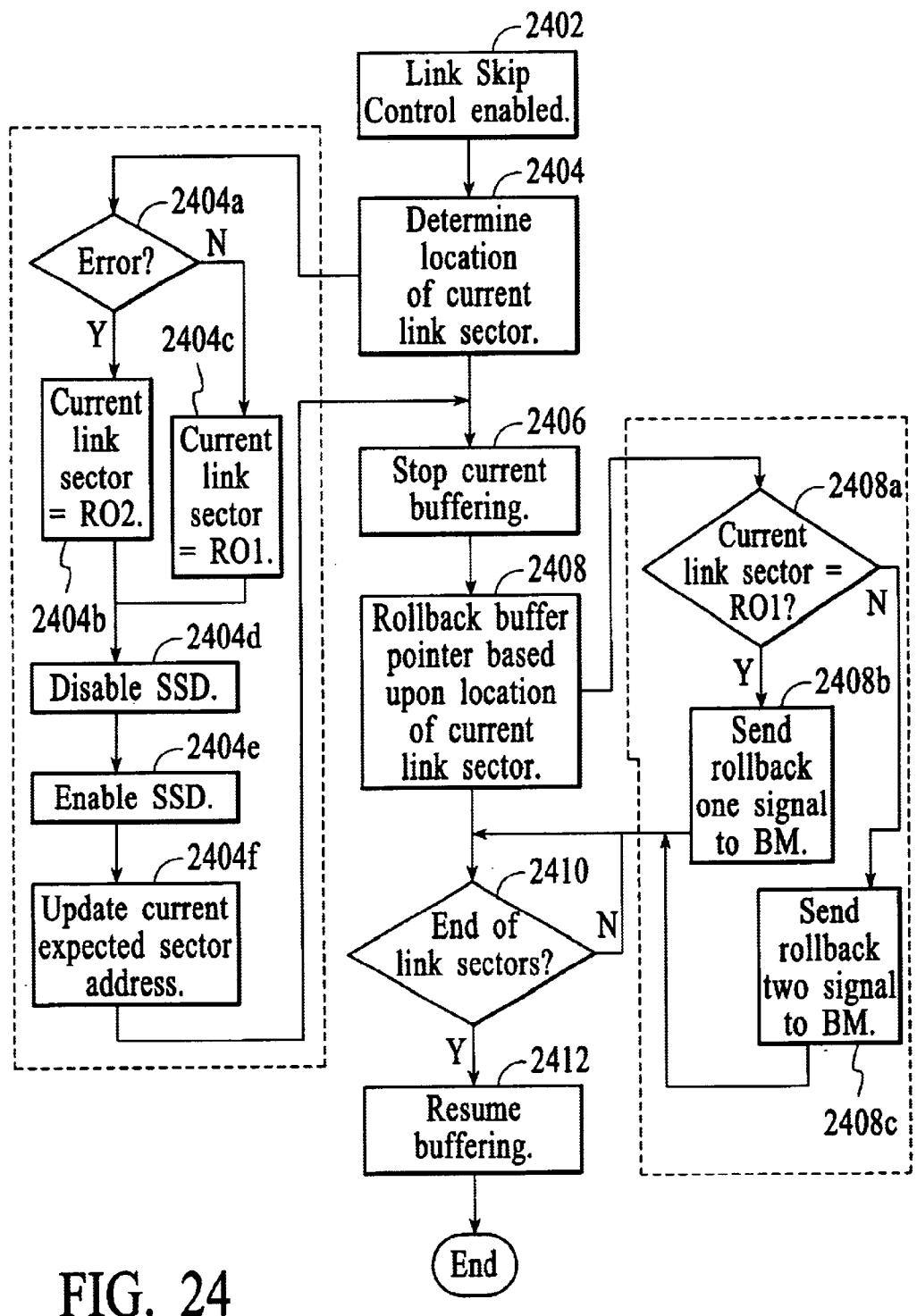
FIG. 24 is a flowchart illustrating a preferred embodiment of the method in accordance with the present invention when the link skip method has been selected.

FIG. 24 is a flowchart illustrating a preferred embodiment of the method in accordance with the present invention when the link skip method has been selected. First, the Link Skip Control 2204 is enabled by the Link Detect 2202, via step 2402. The Link Skip Control 2204 determines the location of the current link sector, via step 2404. In the preferred embodiment, if it is determined that there is no error and no ECC correction performed, via step 2404a, then the current sector is RO1, via step 2404c. The current sector is RO2 if there is error and ECC correction is performed, via step 2404b. This is due to the timing difference between the processing of a sector with no error and a sector with error.

Figure 25:
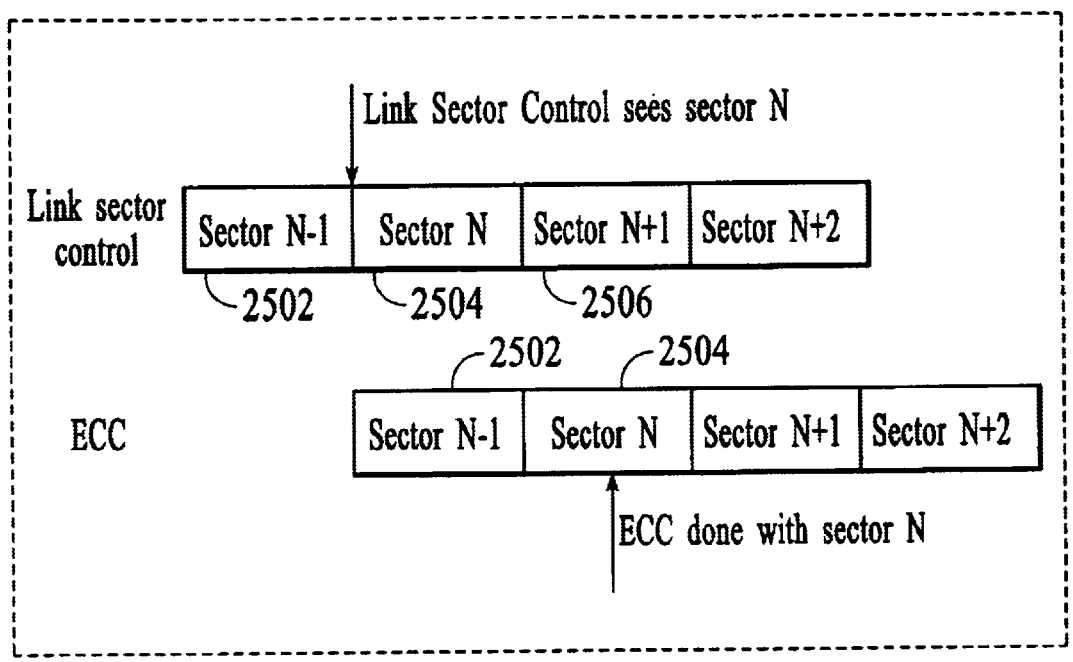
FIG. 25 illustrates the timing relationship between the Link Sector Control and the ECC.

FIG. 25 illustrates the timing relationship between the Link Sector Control 2200 and the ECC 310. Once the Link Detect 2202 sees the link sector 2502, it continues by processing the second sector 2504. If the link sector 2502 contains an error, then ECC correction is performed. The ECC correction of link sector 2502 occurs while the Link Detect 2202 is processing the second sector 2504. Similarly, if sector 2504 has an error, then the ECC 310 is done with correcting sector 2504, the Link Sector Control 2200 is processing the third sector 2506. Thus, when there is no error, then the current link sector is RO1. When there is an error and ECC correction is performed, then the current link sector is one sector later, or is RO2.

Returning to FIG. 24, once the Link Skip Control 2204 determines the current link sector location, it disables the SSD 2208, via step 2404d at the beginning of the link block 2108 and enables the SDD 2208 again shortly after, via step 2404e. Since there may be a sync pattern in the link block 2108, the SSD 2208 is disabled at the beginning of the link block 2108, and then enabled shortly thereafter, to prevent the SSD 2208 from.erroneously detecting the link block 2108 as RI1 due to the sync pattern. In the preferred embodiment, in addition to directing the data flow, the Link Skip Control 2204 sends a sector address update signal 2226 (Addr_Freeze/Incr_update) to Header Search and Validation (not shown). The Header Search and Validation updates the current expected sector address for the data block 2102 for the current sector location. An address freeze mode update is sent if the link sector address freeze mode is chosen. Otherwise, an address incremental mode update is sent. If the current link sector is RO1, then it keeps the current expected sector address in the address freeze mode, and increases the current expected sector address by seven in the address incremental mode. If the current link sector is RO2, then it uses the previous expected sector address for the current expected sector address in the address freeze mode, and increases the previous expected sector address by seven in the address incremental mode.

Next, the Link Skip Control 2204 stops the current buffering, via step 2406, by sending a buffering disable signal (not shown) to the DBC 2212. At the same time, the Link Skip Control 2204 also sends a rollback signal to the Buffer Manager 206 based upon the location of the current link sector, via step 2408. If the current sector location is determined to be RO1, via step 2408a, then a rollback one signal 2228 (Rollback_One) is sent, via step 2408b, otherwise a rollback two signal (Rollback_Two) is sent, via step 2408c. Based on the rollback signal, the Buffer Manager 206 can discard either the RO1 sector data buffered in the DRAM 208 or both the RO1 and RO2 sector data.

Figure 26:
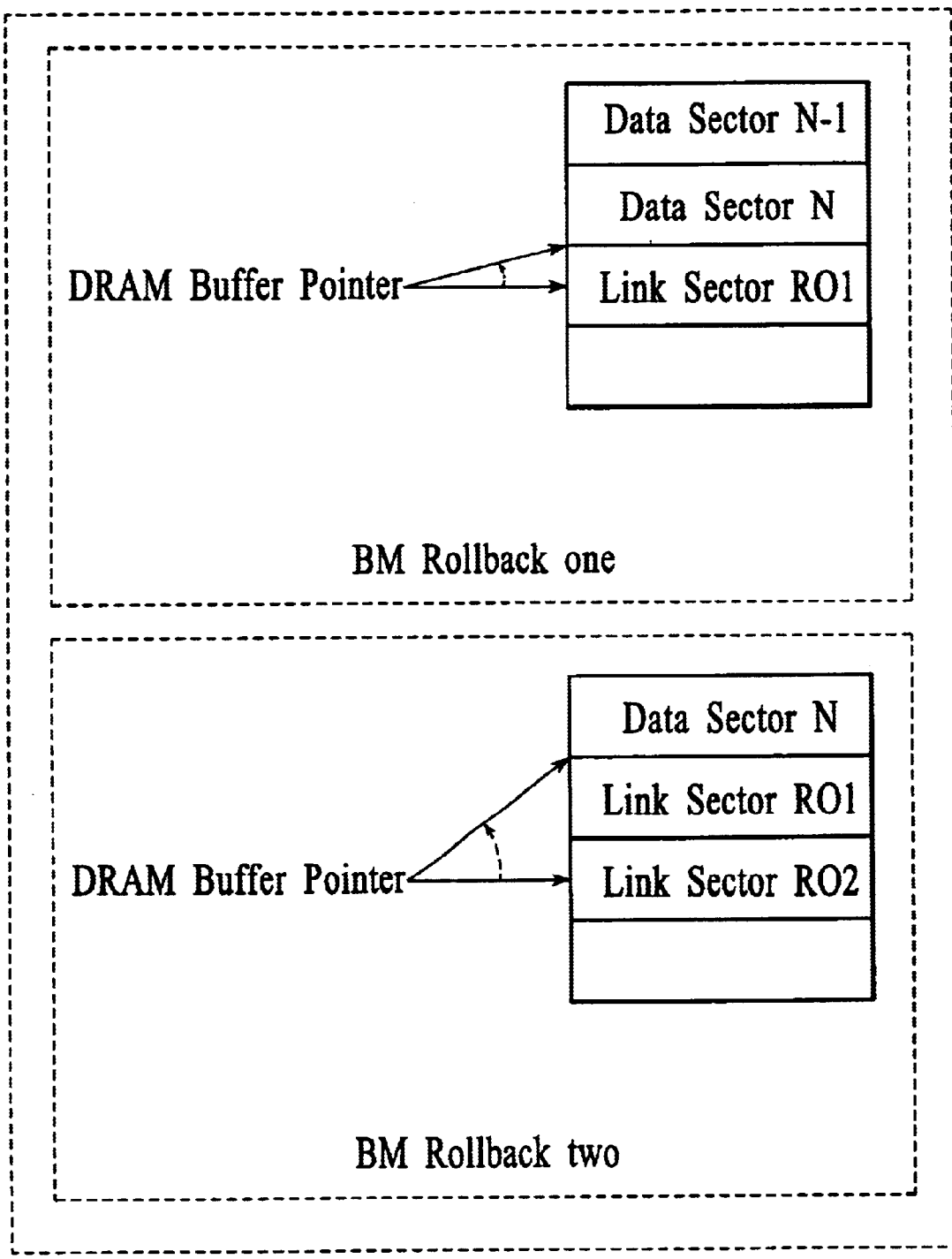
FIG. 26 illustrates the rollback process in accordance with the present invention.

FIG. 26 illustrates the rollback process in accordance with the present invention. When a rollback one signal 2228 is sent, the DRAM buffer pointer is rolled back one sector to the beginning of the RO1 location, as illustrated in the top diagram. When a rollback two signal 2230 is sent, the DRAM buffer pointer is rolled back two sectors to the beginning of the RO1 location, as illustrated in the bottom diagram.

Once the rollback is performed, via step 2408, the Link Skip Control 2204 continues to monitor the current sector location, until it finds sector RI4, the end of the link sectors, via step 2410. It then enables the DBC 2212 to resume buffering at the end of sector RI4, via step 2412, when the data block sectors 2102 begin. Since the DRAM buffer pointer has been rolled back, the RO1 and/or RO2 is written over by the buffered data block sectors 2102.

Figure 27:
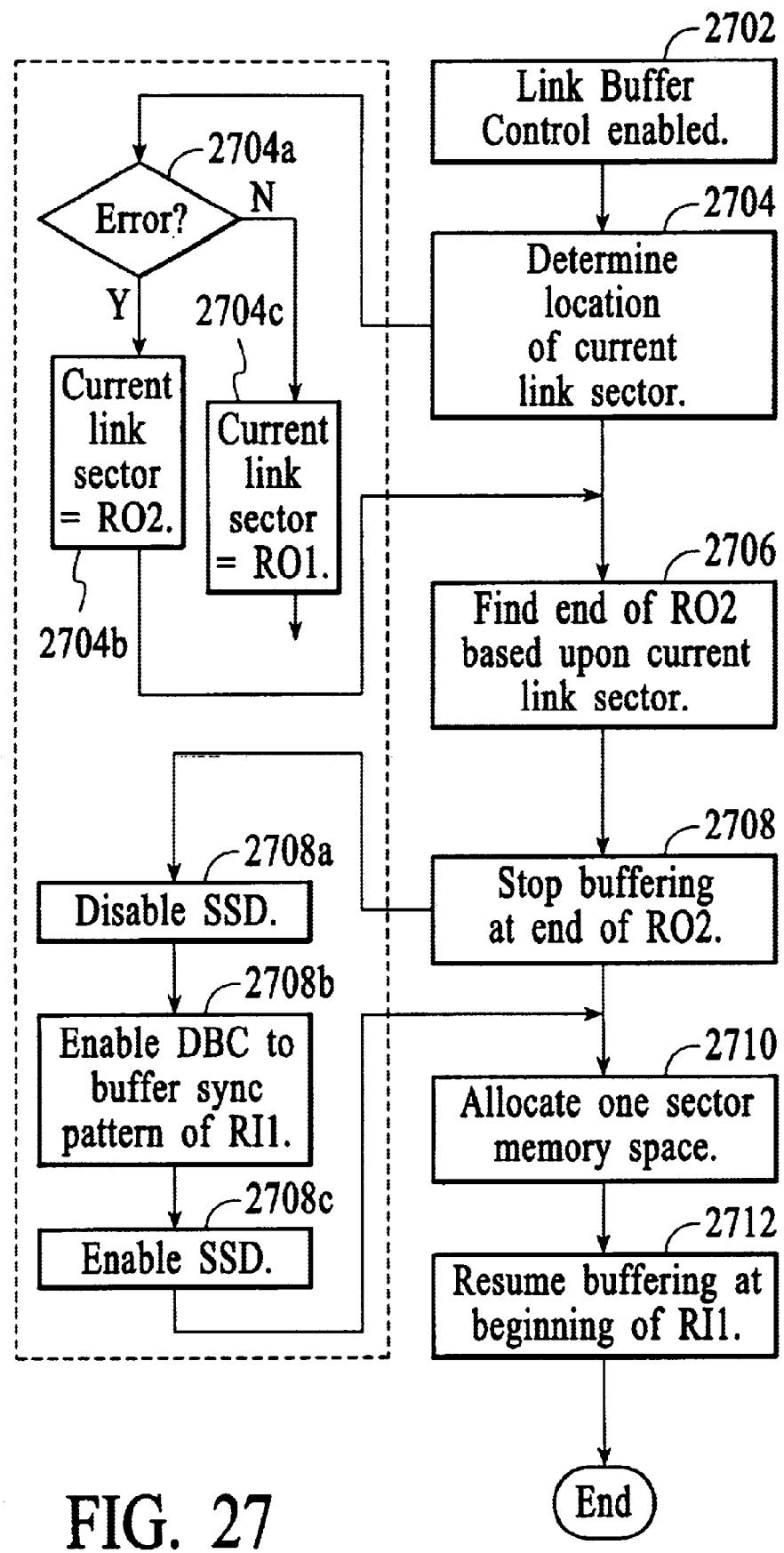
FIG. 27 is a flowchart illustrating a preferred embodiment of the method in accordance with the present invention when the link buffer method has been selected.

FIG. 27 is a flowchart illustrating a preferred embodiment of the method in accordance with the present invention when the link buffer method has been selected. First, the Link Buffer Control 2206 is enabled by the Link Detect 2202, via step 2702. As with the Link Skip Control 2204, the Link Buffer Control 2206 first determines the location of the current link sector, via step 2704. If the sector is determined to have error, via step 2704a, the current link sector location is RO2, via step 2704b. If the sector does not have error, i.e., the erasure signal 2218 is a zero, then the current sector location is RO1, via step 2704c. Based on this location information, the Link Buffer Control 2206 finds the end of the sector RO2, via step 2706. The buffering is then stopped at the end of sector RO2, via step 2708. In the preferred embodiment, the SSD 2208 is also disabled after sector RO2, via step 2708a, and the DBC 2212 is enabled by the sync transfer enable signal 2236 (sync_TX_EN) to buffer the sync pattern of sector RI1, via step 2708b. After the sync pattern is sent, the Link Buffer Control 2206 enables the SSD again, via step 2708c.

Figure 28:
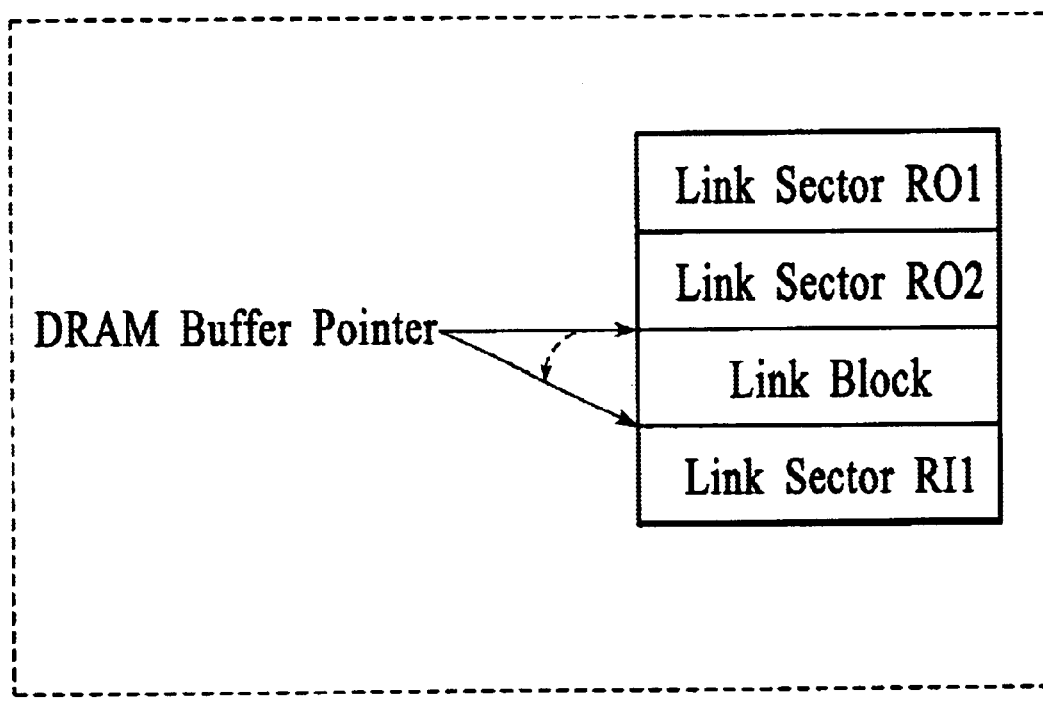
FIG. 28 illustrates the link jump process in accordance with the present invention.

Next, the Link Buffer Control 2206 sends a link jump signal 2232 (Link_Jump) to the BM 206 that will allocate one sector memory space for the link block 2108, via step 2710. FIG. 28 illustrates the link jump process in accordance with the present invention. When the link jump signal 2232 is sent, the BM 306 sets the DRAM buffer pointer to the next sector location, as illustrated.

Returning to FIG. 26, the Link Buffer Control 2206 then resumes the buffering at the beginning of RI1, via step 2712. Since the fixed sync pattern of RI1 is already buffered, via step 2708b, the DBC 2212 is enabled as soon as this sync pattern is detected. Since the link sectors 2104–2108 are buffered by the Link Buffer Control 2206, the incremental mode is used, and the current expected sector address is incrementally increased.

Thus, the preferred embodiment of the present invention provides a hardware approach to link sector detection and handling. Instead of passing the data to a system software prior to link sector detection, the method and system in accordance with the present invention performs the link sector detection in the controller hardware. When the controller detects the link sectors, it automatically either skips or buffers the link sectors depending upon the configuration of the controller. By performing the link sector detection in hardware, significant processing time is saved.

Embedded Dram

As each piece of the data is processed as described above, the buffer manager 206 manages the data flow from the decoding/encoding engine 210 to the embedded DRAM 208 for storage. Once enough of the data has been stored in the embedded DRAM 208, the host 202 is notified. The host 202 may then begin collecting the data from the embedded DRAM 208.

Servo/Recording Processor When Writing To Disc

To write data to disc 222 (FIG. 2), the host 202 sends the data to be written to the host interface 204 and sends the write command to the external microcontroller. The buffer manager 206 directs it to the embedded DRAM 208 for storage. When enough of the data is stored, the data is directed to the encoding/decoding engine 210 for the encoding process. Once the microcontroller has determined the required parameters for recording, such as the recording format and the number of sections to be used for the data, it will load a set of recording instructions into a buffer of the encoding engine formatter 317 (FIG. 3). When enabled, the formatter 317 starts fetching the instructions from the buffer area and loads them into the formatter's current instruction for execution. The formatter 317 decodes the instruction and starts the encoding data flow accordingly for the specified number of sectors. C3, C2, and C1 encoding processes, in this order, are then performed by the C3 encoder 316, C2 encoder 315, and C1 encoder 314, respectively, as controlled by the encoding engine formatter 317. Upon encoding the current instruction's last sector, the formatter 317 will fetch in the next instruction to encode the subsequent set of sectors. This process will continue until the sequencer detects a stop bit in the instruction.

The encoded data then flows to the write control 324 of the serve/recording processor 214. The write strategies 216 are part of the write control 324. The write control 324 performs EFM encoding, NRZI conversion, and generate the actual mark and space patterns for writing to the disc 222 via the external read/write channel 220. In conjunction with this write data flow, the Absolute Time in Pregroove (ATIP) processor 325 decodes the ATIP data already on the disc 222 to provide the physical address of the data so as to control the laser burns and servo tracking to the desired writing locations. The data's physical address is then stored in a table on the disc 222 along with its logical address. The table exists so that when the data is to be read, the controller will know the location of the data. ATIP is a standard in the art and will not be further described here.

To control the writing of the data, the processors 318–320 are controlled by the digital servo control 322, which is in turn controlled by the RISC processor 323. The RISC processor 323 controls the digital servo control 322 by executing program instructions based upon information provided by the write control 324 and the ATIP processor 325. The main program instructions are stored in the embedded DRAM 208. These instructions are transferred and stored in the Instruction SRAM 312 (ISAM) as needed. The data SRAM 313 (DSRAM) is used by the RISC processor 323 as intermediate storage. By providing program instructions to the RISC processor 323 in this way, a large SRAM is not necessary, reducing the cost of manufacturing the controller 200.

Mark and Space Adjustment

In the preferred embodiment, the controller 200 uses a write control logic with programmable parameters to control both the power level and time duration of each mark. The programmable parameters provide greater write control, allowing for the writing of data at high speeds without compromising reliability.

Figure 29:
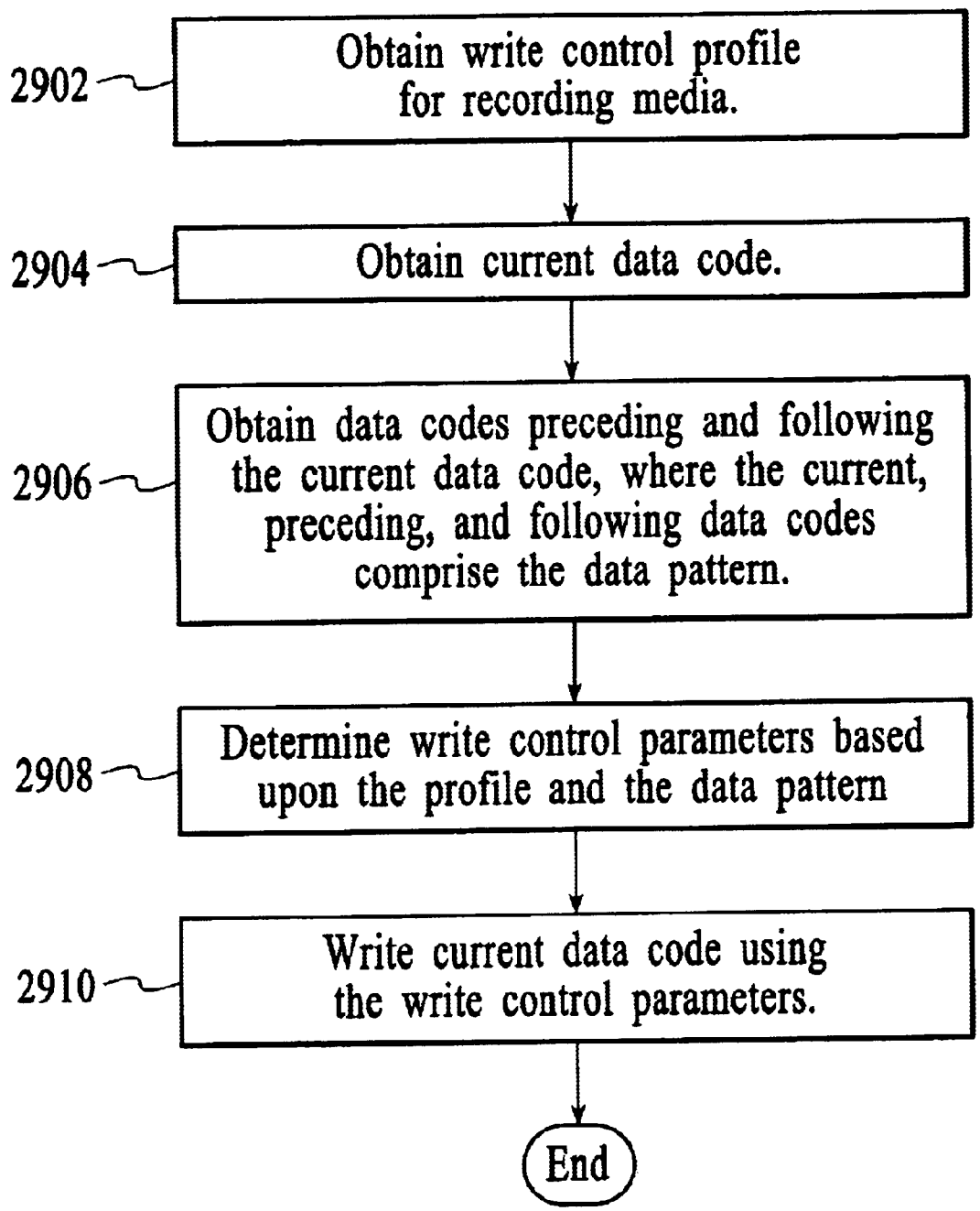
FIG. 29 is a flow chart illustrating a preferred embodiment of a method for mark and space adjustment in accordance with the present invention.

FIG. 29 is a flow chart illustrating a preferred embodiment of a method for mark and space adjustment in accordance with the present invention. First, a write control profile for the recording media is obtained, via step 2902. Next, the current data code is obtained, via step 2904. Then the data codes preceding and following the current data code is obtained, via step 2906. The current, preceding, and following data codes together form the data "pattern". This pattern is important since the behavior of the recording media when the current data code is written is affected by the data codes which has been written before it and by the data code to be written after it. Next, the write control parameters for the current data code is determined based upon the profile and the data pattern, via step 2908. In the preferred embodiment, the write control parameters control the power level and time duration in the writing of each mark for the data codes. These parameters are described in more detail below. Then, the current data code is written onto the media using the write control parameters, via step 2910. This method for mark and space adjustment is also described in co-pending U.S. patent application, entitled "Method And System For Mark And Space Adjustment To Perform Reliable Optical Recording At High Speeds", Ser. No. 09/542,627, filed on Apr. 4, 2000. Applicant hereby incorporates this patent application by reference.

In the preferred embodiment, the write control parameters are programmable to be different for each mark. The profile is also programmable. After writing a number of data codes, the write control logic will read the newly written data to determine the quality of the data. The profile can then be adjusted so that a high quality is maintained. This is important since the behavior of the recording media changes as the temperature of the drive, the temperature of the room, the humidity, etc. changes. This adjusted profile can be saved for future use. The adjusted profile then affects the write control parameters for subsequent writings. Thus, the write control logic in accordance with the present invention is not only adaptable to the recording media and the data pattern, but also to environmental factors as well.

Figure 30:
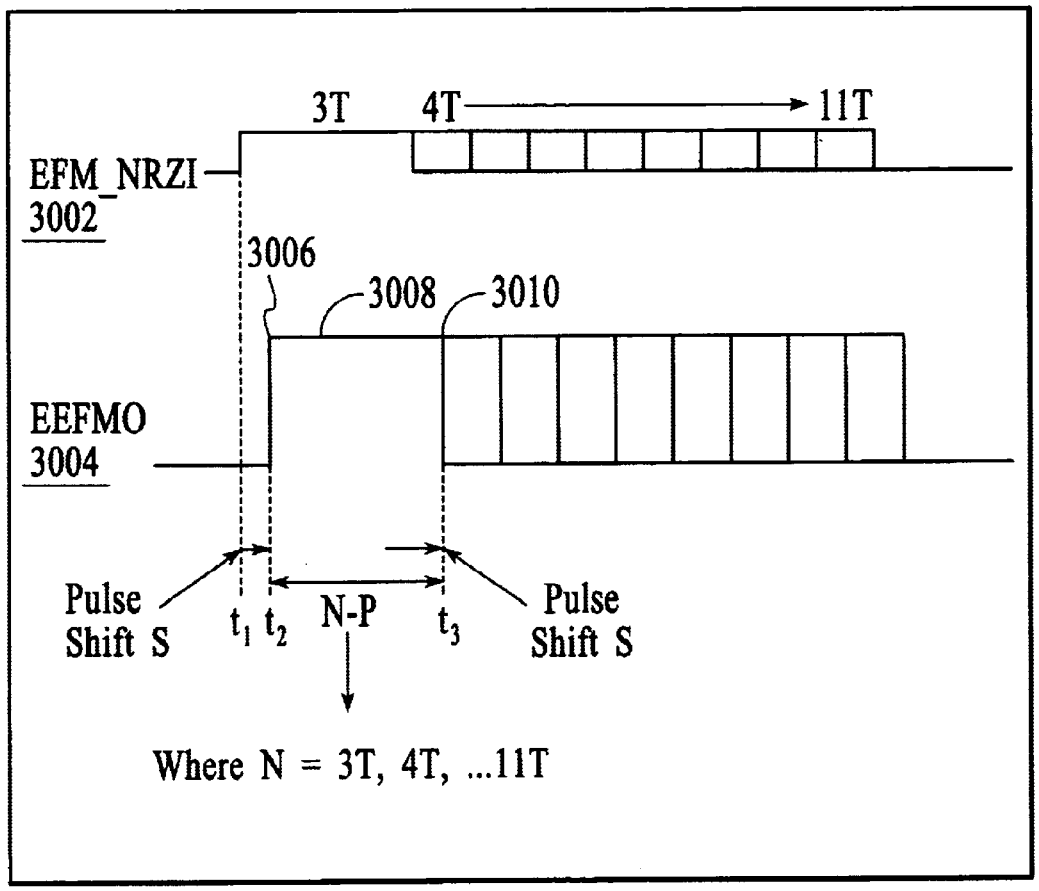
FIG. 30 is a diagram illustrating the use of the write control logic for a length mode recording method in accordance with the present invention.
Figure 31:
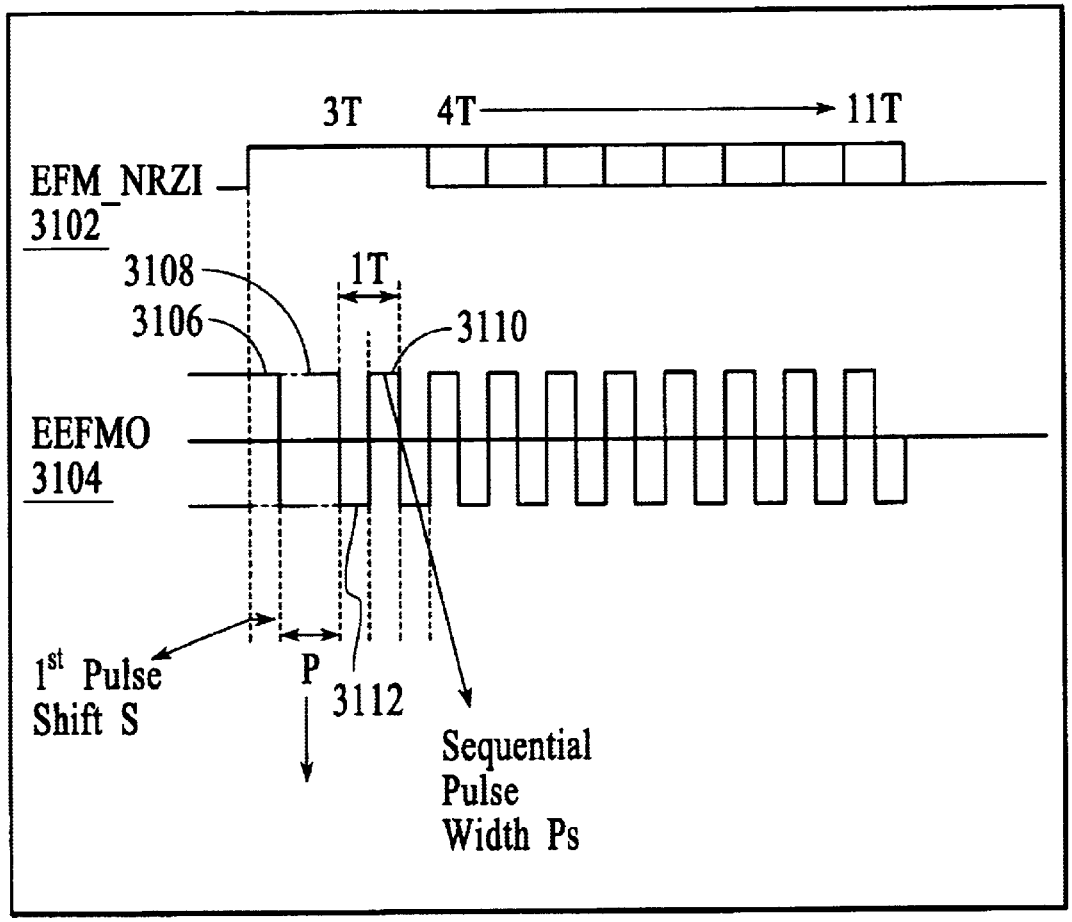
FIG. 31 is a diagram illustrating the use of the write control logic for a pulse mode recording method in accordance with the present invention.

FIGS. 30 and 31 are diagrams illustrating the application of the write control logic in accordance with the present invention in two recording methods. Currently in the art, the two recording methods primarily used are length mode recording and pulse mode recording. The length mode recording method is typically used with CD-Rewritable media. The pulse mode recording method is typically used with CD-Read/Write media. Both methods are well known in the art.

FIG. 30 is a diagram illustrating the use of the write control logic for a length mode recording method in accordance with the present invention. In the diagram, the NRZI write control signal 3002 is illustrated at the top of the diagram. Assume that a current data code of 3T is to be written, and that the write control logic has obtained the profile for the recording media, via step 2902. The write control logic obtains the current data code, via step 2904, and the preceding and following data codes, via step 2906, to determine the data pattern. The write control parameters are determined based upon the profile of the recording media and the data pattern, via step 2908. The write control parameters change the NRZI write control signal 3002 to the adjusted write control signal 3004. The NRZI write control signal 3002 goes high at time $t_1$ to indicate the beginning of the writing. At a rising edge 3006 of a pulse 3008 of the adjusted write control signal 3004, the actual writing of the current data code begins. The pulse width is adjusted based on a pulse width parameter, P. The adjusted pulse width is represented by "N-P", where N=3T, 4T, . . . 11T. The pulse 3008 may also be shifted by S, where S is the pulse shift parameter. Both P and S are determined during step 2908. In this example, the P and S parameters together causes the rising edge 3006 of pulse 3008 to occur at time $t_2$, although the rising edge of the NRZI write control signal 3002 begins at $t_1$. By the same token, the P and S parameters together causes the falling edge 3010 of pulse 3008 to occur at time $t_4$, although the rising edge of the NRZI write control signal 3002 falls at $t_3$. The 3T data code may then be written according to the adjusted write control signal 3004. For each of the adjustable timing parameters, P and S, a corresponding power level can be specified and programmed prior to the writing of the data. Like the timing parameters, the power level depends upon the profile of the recording media.

FIG. 31 is a diagram illustrating the use of the write control logic for a pulse mode recording method in accordance with the present invention. In the diagram, the NRZI write control signal 3102 is illustrated at the top of the diagram. Assume again that a current data code of 3T is to be written, and that the write control logic has obtained the profile for the recording media, via step 2902. The write control logic obtains the current data code, via step 2904, and the preceding and following data codes, via step 2906, to determine the data pattern. The write control parameters are determined based upon the profile of the recording media and the data pattern, via step 2908. The write control parameters change the NRZI write control signal 3102 to the adjusted write control signal 3104. At a rising edge 3106 of the first pulse 3108 of the adjusted write control signal 3104, the writing of the current data code begins. The width of the first pulse 3108 is determined by the programmable pulse width parameter, P, determined during step 2908. The pulse 3108 may also be shifted by the pulse width parameter, S, also determined during step 2908. The subsequent high pulse width 3110 is determined by the programmable high pulse width parameter, Ps, and the low pulse width 3112 is determined by the programmable low pulse width parameter, 1-Ps, both determined during step 2908. A high pulse and a low pulse together represents 1T. The 3T data code may then be written according to the adjusted write control signal 3104. As with the length mode recording method, for each of the adjustable timing parameters above, a corresponding power level can be specified and programmed prior to the writing of the data. Like the timing parameters, the power level depends upon the profile of the recording media.

By adjusting the write control signals in the manner illustrated in FIGS. 30 and 31, better control of the writing of data is accomplished. The writing of the data code is more precise and thus can be properly recognized when read.

The preferred embodiment may also use multiple levels of time adjustment for each type of mark. In the preferred embodiment, a dual level timing adjustment technique is provided. The first level provides coarse timing adjustments using a programmable clock with a cycle less than T and parameters to control the power level and time duration of each mark. The second level provides fine timing adjustments using time delay techniques. By using the first and second levels of adjustments together, fine adjustments are provided without the need for expensive fast clocks. The method and system in accordance with the present invention thus allows for the writing of data at high speeds without compromising data reliability and without increasing the cost of manufacturing the optical drive.

Figure 32:
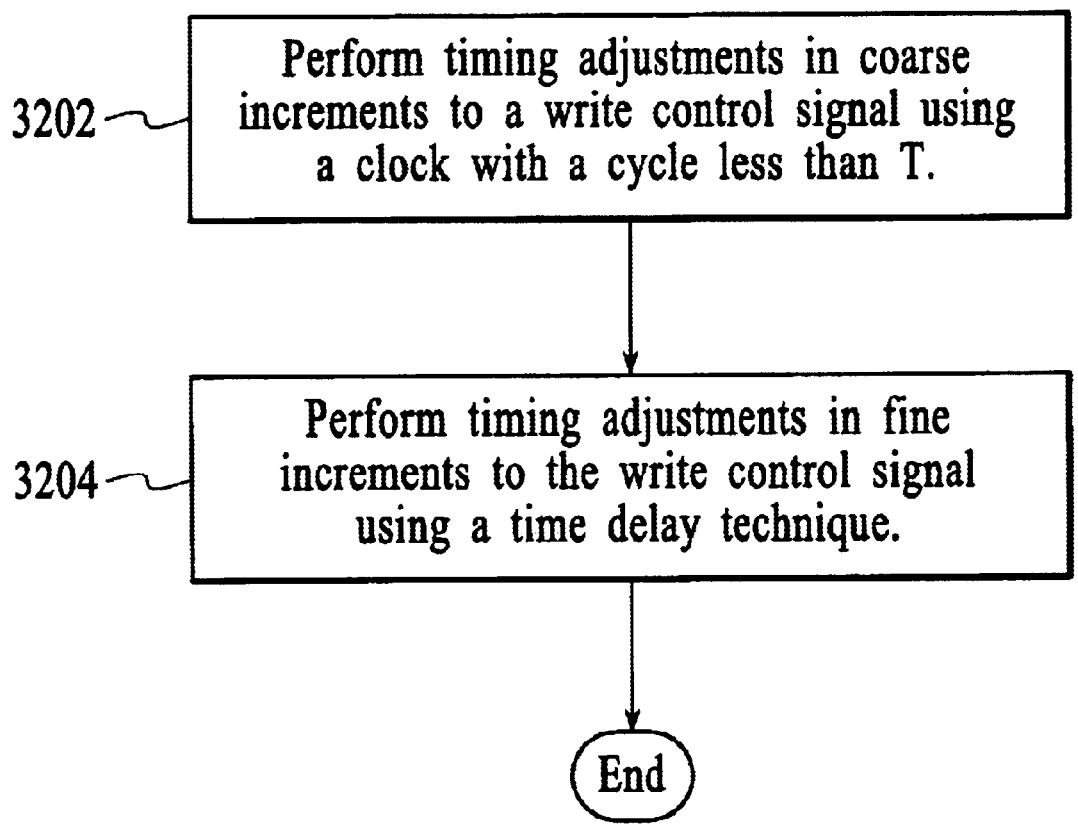
FIG. 32 is a flow chart illustrating a preferred embodiment of a method for providing timing adjustments in accordance with the present invention.

FIG. 32 is a flow chart illustrating a preferred embodiment of a method for providing timing adjustments in accordance with the present invention. First, timing adjustments in coarse increments are performed to a write control signal using a programmable clock with a cycle less than T, via step 3202. The value of the clock cycle is programmable to any fractional value of T. In the preferred embodiment, the coarse increments are organized in 0.25T steps, where each step is accurately controlled using the 0.25T clock. These coarse adjustment may be made using the steps illustrated in FIG. 29. The preferred embodiment uses programmable write control parameters to perform the coarse adjustments. The programmable write control parameters are described further below. Next, timing adjustments in fine increments are performed to the write control signal using a time delay technique, via step 3204. In the preferred embodiment, the fine increments are provided by a 2-input NAND gate delay, ranging from 0 to 61 gates, where each delay stage corresponds to two gates. This delay is added to the coarse timing adjustments to fine tune each edge, leading and trailing, of the pulses of the write control signal. Thus, the coarse timing adjustments provide a first level of adjustments while the fine timing adjustments provide a second level of adjustments. This method for providing timing adjustments is also described in co-pending U.S. patent application, entitled "Method And System For Providing Timing Adjustment To Perform Reliable Optical Recording At High Speeds", Ser. No. 09/560,877, filed on Apr. 28, 2000. Applicant hereby incorporates this patent application by reference.

With the present invention, only the first level, coarse timing adjustments require a clock with a cycle less than T. The fine timing adjustments do not. This clock only need to be fast enough to support the coarse increments and need not be so fast as to support the fine increments. This is in contrast to the conventional method where a clock with a cycle equal to the length of the fine increments would be required. This fast clock is significantly more expensive than the clock used for the coarse increments. Thus, with the method and system in accordance with the present invention, the need for an expensive fast clock is avoided while still accomplishing the analogous level of timing adjustments to the write control signal. Also, the cycle of the clock for the coarse timing adjustments is programmable, thus adding flexibility.

FIG. 33 is a logical circuit diagram illustrating a preferred embodiment for performing coarse and fine timing adjustments of the write control logic in accordance with the present invention. The coarse adjustments are based upon the cycle of the clock signal (CLK). The counter 3302 counts the number of clock cycles which passes, so that the number of T's that has passed is tracked. The state 3304 provides the adjustments according to the write control parameters. In the preferred embodiment, the state is programmed to adjust in 0.25T increments. The signals, EFM_OR_EN and XEFM_AND_EN, is output as shown. Any fine adjustments are provided by the DELAY_OUT signal. The amount of the delay in the fine adjustments is controlled by the enable signals EN [0:15]. If no fine adjustment is desired, then only the EN[0] signal is enabled, and the DELAY_OUT signal is not affected by any NAND gates. If one increment is desired, then the EN[1] signal is enabled, directing the DELAY_OUT signal to pass through one stage of 2-NAND gates 3306. If two increments is desired, then the. EN[2] signal is enabled, directing the DELAY_OUT signal to pass through two stages of 2-NAND gates 3306 and 3308. In the preferred embodiment, up to fifteen stages of 2-NAND gates are possible, but any number of NAND gates may be used without departing from the spirit and scope of the present invention. The resulting DELAY_OUT signal is then logically AND'ed with the XEFM_AND_EN signal and logically OR'ed with the EFM_OR_EN signal from the coarse adjustment. The final signals, XEEFMO and EEFMO, control the leading and falling edges of the mark and is output with both the coarse adjustments and the fine adjustments.

Figure 34:
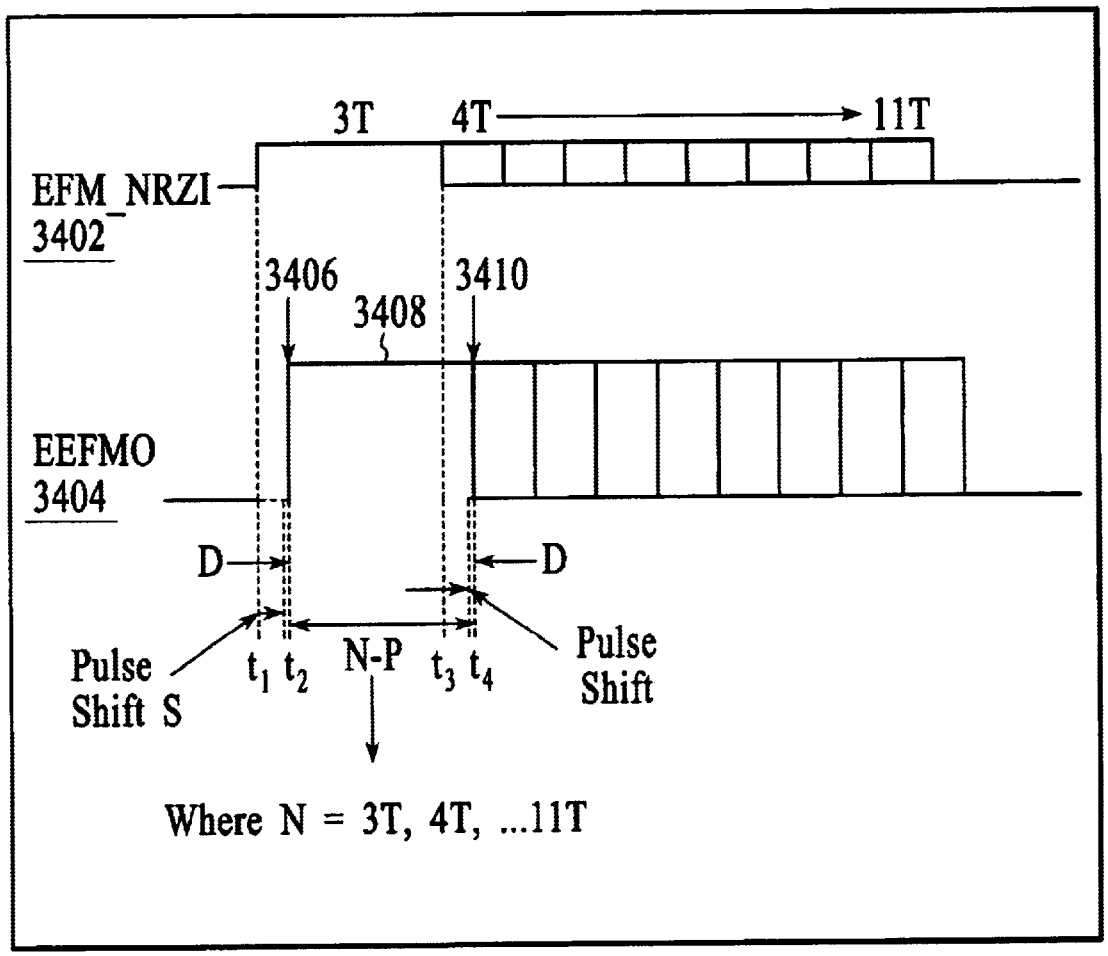
FIG. 34 is a diagram illustrating the use of the write control logic for a length mode recording method in accordance with the present invention.
Figure 35:
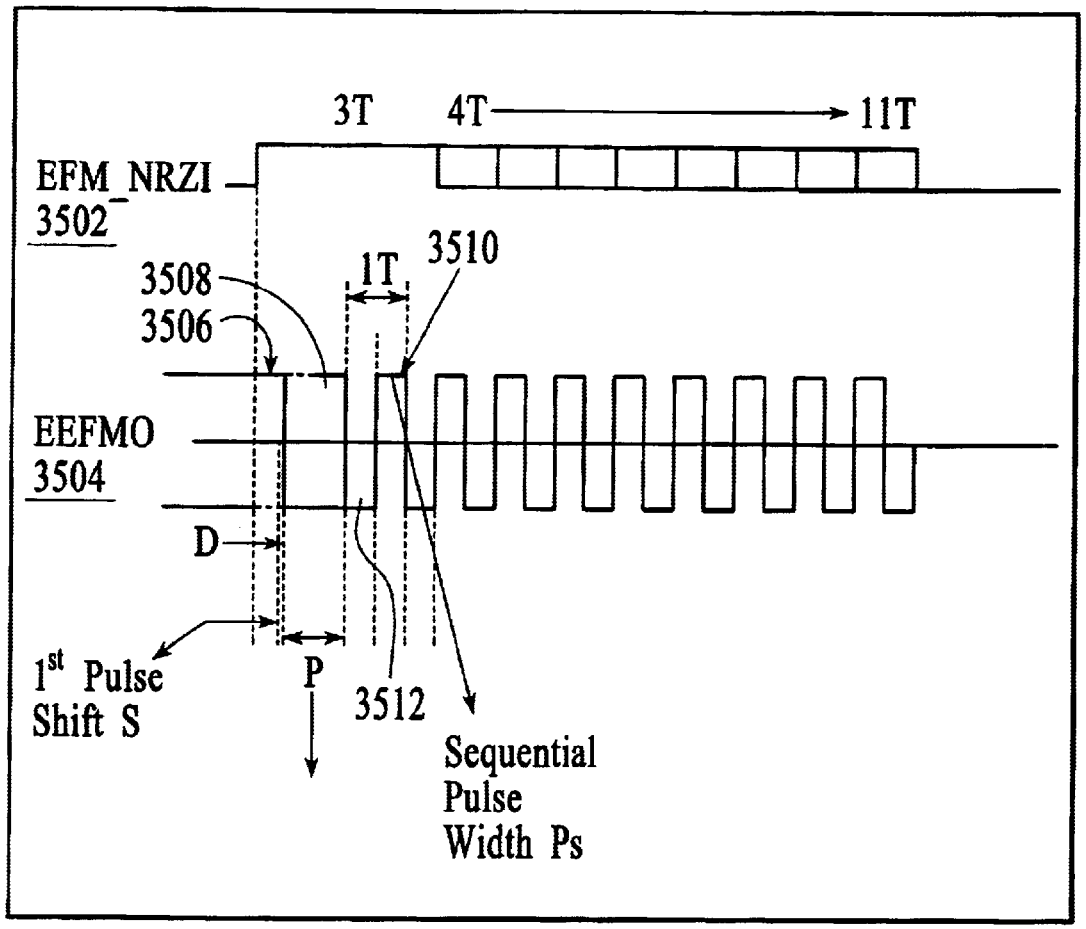
FIG. 35 is a diagram illustrating the use of the write control logic for a pulse mode recording method in accordance with the present invention.

FIGS. 34 and 35 are diagrams illustrating the application of the write control logic in accordance with the present invention in two recording methods. Currently in the art, the two recording methods primarily used are length mode recording and pulse mode recording. The length mode recording method is typically used with CD-Recordable, Write Once media. The pulse mode recording method is typically used with CD-Read/Write media. Both methods are well known in the art.

FIG. 34 is a diagram illustrating the use of the write control logic for a length mode recording method in accordance with the present invention. In the diagram, the NRZI write control signal 3402 is illustrated at the top of the diagram. Assume that a current data code of 3T is to be written. Based upon the coarse and fine timing adjustments, the NRZI write control signal 3402 is changed to the adjusted write control signal 3404.

In the coarse timing adjustments, via step 3202, the width of the pulse 3408 is adjusted based on a pulse width parameter, P. The adjusted pulse width is represented by "N-P", where N=3T, 4T, . . . 11T. The pulse 3408 may also be shifted by S, where S is the pulse shift parameter.

In the fine timing adjustments, via step 3204, the rising edge 3406 and falling edge 3410 may be further shifted by D, using a time delay technique, such as that illustrated in FIG. 33. In this example, the P and S parameters together cause the rising edge 3406 of pulse 3408 to occur at time $t_2$, although the rising edge of the NRZI write control signal 3402 begins at $t_1$. By the same token, the P and S parameters together cause the trailing edge 3410 of pulse 3408 to occur at time $t_4$, although the rising edge of the NRZI write control signal 3402 falls at $t_3$. The 3T data code may then be written according to the time adjusted write control signal 3404. For each of the adjustable timing parameters above, a corresponding power level can be specified and programmed prior to the writing of the data. Like the timing parameters, the power level depends upon the profile of the recording media.

FIG. 35 is a diagram illustrating the use of the write control logic for a pulse mode recording method in accordance with the present invention. In the diagram, the NRZI write control signal 3502 is illustrated at the top of the diagram. Assume again that a current data code of 3T is to be written. Based upon the coarse and fine timing adjustments, the NRZI write control signal 3502 is changed to the adjusted write control signal 3504.

In the coarse timing adjustments, via step 3202, the width of the first pulse 3508 is determined by the programmable pulse width parameter, P. The pulse 3508 may also be shifted by the pulse width parameter, S. The subsequent high pulse width 3510 is determined by the programmable high pulse width parameter, Ps, and the low pulse width 3512 is determined by the programmable low pulse width parameter, 1-Ps. A high pulse and a low pulse together represent 1T.

In the fine timing adjustments, via step 3204, the rising edge 3506 and falling edge 3510 of the first pulse 3508 may be further shifted by D, using a time delay technique, such as that illustrated in FIG. 33. The 3T data code may then be written according to the time adjusted write control signal 3504. For each of the adjustable timing parameters above, a corresponding power level can be specified and programmed prior to the writing of the data. Like the timing parameters, the power level depends upon the profile of the recording media.

Thus, the preferred embodiment of the present invention provides a write control logic which allows for multiple levels of time adjustment for each type of mark. In the preferred embodiment, a dual level timing adjustment technique is provided. The first level provides coarse timing adjustments using a clock with a cycle less than T and parameters to control the power level and time duration of each mark. The second level provides fine timing adjustments using time delay techniques. By using the first and second levels of adjustments together, fine adjustments are provided without the need for expensive fast clocks. The method and system in accordance with the present invention thus allows for the writing of data at high speeds without compromising data reliability and without increasing the cost of manufacturing the optical drive.

Conclusion

An integrated controller to process both optical reads and optical writes of multiple optical media has been disclosed. The present invention provides a controller which integrates the functionality of the conventional controllers, illustrated in FIGS. 1A and 1B, into an integrated processor. With the controller in accordance with the present invention, a single drive may be provided which can read CD-based and DVD-based formats, read and write to Write Once Media, and read and write to Rewritable Media. The architecture of the controller is designed such that its manufacture is cost effective and a performance penalty for the host does not occur. In addition, the controller may also be used with conventional optical drives. Thus, with the present invention, the same controller may be used for all conventional optical drives as well as with an integrated drive.

Although the present invention has been described with the specific features illustrating in FIGS. 4 through 35, one of ordinary skill in the art will understand that the controller in accordance with the present invention may have any combination of these features, and/or other features, without departing from the spirit and scope of the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An optical drive controller, comprising:

a host interface;

a buffer manager coupled to the host interface;

an embedded memory coupled to the buffer manager;

an integrated encoding/decoding engine coupled to the buffer manager;

a data channel interface coupled to the integrated encoding/decoding engine; and an integrated servo/recording processor coupled to the integrated encoding/decoding engine and the data channel interface, wherein the integrated servo/recording processor comprises a set of write strategies, wherein the integrated servo/recording processor comprises:

a write control coupled to an encoding engine formatter and a C1 encoder of the integrated encoding/decoding engine, wherein the write control comprises the set of write strategies;

an absolute time in pregroove (ATIP) processor coupled to the encoding engine formatter;

a reduced instruction set computer (RISC) processor coupled to the write control; and a digital servo control coupled to the RISC processor.

2. The controller of claim 1, wherein the embedded memory comprises an embedded dynamic random access memory (DRAM).

3. The controller of claim 1, wherein the embedded memory is coupled to the buffer manager by a 128-bit bus.

4. The controller of claim 1, wherein the integrated encoding/decoding engine comprises:

a digital video disc (DVD) decoder coupled to the data channel interface and the buffer manager;

error correction codes (ECC) coupled to the DVD decoder and the buffer manager;

error detection codes (EDC) coupled to the ECC and the buffer manager; a CD eight-to-fourteen modulation (EFM) processor coupled to the data channel interface;

a compact disc (CD) decoder coupled to the CD EFM processor and the buffer manager;

an encoding engine formatter coupled to the integrated servo/recording processor and the buffer manager;

a C3 encoder coupled to the encoding engine formatter and the buffer manager;

a C2 encoder coupled to the C3 encoder and the encoding engine formatter; and a C1 encoder coupled to the C2 encoder, the encoding engine formatter, and the integrated servo/recording processor.

5. The controller of claim 1, wherein the data channel interface comprises:
a read channel interface;
an EFM extractor coupled to the read channel interface;
a sync processor coupled to the read channel interface; and
an EFM demodulator coupled to the EFM extractor and the sync processor.

6. The controller of claim 1, wherein the digital servo control comprises a Multiply Accumulate Unit (MAC).

7. The controller of claim 1, further comprising:
a first memory for storing program instructions coupled to the RISC processor and the buffer manager; and
a second memory for storing data coupled to the RISC processor and the buffer manager.

8. The controller of claim 1, further comprising: an analog to digital (A/D) converter coupled to the digital servo control; a plurality of digital to analog converters (DAC) coupled to the digital servo control; and
a sledge and spindle pulse width modulator (PWM) coupled to the digital servo control.

9. The controller of claim 1, further comprising:
a microcontroller interface.

10. The controller of claim 1, wherein the controller is capable of reading and writing multiple optical media, comprising CD-based formats, DVD-based formats, Write Once Media, and Rewritable Media.

11. A method for controlling an optical drive, comprising the steps of:
(a) determining if a read operation or a write operation is desired;
(b) reading a data from an optical media if the read operation is desired, comprising:
(b1) collecting the data from the optical media using a data channel interface, wherein the collective step (b1) comprises:
(b1i) receiving a data stream by a read channel interface, wherein the receiving step (b1i) comprises:
(b1iA) performing a header search for a target sector; and
(b1iB) receiving the data stream by the read channel interface beginning at the target sector, wherein the performing step (b1iA) comprises:
(b1iAa) opening a search window with a size greater than one sector;
(b1iAb) finding at least one valid header within the search window;
(b1iAc) locating the target sector based upon the at least one valid header;
(b1iAd) buffering the data stream beginning at the target sector; and
(b1iAe) perforining validation of a buffered target sector header;
(b1ii) extracting an EFM data from the data stream; and
(b1iii) demodulating the EFM data;
(b2) decoding the data using an integrated encoding/decoding engine; and
(b3) managing the data's flow using a buffer manager, wherein the buffer manager is coupled to an embedded memory; and
(c) writing the data to the optical media if the write operation is desired, comprising:
(c1) encoding the data using the integrated encoding/decoding engine;
(c2) writing the data to the optical media in accordance with a set of write strategies using an integrated servo/recording processor, wherein the integrated servo/recording processor comprises the set of write strategies; and
(c3) managing the data's flow using the buffer manager.

12. The method of claim 11, wherein the determining step (a) comprises:
(a1) receiving a command from a host;
(a2) determining if the command is for the read operation or the write operation; and
(a3) determining a plurality of parameters for the read or write operation.

13. The method of claim 12, wherein the plurality of parameters comprises:
a data format; and
a number of sectors for the data.

14. The method of claim 11, wherein the demodulating step (b1iii) comprises:
(b1iiiA) demodulating the EFM data using a conversion table;
(b1iiiB) marking errors which occur during the demodulation; and
(b1iiiC) utilizing estimated values for the marked errors.

15. The method of claim 11, wherein the demodulating step (b1iii) further comprises:
(b1iiiA) realigning a data frame of the EFM data, if the data frame is not properly synchronized.

16. The method of claim 15, wherein the realigning step (b1iiiA) comprises:
(b1iiiAa) determining if a sync pattern for the data frame is within a sync window;
(b1iiiAb) opening an extended sync window, if the sync pattern for the data frame is not within the sync window;
(b1iiiAc) determining if the sync pattern for the data frame is within the extended sync window; and
(b1iiiAd) realigning the sync window to the sync pattern in the extended sync window, if the sync pattern is within the extended sync window.

17. The method of claim 11, wherein the decoding step (b2) comprises:
(b2i) decoding a demodulated EFM data;
(b2ii) determining if an error exists in the decoded data; and
(b2iii) correcting the error if the error exists.

18. The method of claim 17, wherein the decoding step (b2i) comprises:
(b2iA) reading a sector of an audio data from the optical media, the sector comprising a sector data and a sector sub-code;
(b2iB) collecting the sector sub-code;
(b2iC) correcting any errors in the sector data in a fixed time period;
(b2iD) calculating a time offset between a time for the collecting of the fixed time period; and
(b2iE) matching the corrected sector data to the sector sub-code based on the calculated time offset.

19. The method of claim 17, wherein the decoding step (b2i) comprises:
(b2iA) decoding the demodulated EFM data from a Compact Disc-Read/Write (CD-R) or a Compact Disc-Rewritable (CD-RW), comprising:
(b2iAa) detecting one of a plurality of link sectors;
(b2iAb) generating an interrupt signal;

(b2iAc) determining a buffer method selection;
(b2iAd) buffering a plurality of data sectors only, if a link skip buffer method is selected; and
(b2iAe) buffering the plurality of data sectors and the plurality of link sectors, except for a link block, and allocating a sector in a buffer for the link block, if a link buffer method is selected.

20. The method of claim 17, wherein the correcting step (b2iii) comprises:
(b2iiiA) storing a plurality of data bytes and a plurality of erasure bytes; and
(b2iiiB) performing syndrome generation for the stored plurality of data bytes.

21. The method of claim 20, wherein the performing step (b2iiiB) comprises:
(b2iiiBa) reading a plurality of columns of a row of the stored plurality of data bytes;
(b2iiiBb) reading a plurality of partial syndromes from a memory, each of the plurality of partial syndromes corresponding to one of the plurality of columns;
(b2iiiBc) updating each of the plurality of partial syndromes with the data bytes of the corresponding column; and
(b2iiiBd) writing the plurality of updated partial syndromes into the memory.

22. A method for controlling an optical drive, comprising the steps of:
(a) determining if a read operation or a write operation is desired;
(b) reading a data from an optical media if the read operation is desired, comprising:
(b1) collecting the data from the optical media using a data channel interface;
(b2) decoding the data using an integrated encoding/decoding engine; and
(b3) managing the data's flow using a buffer manager, wherein the buffer manager is coupled to an embedded memory; and
(c) writing the data to the optical media if the write operation is desired, comprising:
(c1) encoding the data using the integrated encoding/decoding engine, wherein the encoding step (c1) comprises:
(c1i) performing C3 encoding of the data;
(c1ii) performing C2 encoding of the C3 encoded data; and
(c1iii) performing C1 encoding of the C3 and C2 encoded data;
(c2) writing the data to the optical media in accordance with a set of write strategies using an integrated servo/recording processor, wherein the integrated servo/recording processor comprises the set of write strategies; and
(c3) managing the data's flow using the buffer manager.

23. An optical drive controller, comprising: a host interface;
a buffer manager coupled to the host interface;
an embedded DRAM coupled to the buffer manager by a 128-bit bus;
an integrated encoding/decoding engine coupled to the buffer manager;
a data channel interface coupled to the integrated encoding/decoding engine;
an integrated servo/recording processor coupled to the integrated encoding/decoding engine and the data channel interface, wherein the integrated servo/recording processor comprises a set of write strategies, wherein the integrated servo/recording processor comprises:
a write control coupled to an encoding engine formatter and a C1 encoder of the integrated encoding/decoding engine, wherein the write control comprises the set of write strategies;
an ATIP processor coupled to the encoding engine formatter;
a RISC processor coupled to the write control; and
a digital servo control coupled to the RISC processor; and
a microcontroller interface.

24. The controller of claim 23, wherein the integrated encoding/decoding engine comprises:
a DVD decoder coupled to the data channel interface and the buffer manager;
ECC coupled to the DVD decoder and the buffer manager;
EDC coupled to the ECC and the buffer manager;
a CD EFM processor coupled to the data channel interface;
a CD decoder coupled to the CD EFM processor and the buffer manager;
an encoding engine formatter coupled to the integrated servo/recording processor and the buffer manager;
a C3 encoder coupled to the encoding engine formatter and the buffer manager;
a C2 encoder coupled to the C3 encoder and the encoding engine formatter; and
a C1 encoder coupled to the C2 encoder, the encoding engine formatter, and the integrated servo/recording processor.

25. The controller of claim 23, wherein the data channel interface comprises:
a read channel interface;
an EFM extractor coupled to the read channel interface;
a sync processor coupled to the read channel interface; and
an EFM demodulator coupled to the EFM extractor and the sync processor.

26. The controller of claim 23, wherein the digital servo control comprises a MAC.

27. The controller of claim 23, further comprising:
a first static random access memory (SRAM) for storing program instructions coupled to the RISC processor and the buffer manager; and
a second SRAM for storing data coupled to the RISC processor and the buffer manager.

28. The controller of claim 23, further comprising:
an A/D converter coupled to the digital servo control;
a plurality of DAC coupled to the digital servo control; and
a sledge and spindle PWM coupled to the digital servo control.

29. The controller of claim 23, wherein the controller is capable of reading and writing multiple optical media, comprising CD-based formats, DVD-based formats, Write Once Media, and Rewritable Media.

30. A method for controlling an optical drive, comprising the steps of:
(a) determining if a read operation or a write operation is desired;
(b) reading a data from an optical media if the read operation is desired, comprising:

(b1) receiving a data stream by a read channel interface of a data channel interface;
(b2) extracting an EFM data from the data stream;
(b3) demodulating the EFM data;
(b4) decoding the demodulated EFM data by an integrated encoding/decoding engine;
(b5) determining if an error exists in the decoded data;
(b6) correcting the error if the error exists; and
(b7) managing the data's flow using a buffer manager, wherein the buffer manager is coupled to an embedded memory; and (c) writing the data to the optical media if the write operation is desired, comprising:
(c1) encoding the data using the integrated encoding/decoding engine, wherein the encoding step (c1) comprises:
(c1i) performing C3 encoding of the data;
(c1ii) performing C2 encoding of the C3 encoded data; and
(c1iii) performing C1 encoding of the C3 and C2 encoded data;
(c2) writing the data to the optical media in accordance with a set of write strategies using an integrated servo/recording processor, wherein the integrated servo/recording processor comprises the set of write strategies; and
(c3) managing the data's flow using the buffer manager.

31. The method of claim 30, wherein the determining step (a) comprises:
(a1) receiving a command from a host;
(a2) determining if the command is for the read operation or the write operation; and
(a3) determining a plurality of parameters for the read or write operation.

32. The method of claim 31, wherein the plurality of parameters comprises:
a data format; and
a number of sectors for the data.

* * * * *